(12) United States Patent
Takatori

(10) Patent No.: US 8,730,401 B2
(45) Date of Patent: *May 20, 2014

(54) CIRCUIT MODULE FOR USE IN DIGITAL TELEVISION RECEIVER FOR RECEIVING DIGITAL TELEVISION BROADCASTING WAVE SIGNAL

(75) Inventor: Masahiro Takatori, Osaka (JP)

(73) Assignee: Panasonic Corporation, Osaka (JP)

(*) Notice: Subject to any disclaimer, the term of this patent is extended or adjusted under 35 U.S.C. 154(b) by 575 days.

This patent is subject to a terminal disclaimer.

(21) Appl. No.: 13/077,159

(22) Filed: Mar. 31, 2011

(65) Prior Publication Data

US 2011/0181788 A1    Jul. 28, 2011

Related U.S. Application Data

(62) Division of application No. 11/667,496, filed as application No. PCT/JP2005/020846 on Nov. 14, 2005, now Pat. No. 7,940,336.

(30) Foreign Application Priority Data

Nov. 12, 2004  (JP) .................................. 2004-328744

(51) Int. Cl.
    H04N 5/44    (2011.01)
(52) U.S. Cl.
    USPC ........................................................ 348/725
(58) Field of Classification Search
    USPC ......... 348/725–728, 731, 790–792, 794, 552, 348/553; 725/131, 136, 151, 23
    See application file for complete search history.

(56) References Cited

U.S. PATENT DOCUMENTS

| 5,854,507 | A | 12/1998 | Miremadi et al. |
| 5,974,095 | A | 10/1999 | Kitaura et al. |
| 6,067,066 | A | 5/2000 | Kubota et al. |
| 6,340,997 | B1 * | 1/2002 | Borseth .................. 348/731 |
| 6,347,399 | B1 | 2/2002 | Paskins |
| 6,400,419 | B1 * | 6/2002 | Yamamoto ............ 348/731 |
| 6,422,473 | B1 | 7/2002 | Ikefuji et al. |
| 6,516,465 | B1 | 2/2003 | Paskins |

(Continued)

FOREIGN PATENT DOCUMENTS

| EP | 0 766 418 | 4/1997 |
| EP | 0 827 203 | 3/1998 |

(Continued)

OTHER PUBLICATIONS

International Search Report issued Feb. 14, 2006 in International (PCT) Application No. PCT/JP2005/020846.

(Continued)

*Primary Examiner* — Paulos M Natnael
(74) *Attorney, Agent, or Firm* — Wenderoth, Lind & Ponack, L.L.P.

(57) ABSTRACT

A circuit module for a digital television receiver is formed by multi-layering a decoder LSI including a CPU and a decoder, a decoder layer substrate including a CA interface circuit, a demodulation function layer substrate including a demodulator, and an extension function layer substrate including a communication controller. The demodulation function layer substrate and the extension function layer substrate can be selectively multi-layered to the decoder layer substrate in response to a broadcasting system of a digital television signal or a type of a CA module.

7 Claims, 36 Drawing Sheets

(56) References Cited

U.S. PATENT DOCUMENTS

| | | | |
|---|---|---|---|
| 6,737,945 B2 | 5/2004 | Kawai | |
| 6,765,626 B1 * | 7/2004 | Tanaka | 348/725 |
| 7,307,606 B1 | 12/2007 | Yamazaki et al. | |
| 7,528,473 B2 | 5/2009 | Suwa et al. | |
| 7,590,992 B2 * | 9/2009 | Koplar et al. | 725/23 |
| RE40,936 E | 10/2009 | Oshima | |
| 7,627,879 B2 * | 12/2009 | Koplar et al. | 725/23 |
| 2002/0050876 A1 | 5/2002 | Kawai | |
| 2003/0012377 A1 | 1/2003 | Guenebaud | |
| 2005/0168961 A1 | 8/2005 | Ono et al. | |
| 2007/0056017 A1 | 3/2007 | Takatori | |
| 2007/0065093 A1 | 3/2007 | Takatori et al. | |

FOREIGN PATENT DOCUMENTS

| | | |
|---|---|---|
| EP | 1 193 975 | 4/2002 |
| EP | 1 202 564 | 5/2002 |
| GB | 2 311 451 | 9/1997 |
| JP | 3-127214 | 5/1991 |
| JP | 10-193848 | 7/1998 |
| JP | 11-288977 | 10/1999 |
| JP | 11-331797 | 11/1999 |
| JP | 11-331801 | 11/1999 |
| JP | 2000-4431 | 1/2000 |
| JP | 2000-36820 | 2/2000 |
| JP | 2001-128137 | 5/2001 |
| JP | 2001-169262 | 6/2001 |
| JP | 2001-313918 | 11/2001 |
| JP | 2002-57278 | 2/2002 |
| JP | 2002-64798 | 2/2002 |
| JP | 2002-111613 | 4/2002 |
| JP | 2002-135669 | 5/2002 |
| JP | 2002-271216 | 9/2002 |
| JP | 2002-300506 | 10/2002 |
| JP | 2003-31972 | 1/2003 |
| JP | 2003-518668 | 6/2003 |
| JP | 2005-251889 | 9/2005 |
| WO | 01/37546 | 5/2001 |
| WO | 01/42893 | 6/2001 |
| WO | 01/47267 | 6/2001 |
| WO | 02/084909 | 10/2002 |
| WO | 2005/029849 | 3/2005 |

OTHER PUBLICATIONS

International Search Report issued Jun. 1, 2004 in International (PCT) Application No. PCT/JP2004/001759.

European Standard EN50221, "*Common Interface Specification for Conditional Access and other Digital Video Broadcasting Decoder Applications*", English version, Ref. No. EN50221:1996E, Feb. 1997, pp. 1-86.

American National Standard ANSI/SCTE28 2001 (Formerly DVS 295), "*HOST-POD Interface Standard*", Engineering Committee Digital Video Subcommittee, Society of Cable Telecommunications Engineers, 2001, pp. i-vii and 1-171.

ISO7816-1 Standard, "*Asynchronous smartcard information*", Version 1.00, last revised on Jun. 12, 1995, pp. 1-34.

PC Card Standard, vol. 2, "*Electrical Specification*", PCMCIA/JEITA, 2001, pp. i-xxii and 1-274.

SCTE40 2001 (Formerly DVS 313) "*Digital Cable Network Interface Standard*", Society of Cable Communications Engineers, pp. i-ii and 1-26.

English translation of the International Preliminary Report on Patentability of May 15, 2007 issued in International Application No. PCT/JP2005/020846.

Supplementary European Search Report issued Oct. 28, 2008 in Application No. EP 05 80 6333.

Supplementary European Search Report issued Feb. 28, 2007 in Application No. EP 04 71 2159.

International Search Report issued Nov. 2, 2004 in International (PCT) Application No. PCT/JP2004/01374.

Result on Consultation dated Jul. 11, 2012 issued in corresponding European Application No. 05 806 333.0.

* cited by examiner

Fig. 9

| ENABLE CONTROL SIGNAL | ISDB-T IN JAPAN | DVB-T IN EUROPE | OPEN CABLE IN NORTH AMERICA — CABLE CARD INITIAL STATE | OPEN CABLE IN NORTH AMERICA — CABLE CARD OPERATIONAL STATE |
|---|---|---|---|---|
| D | OFF | ON  | OFF | OFF |
| E | OFF | OFF | OFF | ON  |
| F | OFF | ON  | ON  | OFF |
| H | OFF | OFF | OFF | ON  |
| J | OFF | ON  | ON  | ON  |
| K | OFF | ON  | ON  | ON  |

Fig. 10

| BUFFER POWER SUPPLY AND PC CARD POWER SUPPLY Vcc | ISDB-T IN JAPAN | DVB-T IN EUROPE | OPEN CABLE IN NORTH AMERICA | |
|---|---|---|---|---|
| | | | CABLE CARD | |
| | | | INITIAL STATE | OPERATIONAL STATE |
| | 3.3V | 5V | 3.3V | 3.3V |

Fig. 12

| ISDB-T IN JAPAN | DVB-T IN EUROPE | OPEN CABLE IN NORTH AMERICA | |
|---|---|---|---|
| | | INITIAL STATE OF CABLE CARD | OPERATIONAL STATE OF CABLE CARD |
| NOT IN USE | CPU DATA[3] | CPU DATA[3] | CPU DATA[3] |
| NOT IN USE | CPU DATA[4] | CPU DATA[4] | CPU DATA[4] |
| NOT IN USE | CPU DATA[5] | CPU DATA[5] | CPU DATA[5] |
| NOT IN USE | CPU DATA[6] | CPU DATA[6] | CPU DATA[6] |
| NOT IN USE | CPU DATA[7] | CPU DATA[7] | CPU DATA[7] |
| NOT IN USE | CE1# | CE1# | CE1# |
| NOT IN USE | CPU ADDRESS[10] | CPU ADDRESS[10] | NOT IN USE |
| NOT IN USE | OE# | OE# | OE# |
| NOT IN USE | CPU ADDRESS[11] | CPU ADDRESS[11] | NOT IN USE |
| NOT IN USE | CPU ADDRESS[9] | CPU ADDRESS[9] | DRX |
| NOT IN USE | CPU ADDRESS[8] | CPU ADDRESS[8] | CRX |
| NOT IN USE | CPU ADDRESS[13] | CPU ADDRESS[13] | NOT IN USE |
| NOT IN USE | CPU ADDRESS[14] | CPU ADDRESS[14] | TS OUT CLOCK |
| NOT IN USE | WE# | WE# | WE# |
| NOT IN USE | IREQ# | READY | IREQ# |
| NOT IN USE | TS IN VALID | CPU ADDRESS[16] | TS IN VALID |
| NOT IN USE | TS IN CLOCK | CPU ADDRESS[15] | TS IN CLOCK |
| NOT IN USE | CPU ADDRESS[12] | CPU ADDRESS[12] | NOT IN USE |
| NOT IN USE | CPU ADDRESS[7] | CPU ADDRESS[7] | QTX |
| NOT IN USE | CPU ADDRESS[6] | CPU ADDRESS[6] | ETX |
| NOT IN USE | CPU ADDRESS[5] | CPU ADDRESS[5] | ITX |
| NOT IN USE | CPU ADDRESS[4] | CPU ADDRESS[4] | CTX |
| NOT IN USE | CPU ADDRESS[3] | CPU ADDRESS[3] | NOT IN USE |
| NOT IN USE | CPU ADDRESS[2] | CPU ADDRESS[2] | NOT IN USE |

Fig. 13

| ISDB-T IN JAPAN | DVB-T IN EUROPE | OPEN CABLE IN NORTH AMERICA | |
|---|---|---|---|
| | | INITIAL STATE OF CABLE CARD | OPERATIONAL STATE OF CABLE CARD |
| NOT IN USE | CPU ADDRESS[1] | CPU ADDRESS[1] | CPU ADDRESS[1] |
| NOT IN USE | CPU ADDRESS[0] | CPU ADDRESS[0] | CPU ADDRESS[0] |
| NOT IN USE | CPU DATA[0] | CPU DATA[0] | CPU DATA[0] |
| NOT IN USE | CPU DATA[1] | CPU DATA[1] | CPU DATA[1] |
| NOT IN USE | CPU DATA[2] | CPU DATA[2] | CPU DATA[2] |
| NOT IN USE | IOIS16# | WP | IOIS16# |
| NOT IN USE | CD1# | CD1# | CD1# |
| NOT IN USE | TS OUT DATA[3] | CPU DATA[11] | TS OUT DATA[3] |
| NOT IN USE | TS OUT DATA[4] | CPU DATA[12] | TS OUT DATA[4] |
| NOT IN USE | TS OUT DATA[5] | CPU DATA[13] | TS OUT DATA[5] |
| NOT IN USE | TS OUT DATA[6] | CPU DATA[14] | TS OUT DATA[6] |
| NOT IN USE | TS OUT DATA[7] | CPU DATA[15] | TS OUT DATA[7] |
| NOT IN USE | CE2# | CE2# | CE2# |
| NOT IN USE | VS1# | VS1# | VS1# |
| NOT IN USE | IORD# | RESERVED | IORD# |
| NOT IN USE | IOWR# | RESERVED | IOWR# |
| NOT IN USE | TS IN SYNC | CPU ADDRESS[17] | TS IN SYNC |
| NOT IN USE | TS IN DATA[0] | CPU ADDRESS[18] | TS IN DATA[0] |
| NOT IN USE | TS IN DATA[1] | CPU ADDRESS[19] | TS IN DATA[1] |
| RESET2(OPTION) | TS IN DATA[2] | CPU ADDRESS[20] | TS IN DATA[2] |
| CLOCK2(OPTION) | TS IN DATA[3] | CPU ADDRESS[21] | TS IN DATA[3] |
| I/O2(OPTION) | TS IN DATA[4] | CPU ADDRESS[22] | TS IN DATA[4] |
| RESET1 | TS IN DATA[5] | CPU ADDRESS[23] | TS IN DATA[5] |
| CLOCK1 | TS IN DATA[6] | CPU ADDRESS[24] | TS IN DATA[6] |

Fig. 14

| ISDB-T IN JAPAN | DVB-T IN EUROPE | OPEN CABLE IN NORTH AMERICA ||
| --- | --- | --- | --- |
| | | INITIAL STATE OF CABLE CARD | OPERATIONAL STATE OF CABLE CARD |
| I/O1 | TS IN DATA[7] | CPU ADDRESS[25] | TS IN DATA[7] |
| NOT IN USE | TS OUT CLOCK | VS2# | VS2# |
| NOT IN USE | RESET | RESET | RESET |
| NOT IN USE | WAIT# | WAIT# | WAIT# |
| NOT IN USE | INPACK# | RESERVED | INPACK# |
| NOT IN USE | REG# | REG# | REG# |
| NOT IN USE | TS OUT VALID | BVD2 | TS OUT VALID |
| NOT IN USE | TS OUT SYNC | BVD1 | TS OUT SYNC |
| NOT IN USE | TS OUT DATA[0] | TS OUT DATA[8] | TS OUT DATA[0] |
| NOT IN USE | TS OUT DATA[1] | TS OUT DATA[9] | TS OUT DATA[1] |
| NOT IN USE | TS OUT DATA[2] | TS OUT DATA[10] | TS OUT DATA[2] |
| NOT IN USE | CD2# | CD2# | CD2# |

Fig. 15

| ISDB-T IN JAPAN | DVB-T IN EUROPE | OPEN CABLE IN NORTH AMERICA |
|---|---|---|
| Y[7] | Y[7] | Y[7] |
| Y[6] | Y[6] | Y[6] |
| Y[5] | Y[5] | Y[5] |
| Y[4] | Y[4] | Y[4] |
| Y[3] | Y[3] | Y[3] |
| Y[2] | Y[2] | Y[2] |
| Y[1] | Y[1] | Y[1] |
| Y[0] | Y[0] | Y[0] |
| UV[7] | UV[7] | UV[7] |
| UV[6] | UV[6] | UV[6] |
| UV[5] | UV[5] | UV[5] |
| UV[4] | UV[4] | UV[4] |
| UV[3] | UV[3] | UV[3] |
| UV[2] | UV[2] | UV[2] |
| UV[1] | UV[1] | UV[1] |
| UV[0] | UV[0] | UV[0] |
| H SYNC | H SYNC | H SYNC |
| V SYNC | V SYNC | V SYNC |
| CLOCK | CLOCK | CLOCK |

*Fig. 16*

| ISDB-T IN JAPAN | DVB-T IN EUROPE | OPEN CABLE IN NORTH AMERICA |
|---|---|---|
| TS1 DATA[7] | TS1 DATA[7] | TS1 DATA[7] |
| TS1 DATA[6] | TS1 DATA[6] | TS1 DATA[6] |
| TS1 DATA[5] | TS1 DATA[5] | TS1 DATA[5] |
| TS1 DATA[4] | TS1 DATA[4] | TS1 DATA[4] |
| TS1 DATA[3] | TS1 DATA[3] | TS1 DATA[3] |
| TS1 DATA[2] | TS1 DATA[2] | TS1 DATA[2] |
| TS1 DATA[1] | TS1 DATA[1] | TS1 DATA[1] |
| TS1 DATA[0] | TS1 DATA[0] | TS1 DATA[0] |
| TS1 VALID | TS1 VALID | TS1 VALID |
| TS1 SYNC | TS1 SYNC | TS1 SYNC |
| TS1 CLK | TS1 CLK | TS1 CLK |
| TS2 DATA[7] (OPTION) | TS2 DATA[7] (OPTION) | TS2 DATA[7] (OPTION) |
| TS2 DATA[6] (OPTION) | TS2 DATA[6] (OPTION) | TS2 DATA[6] (OPTION) |
| TS2 DATA[5] (OPTION) | TS2 DATA[5] (OPTION) | TS2 DATA[5] (OPTION) |
| TS2 DATA[4] (OPTION) | TS2 DATA[4] (OPTION) | TS2 DATA[4] (OPTION) |
| TS2 DATA[3] (OPTION) | TS2 DATA[3] (OPTION) | TS2 DATA[3] (OPTION) |
| TS2 DATA[2] (OPTION) | TS2 DATA[2] (OPTION) | TS2 DATA[2] (OPTION) |
| TS2 DATA[1] (OPTION) | TS2 DATA[1] (OPTION) | TS2 DATA[1] (OPTION) |
| TS2 DATA[0] (OPTION) | TS2 DATA[0] (OPTION) | TS2 DATA[0] (OPTION) |
| TS2 VALID (OPTION) | TS2 VALID (OPTION) | TS2 VALID (OPTION) |
| TS2 SYNC (OPTION) | TS2 SYNC (OPTION) | TS2 SYNC (OPTION) |
| TS2 CLK (OPTION) | TS2 CLK (OPTION) | TS2 CLK (OPTION) |

CIRCUIT MODULE FOR USE IN DIGITAL TELEVISION RECEIVER FOR RECEIVING DIGITAL TELEVISION BROADCASTING WAVE SIGNAL

This is a Rule 1.53(b) Divisional Application of Ser. No. 11/667,496, filed May 10, 2007 now U.S. Pat. No. 7,940,336 which is the National Stage of International Application No. PCT/JP2005/020846, filed Nov. 14, 2005.

TECHNICAL FIELD

The present invention relates to a circuit module for use in, for example, a television set, a personal computer, a mobile terminal apparatus, a recorder apparatus for recording a video signal and an audio signal onto a recording medium such as an optical disc, and the other audio-visual apparatus and, more particularly, relates to a circuit module for a digital television receiver (referred to as a DTV hereinafter) or the like, which receives digital television broadcasting (referred to as a circuit module for DTV receiver hereinafter), and a DTV receiver provided with the same circuit module.

BACKGROUND ART

In recent years, digitization of television broadcasting has been started from Japan, North America, and Europe, and digital television broadcast receivers in conformity with broadcast standards for each nation and region have been sold. For example, terrestrial digital television broadcastings are different in service contents, technological levels at the time of the introduction, and the like according to each nation and region. Therefore, the following three standards are recommended. A digital video broadcasting-terrestrial (referred to as a DVB-T hereinafter) system is adopted in Europe, an advanced television systems committee (referred to as an ATSC hereinafter) system is adopted in America, and an integrated services digital broadcasting-terrestrial (referred to as an ISDB-T hereinafter) system is adopted in Japan. In China, the standardization process based on the DVB-T system adopted in Europe has been progressing.

All of the video and audio compression systems in these standards adopt the system in conformity with the MPEG-2 standard. The transmission system is also in conformity with the MPEG-2_TS signal (transport stream) standard. Therefore, the video and audio decoder in the DTV can make interfaces and circuits to a common architecture throughout all nations and regions. More concretely, compression systems such as the MPEG-2 adopted in the present digital television broadcasting and the H.264 of the ITU that is expected to be adopted in the future basically use an algorithm which detects a moving vector, estimates and encodes a movement. The decoder for decoding a video signal and an audio signal compressed by these systems can be realized by a single hardware, a CPU, and software operative on the CPU. The difference in detailed specifications in each system can be dealt with by changing the software. Accordingly, in a subsequent circuit after a received signal is demodulated into the MPEG-2_TS signal by a demodulator, that is, in a hardware circuit of the decoder, the manufacturers of the circuit module can commercialize a universal decoder throughout the world and increase the effect of mass production.

On the other hand, a circuit, where a television broadcasting wave signal is received via an antenna or the like and then demodulated into the MPEG-2_TS signal, is called a front end circuit. A tuner and a demodulator in the front end circuit are much depend on radio wave policies unique to nation and region, and then, a set of systems different from each other are adopted in respective nations and regions. The front end circuit is composed of the tuner and the demodulator. The tuner receives a broadcast signal, tunes, performs frequency conversion into an intermediate frequency signal, and then, outputs a resulting signal. The demodulator inputs the above intermediate frequency signal, and demodulates the same signal according to a predetermined demodulation system. A demodulation system in the demodulator adopts a quadrature amplitude modulation (referred to as a QAM) system for the DVB-T system and the ISDB-T system, and adopts a vestigial side band (referred to as a VSB) system for the ATSC system.

A conditional access (referred to as a CA hereinafter) unit located between the front end circuit and the decoder integrally operates with an external conditional access circuit module (referred to as a CA module hereinafter). Since the CA unit is related to business, the systems are often different from each other for each business region and market together with an encryption system and interface specifications with the CA module. A CI (referred to as a common interface hereinafter) is adopted in the DVB-T system, a cable card interface is adopted in cable television broadcasting in conformity with the open cable standard in America, and an IC card interface is adopted in the ISDB-T system. Any interface connects the CA module whose terminal specifications are different from each other in the physical specifications and electrical specifications. Therefore, conventionally, the manufacturers of the digital television receiver have commercialized digital television receivers having different configurations in each market by combining a universal decoder throughout the world, a front end circuit module of each nation and region, and a CA unit of each market, and have guaranteed operation.

In addition, the receivers are considered to become more multifaceted in response to spread of the digital television broadcasting. Those having a digital television receiving function are considered to be commercialized in the future for small apparatus such as a mobile terminal apparatus and a recorder apparatus, in a manner similar to that of analog televisions. In addition, also in the other audio-visual apparatus for outputting video and audio, those for treating the MPEG-2_TS signal have been increased. For example, a video reproduction apparatus such as a camera and a DVD player, and a music reproduction apparatus such as a headphone stereo are included. Such apparatus is also expected to become more multifaceted in a manner similar to that of the digital television receiver, and is considered to be reduced in size.

Further, the CI is disclosed in a non-patent document 1, the cable card (formerly called POD) is disclosed in a non-patent document 2, and the IC card interface is disclosed in a non-patent document 3.

On the other hand, efforts for complying with a plurality of markets have been studied by connecting the CA unit (for example, See a patent document 1). The patent document 1 includes a plurality of CA module interfaces capable of connecting each of the CA modules. The plurality of the CA module interfaces are connected in series.

In addition, on the other hand, there have been efforts in which a first circuit chip having an antenna and a second circuit chip having a processing function are laminated or multi-layered to manufacture a front end circuit module with a small area (for example, See a patent document 3).

In this case, there are shown prior art documents related to the present invention as follows:
Patent document 1: Japanese patent laid-open publication No. JP-2000-36820-A;

Patent document 2: Pamphlet of International application publication No. WO01/047267A1;
Patent document 3: Japanese patent laid-open publication No. JP-1998-193848-A;
Patent document 4: Japanese patent laid-open publication No. JP-11-288977-A;
Patent document 5: Pamphlet of International application publication No. WO01/037546A2;
Patent document 6: Japanese patent laid-open publication No. JP-2003-518668-A;
Patent document 7: Pamphlet of International application publication No. WO2005/029849A1;
Non-patent document 1: EUROPEAN STANDARD EN50221, Common Interface Specification for Conditional Access and other Digital Video Broadcasting Decoder Applications, English Version, Ref. No. EN50221:1996E, February 1997;
Non-patent document 2: AMERICAN STANDARD ANSI/SCTE28 2001 (Formerly DVS 295), HOST-POD Interface Standard, Engineering Committee Digital Video Subcommittee, Society of Cable Telecommunications Engineers, 2001;
Non-patent document 3: ISO7816-1 Standard, asynchronous smartcard information, Version 1.00, last revised on Jun. 12, 1995;
Non-patent document 4: PC Card Standard, Volume 2, Electrical Specification, PCMCIA/JEITA, 2001; and
Non-patent document 5: SCTE40 2001 (Formerly DVS 313), Digital Cable Network Interface Standard, Engineering Committee Digital Video Subcommittee, Society of Cable Telecommunications Engineers, 2001.

DISCLOSURE OF THE INVENTION

Problems to be Solved by the Invention

However, in conditions as described above, when a plurality of functions are added to an apparatus such as the digital television receiver to extend the functions, a printed circuit board (referred to as a board or a substrate hereinafter) mounted with an LSI for extending function is further added in the apparatus, and then, there is such a problem as increase in an area occupied by a function extension substrate and a substrate total area. In addition, there has been no concept which selects an adding function by selecting a laminating substrate and replacing the same substrate.

Therefore, in an example of the digital television receiver, it is difficult to miniaturize the same into a semiconductor chip size or an LSI package size by integrating the decoder, the tuner, the demodulator, and the function extending LSI. Generally speaking, the manufacturers manufacture the digital television receiver by mounting the decoder, the tuner, and the demodulator on a different substrate. Since the reduction in each substrate area in the digital television receiver reaches the limit, it is difficult to further reduction in size of the whole digital television receiver.

In addition, the decoder and the demodulator are mounted on a substrate different from that mounted with the function extending LSI, and wiring is made between the substrates by wire and cable. Then the wiring among the decoder and the demodulator, and the function extending LSI become long, and accordingly, the electrical characteristics of the wiring deteriorate. Consequently, the transmission delay time of the electrical signal cannot be shortened; and therefore, it is difficult to achieve an improvement in performance by transmitting a more high-speed signal. In addition, the wiring among the decoder, the demodulator, and the function extending LSI, which transmit high-speed electrical signals, become long, and then, there arise such problems as the false operation due to waveform distortion generated by an electrical signal reflection or the like, the interference on the tuner due to radiation noise, and the like.

Further, the demodulators are different from each other for each nation and region, and the physical specifications and the electrical specifications of the CA modules are different from each other for each market. Therefore, the manufacturers of the digital television receivers have commercialized the digital television receivers having different configurations for respective nations, regions, and markets by combining the universal decoder all over the world, the demodulator for each nation or region, and the CA module interface for each market. Then, the design of the boards mounted with the decoder, the demodulator, and the CA module interface, and the operation guarantee take trouble and cost at every commercialization, and then, there has been such a problem that any cost reduction of products cannot be achieved. More particularly, there has been such a problem that the operation including the CA module often needs authentication by a certification authority at each market, the authentication at each commercialization takes a trouble, and then, production cost increases. Further, the manufacturers of the digital television receivers have commercialized the digital television receivers from low-end to high-end in each nation and region by combining the LSI for extending function such as network connection in addition to the universal decoder all over the world, the demodulator for each nation and region, and the CA module interface for each market. Therefore, the design of the boards mounted with the decoder, the demodulator, the CA module interface, and the LSI for extending the function, and the operation guarantee take trouble and cost at every commercialization. Then there has been such a problem that any cost reduction of products cannot be achieved.

In addition, in the configuration disclosed in the patent document 1, each of the CA module interfaces is required to be provided. Therefore, in the case of considering realization of a common circuit module in each market including the CA module, there arises a cost demerit due to increase in the cost of an interface circuit and a socket. Accordingly, there arises such a problem that the cost reduction becomes small which should have been made due to mass production effect by using a common architecture.

In addition, the number of connecting terminals with the CA module increases in response to the number of interfaces to be provided. As for the number of terminals, for example, a CI card and a cable card each have 68 connecting terminals, and at least 136 connecting terminals are required for only two types of the CA module interfaces. Therefore, in the case of considering the realization of the common circuit module in each market including the CA module, there arises a cost demerit in reducing in size due to increase in the number of connecting terminals with the interface circuit. Accordingly, there arises such a problem that the number of terminals becomes a bottleneck upon making into a circuit module and reducing in size.

More particularly, when a realized configuration of the circuit module is micro-miniaturized as being made into a semiconductor chip and formed into a printed circuit board or substrate with a multi-layer structure, the proportion of an area occupied by the connecting terminals in an area of the semiconductor chips and the printed circuit board extremely increases. This is because there is a limit because reduction in size of the connecting terminals is influenced by a pitch and a connecting method of wiring connected to the terminals. Therefore, there arises such a problem that any reduction in size cannot be achieved because there is such a case that the area of the semiconductor chips and the printed circuit board are determined by the area of the connecting terminals when the number of connecting terminals increases.

In addition, in the configuration disclosed in the patent document 3, each single piece of the first circuit chip and the second circuit chip is not independent as a function circuit module. Then the first circuit chip and the second circuit chip do not exhibit any function at all unless connected. Therefore, even if a different third circuit chip is provided, a front end having a different function cannot be configured by replacing the third circuit chip with the first circuit chip or the second circuit chip. In addition, the operation cannot be guaranteed by operating the first circuit chip and the second circuit chip as a single piece. Further, the operation cannot be confirmed unless the first circuit chip and the second circuit chip are connected. Therefore, the defects of the single piece of the circuit chip cannot be also confirmed unless connected, and it is difficult to achieve improvement in yield. Further, there is no means to identify multi-layered circuit chips, and a control unit cannot recognize a type of the circuit chip. Then, the state of the circuit chip cannot be appropriately changed in response to the types of the multi-layered circuit chip.

An object of the present invention is to solve the foregoing problems, and to provide a circuit module capable of directly connecting a television broadcasting wave signal for each nation and region and a CA module for each market, capable of connecting to each display device such as a liquid crystal display and a plasma display, and capable of simply and inexpensively manufacturing in a small size to a semiconductor chip size or an LSI package size as compared with the prior arts; and to provide an inexpensive, small digital television receiver with higher performance.

Means for Solving Problem

According to a first aspect of the present invention, there is provided a circuit module for decoding a content data signal including a content signal into the content signal, and outputting the content signal. The circuit module includes at least one first substrate, a second substrate, and a third substrate. At least one first substrate includes a first circuit for outputting the content data signal, and the second substrate includes a second circuit for decoding the content data signal outputted from the first circuit, into the content signal, and outputting the content signal. The third substrate includes a third circuit for generating a clock signal which is used in the second circuit. The circuit module has a multi-layered structure multi-layered in a thickness direction of the respective substrates so that the respective substrates substantially become parallel to each other. The circuit module further includes first and second connecting means. The first connecting means is formed in common between respective substrates from the first substrate to the second substrate, and the first connecting means is electrically connecting between respective circuits of the first substrate and the second substrate, and transmits the content data signal. The second connecting means is formed in common between respective substrates from the third substrate to the second substrate, and the second connecting means electrically connecting between respective circuits of the third substrate and the second substrate, and transmits the clock signal.

In the above-mentioned circuit module, the first connecting means is formed on an outer side than a formation position of the each circuit in the each substrate.

In addition, in the above-mentioned circuit module, the second connecting means is formed on an inner side than a formation position of the first connecting means.

Further, in the above-mentioned circuit module, the first connecting means includes a plurality of connecting terminals. At least one substrate of the respective substrates further includes third connecting means formed on an inner side than a formation position of a connecting terminal which is formed on an outermost side of the respective connecting terminals of the first connecting means, the third connecting means transmitting and receiving a signal to and from an external substrate.

In this case, the plurality of connecting terminals of the first connecting means are formed so that each pair of mutually neighboring connecting terminals thereof is separated by a predetermined first interval. The third connecting means includes a plurality of connecting terminals, and the plurality of connecting terminals of the third connecting means are formed so that each pair of mutually neighboring connecting terminals thereof is separated by a predetermined second interval which is larger than the first interval.

Furthermore, in the above-mentioned circuit module, the respective connecting terminals of the first and second connecting means includes a first connecting terminal for transmitting an analog signal, and a second connecting terminal for transmitting a digital signal. The first and second connecting terminals are formed so as to be separated with each other by a predetermined third interval.

In this case, the first and second connecting terminals are formed so as to be separated with a grounding conductor terminal sandwiched therebetween.

In the above-mentioned circuit module, the second substrate further includes a control circuit for controlling decode processing of the second circuit. The circuit module further includes fourth connecting means formed in common between respective substrates from the first substrate to the second substrate, the fourth connecting means transmitting a type-identifying data signal representing a system of the content data signal outputted from the first circuit. The control circuit detects a system of the digital data signal on the basis of the type-identifying data signal inputted via the fourth connecting means from the first circuit, and controls decode processing of the second circuit on the basis of the detected system.

According to a second aspect of the present invention, there is provided a circuit module for use in a DTV. The circuit module is configured such that first and second substrates are integrally configured by multi-layering said first and second substrates in a thickness direction so as to be substantially parallel to each other. The first substrate includes a demodulation circuit for demodulating an intermediate frequency signal into a demodulated signal, and outputting the demodulated signal. The intermediate frequency signal is obtained by converting one type of digital television broadcasting wave signal selected among digital television broadcasting wave signals of a plurality type of broadcasting systems different from each other. The second substrate includes a decoding circuit, a control circuit, and sixth connecting means. The decoding circuit decodes the demodulated signal into a television signal including a video signal and an audio signal, and outputting the television signal. The control circuit controls an operation of the circuit module for use in the DTV receiver. The sixth connecting means is connected to an external terminal, and the sixth connecting means transmits and receiving an external signal. The circuit module further includes first and second connecting means. The first connecting means is formed in common between respective substrates from the first substrate to the second substrate, and the first connecting means is electrically connecting between respective circuits of the first substrate and the second substrate, and transmits the intermediate frequency signal. The second connecting means is formed in common between respective substrates from the first substrate to the second substrate, and the second connecting means is electrically connecting between respective circuits of the first substrate and the second substrate, and transmit the demodulated signal.

In the above-mentioned circuit module for use in the DTV, the circuit module further includes a third substrate including a generating circuit for generating a clock signal for use in decoding processing of the decoding circuit. The circuit module is configured such that the first, second and third substrates are integrally configured by multi-layering the first, second and third substrates in the thickness direction so as to be substantially parallel to each other. The circuit module includes third connecting means formed in common between respective substrates from the third substrate to the second substrate, the third connecting means electrically connecting between respective circuits of the third substrate and the second substrate, and transmitting the clock signal.

In the above-mentioned circuit module for use in the DTV, the third substrate further includes a tuner circuit for converting one type of digital television broadcasting wave signal into an intermediate frequency signal and outputting the intermediate frequency signal, and the one type of digital television broadcasting wave signal is selected among a plurality type of broadcasting systems different from each other. The first connecting means is formed in common between respective substrates from the first substrate to the third substrate, and the first connecting means is electrically connecting between respective circuits of the first substrate and the third substrate, and transmits the intermediate frequency signal. The circuit module further includes fourth connecting means formed in common between respective substrates from the second substrate to the third substrate, and the fourth connecting means is electrically connecting between respective circuits of the second substrate and the third substrate, and transmits the digital television broadcasting wave signal.

According to a third aspect of the present invention, there is provided a circuit module for use in a DTV. The circuit module is configured such that first and second substrates are integrally configured by multi-layering the first and second substrates in a thickness direction so as to be substantially parallel to each other. The first substrate includes a tuner circuit and demodulation circuit. The tuner circuit converts one type of digital television broadcasting wave signal into an intermediate frequency signal, and outputs the intermediate frequency signal, and the one type of digital television broadcasting wave signal is selected among a plurality type of broadcasting systems different from each other. The demodulation circuit demodulates the intermediate frequency signal to a demodulated signal, and for outputting the demodulated signal. The second substrate includes a decoding substrate, a control circuit, and a sixth connecting means. The decoding circuit decodes the demodulated signal to a television signal including a video signal and an audio signal, and outputs the television signal. The control circuit controls an operation of the circuit module. The sixth connecting means is connected to an external terminal, and the sixth connecting means transmits and receives an external signal. The circuit module further includes second and fourth connecting means. The second connecting means is formed in common between respective substrates from the first substrate to the second substrate, and the second connecting means is electrically connecting between respective circuits of the first substrate and the second substrate, and transmits the demodulated signal. The fourth connecting means is formed in common between respective substrates from the first substrate to the second substrate, and the fourth connecting means is electrically connecting between respective circuits of the first substrate and the second substrate, and transmits the digital television broadcasting wave signal.

In the above-mentioned circuit module for use in the DTV, the first substrate includes a generating circuit for generating a clock signal for use in the decoding circuit. The circuit module further includes third connecting means formed in common between respective substrates from the first substrate to the second substrate, and the third connecting means electrically connects between respective circuits of the first substrate and the second substrate, and transmits the clock signal.

In the above-mentioned circuit module for use in the DTV, each of the second and fourth connecting means is formed on an outer side than a formation position of the each circuit in the each substrate.

In addition, in the above-mentioned circuit module for use in the DTV, the third connecting means is formed on an inner side than a formation position of the second connecting means and a formation position of the fourth connecting means.

Further, in the above-mentioned circuit module for use in the DTV, the second connecting means includes a plurality of connecting terminals, and the fourth connecting means includes a plurality of connecting terminals. The sixth connecting means is formed on the second substrate on an inner side than a formation position of a connecting terminal which is formed on an outermost side of respective connecting terminals of the second connecting means and the fourth connecting means.

In the above-mentioned circuit module for use in the DTV, plurality of connecting terminals of the sixth connecting means are formed so that each pair of mutually neighboring connecting terminals thereof is separated by a predetermined interval. The respective connecting terminals of the second and fourth connecting means are formed so that each pair of mutually neighboring connecting terminals thereof is formed so as to be separated by an interval smaller than an interval between the respective connecting terminals of the sixth connecting means.

In addition, in the above-mentioned circuit module for use in the DTV, each connecting terminal of the second connecting means and each connecting terminal of the fourth connecting means are formed so as to be separated with each other.

Further, in the above-mentioned circuit module for use in the DTV, each connecting terminal of the second connecting means and each connecting terminal of the fourth connecting means are formed so as to be separated with each other with a grounding conductor terminal sandwiched therebetween.

In the above-mentioned circuit module for use in the DTV, the circuit module further includes seventh connecting means for transmitting a type-identifying data signal, the seventh connecting means being formed in common between respective substrates from the first substrate to the second substrate. The control circuit detects a broadcasting system of the inputted digital television broadcasting wave signal on the basis of the type-identifying data signal inputted via the seventh connecting means, and controls an operation of the decoding circuit on the basis of the detected broadcasting system.

In addition, the broadcasting system includes at least two of a DVB-T system, an ATSC system, and an ISDB-T system.

In addition, in the above-mentioned circuit module for use in the DTV, the circuit module further includes at least one extension function substrate, and eighth connecting means. The at least one extension function substrate is multi-layered on the respective substrates, and the one extension function substrate is selected among a plurality type of extension function substrates having functions different from each other for extending function of the circuit module. The eighth connecting means is formed in common between respective substrates from the second substrate to the extension function substrate, and the eighth connecting means transmits data signals inputted and outputted between a function circuit of the extension function substrate and a circuit of the second substrate.

In this case, the extension function substrate includes at least one of a network extension function substrate for connecting the circuit module to a network and a HDMI (High Definition Multimedia Interface) extension function substrate for extending an HDMI interface.

In the above-mentioned circuit module for use in the DTV, the network extension function substrate includes a communication controller and a network interface, and the HDMI extension function substrate includes an HDMI chip.

In addition, in the above-mentioned circuit module for use in the DTV, the extension function layer substrate includes an external interface for connecting the circuit module to a predetermined external circuit, and the data signal inputted and outputted by the function circuit of the extension function substrate includes a data signal between the external interface and the decoding circuit.

Further, in the above-mentioned circuit module for use in the DTV, the extension function layer substrate includes a cable modem for connecting the circuit module to a head-end of a CATV, and the data signal inputted and outputted by the function circuit of the extension function substrate includes a data signal between the cable modem and the head-end of the CATV.

In the above-mentioned circuit module for use in the DTV, the second substrate further includes an interface circuit connected to one conditional access module via the sixth connecting means, and the one conditional access module is selected among a plurality type of conditional access modules provided in an external substrate and having electrical specifications different from each other. The interface circuit is connected to the demodulation circuit, the decoding circuit, and the control circuit, the interface circuit executing input and output processing of a plurality of signals communicated among the demodulation circuit, the conditional access module, the decoding circuit, and the control circuit. The sixth connecting means includes a connecting terminal formed in common among substrates from the external substrate to the first substrate and the second substrate, and the connecting terminal transmits a stream signal and a data signal inputted and outputted by the conditional access module. The control circuit controls the interface circuit by switching a type of the signal communicated via the sixth connecting means so as to comply with electrical specifications of the connected conditional access module in response to at least one of the broadcasting system of the inputted digital television broadcasting wave signal and the type of the connected conditional access module.

In this case, the conditional access module of a first type is a conditional access module of a common interface. In addition, the conditional access module of a second type is a conditional access module of a cable card, or a conditional access module of a common interface. Further, the circuit module for use in the DTV receiver further includes a different interface circuit for connecting the conditional access module of a third type to the interface means and the control means. In this case, the conditional access module of the third type is a conditional access module of an IC card.

According to a fourth aspect of the present invention, there is provided a DTV receiver including the above-mentioned circuit module for use in the DTV receiver, and an external substrate. The external substrate includes a tuner circuit connected to the circuit module via sixth connecting means. The tuner circuit receives a digital television broadcasting wave signal and converts the digital television broadcasting wave signal into an intermediate frequency signal, and outputs a converted intermediate frequency signal to the circuit module via the sixth connecting means.

According to a fifth aspect of the present invention, there is provided a DTV receiver including the circuit module for use in the DTV, and an external substrate. The external substrate is connected to the circuit module via sixth connecting means, and the external substrate outputs the digital television broadcasting wave signal to the circuit module via a connector.

According to a sixth aspect of the present invention, there is provided a DTV receiver including the circuit module for use in the DTV receiver, and an external substrate. The external substrate is connected to the circuit module via sixth connecting means, and the external substrate includes the conditional access module.

Effects of the Invention

Therefore, according to the circuit module according to the present invention, the function extension can be realized by laminating or multi-layering the extension function layer. In addition, the extending function can be selected by selecting and replacing the laminating extension function layer. Therefore, micro-miniaturization to a semiconductor chip size or an LSI package size, and the circuit module with higher extendability can be realized.

In addition, according to the circuit module according to the present invention, the physical arrangements and transmitting electrical signal arrangements and types of the interlayer terminal group such as bumps and vias are relatively in common and preliminarily defined in respective types of function layers. Therefore, the bumps and the vias, which have been served as only interlayer connection in the prior art, can be dealt as connector terminals of interface for replacing the layers. Further, since the interlayer is capable of directly connecting with a connecting terminal group such as the bumps and the vias, a simple structure which does not require any intermediate member having wiring such as an interposer in the interlayer can be realized.

In addition, according to the circuit module according to the present invention, all the interlayer wiring can be set to be short within a range of the number of multi-layered sheets of the layer thickness by laminating the same layers. Conventionally, in the case of being configured without any lamination or multi-layering using the substrate and connecting the substrates equal to or more than three, there has been such a case that wiring hooked up to the substrate becomes longer than the size of the hooked up substrate. Usually, the thickness of the substrate is approximately several hundreds μm, the thickness of the semiconductor chip is approximately several tens μm to several hundreds μm, and the substrate size is approximately several tens cm square. Therefore, the wiring among the decoder, the demodulator, and the function extending LSI can be remarkably shortened by laminating the respective substrates. As a result, since the inductor component and the stray capacitance component in the wiring can be suppressed, the electrical characteristics are improved, the transmission delay time of the electrical signal is shortened, and the performance due to the transmission of a higher speed signal can be improved. Further, the wiring among the decoder, the demodulator, and the function extending LSI is shortened. The false operation due to waveform distortion generated by the electrical signal reflection or the like, and the interference on the tuner due to radiation noise, and the like are also suppressed. This leads to a higher performance.

In addition, according to a circuit module according to the present invention, it is possible to miniaturize the same circuit module into an LSI package size while mounting the semiconductor or the circuit for analog signal processing together with the semiconductor or the circuit for digital signal processing. Further, when the physical arrangements and types of the interlayer terminal group such as bumps and vias are relatively in common and preliminarily defined in respective types of function layers. The physical arrangements of an interlayer terminal group for an analog signal and a digital signal can be separated into different positions. Further, the interlayer terminal for the grounding conductor is arranged between the interlayer terminal for the analog signal and the interlayer terminal for the digital signal. Accordingly, the electrical separation can be achieved, and then, the electrical interference of the digital signal against the analog signal can be suppressed, and this leads to a higher performance.

In addition, according to the circuit module for use in the DTV receiver according to the present invention, the decoder layer common to each nation and region, the demodulation function layer to each region, the extension function layer provided with the function extension LSI, and the tuner function layer are multi-layered. Accordingly, it is possible to miniaturize the same into a semiconductor chip size by including the demodulator, the tuner, and the function extension LSI that have been conventionally mounted on the mother-board. As a result, the circuit module and the mother-board can be reduced in size, and this leads to miniaturization of the digital television receiver using the same.

Further, according to the circuit module for a DTV receiver according to the present invention, the decoder layer common to each nation and region, and a plurality of types of demodulation function layers and a plurality of types of extension function layers to each region are prepared. At the same time, the physical arrangements and transmitting electrical signal types of the interlayer terminal group such as bumps and vias are relatively in common defined in respective types of demodulation function layers or respective types of extension function layers. Therefore, the bumps and the vias formerly served as only for connecting a layer can be dealt as a connector terminal of an interface for replacing the layer. In addition, reduction in size can be remarkably achieved as compared with the case where a usual substrate connector is used.

In addition, according to the circuit module for the DTV receiver according to the present invention, the layer to be laminated or multi-layered is selected in response to a television broadcasting wave signal of each nation and region, and then, the direct connection to the television broadcasting wave signal and the CA module of each market can be achieved. Therefore, the circuit module according to the present invention can guarantee the operation by connecting to the television broadcasting wave signal of each nation and region and the CA module of each market.

Further, the mother-board connectably complied with the circuit module for the DTV receiver according to the present invention is prepared for each nation, region, and market, and then, the receivers to each nation, region, and market can be commercialized by connecting the circuit module to the motherboard. Therefore, the circuit module according to the present invention is used, and the mother-board mounted with the connector for the television broadcasting wave signal and the socket for the CA module of each market is designed and connected to the circuit module for the DTV receiver according to the present invention, and then, the manufacturers of the digital television receiver can easily commercialize the digital television receivers to each nation, region, and market.

In addition, if authentication for the operation including the CA module using the circuit module for the DTV receiver according to the present invention is completed by a certification authority of each market, trouble and cost caused by the authentication for each product can be saved. As a result, it makes possible to reduce the cost for commercialization by the manufacturers, and cost reduction of the digital television receiver can be achieved.

In addition, according to the circuit module for the DTV receiver according to the present invention, the interface circuit and the socket for connecting to a plurality of types of CA modules that are different in the electrical specifications of each market can move to the common architecture. Therefore, the circuit module corresponding to the whole world including the CA interface is realized to be able to be commercialized without any increase in the manufacturing cost. Therefore, the cost reduction by mass production effect can be achieved, and it is possible to contribute to spread of the digital television receiver.

Further, the circuit module including the CA interface can be realized without any increase in the number of connecting terminals with the CA module. The increase in the number of terminals due to connecting to a tuner of each nation and region and a CA module of each market can be suppressed. Therefore, in particular, according to the present invention, it is possible to solve such a problem that any reduction in size cannot be achieved because the chip area is determined by the area of the connecting terminals when the substrate mounted with the decoder common to each nation and region, and the substrate mounted with the demodulator to each region are multi-layered and microminiaturized into a semiconductor chip size or an LSI package size.

Furthermore, according to the circuit module for the DTV receiver according to the present invention, the network-related function can be provided by further laminating the network extension function layer. In addition, the interface can be extended by further laminating the HDMI (High Definition Multimedia Interface) extension function layer. Further, the CATV modem function can be provided by laminating the CATV modem extension function layer. In this case, both the network extension function layer and the network extension function layer can be multi-layered, and the area of the circuit module is not changed even in that case.

Therefore, the circuit module for the DTV receiver according to the present invention is used, and the mother-board mounted with the connector for the television broadcasting wave signal and each socket for a CA module of each market is designed and connected. Accordingly, the manufacturers of the digital television receiver can easily commercialize digital television receivers from low-end to high-end to each region and market by combining the mother-board at lower cost, in smaller size, and at lightweight as compared with the prior art.

Furthermore, the integrated density can be further increased by mounting the general-purpose component such as the other memory and a VCXO on the upper surface and the back side of the multi-layered circuit module for the DTV receiver. This makes it possible to mount components, which have been mounted on the mother-board connected to the circuit module for the DTV receiver related to the prior art, on the upper surface and the back side of the circuit module for the DTV receiver. In addition, it is also possible to laminate or multi-layer a formerly externally mounted demodulator and the function extension LSI inside the circuit module. This makes it possible to mount the components, which have been mounted on the board connected to the circuit module for the DTV receiver related to the prior art, on an inside layer of the circuit module for the DTV receiver. Therefore, a digital television receiver can also further be reduced in size by using the circuit module for the DTV receiver according to the present invention. Then the digital television receiver according to the present invention can be reduced in size and weight by using the circuit module according to the present invention, and can be applied to the mobile receiver, an in-vehicle receiver, and the like. This makes it possible to contribute to spread of the digital television receiver.

The advantageous effects in the above circuit module for the DTV receiver can be also provided in the case of circuit modules for use in the other AV apparatuses which output video and audio signals, for example, the video playing-back apparatus such as a camera and a DVD player, a music reproduction apparatus such as a headphone stereo, and the like.

BRIEF DESCRIPTION OF THE DRAWINGS

FIG. 9 is a view showing a table of on/off states of enable control signals D, E, F, H, J, and K supplied from a CPU 19 to respective buffers 33 to 43 in a system shown in FIG. 1 using the CA interface circuit 3 shown in FIG. 7;

FIG. 10 is a view showing a table of a supply voltage supplied to the respective buffers 33 to 43 and cards shown in FIG. 7 in the system shown in FIG. 1 using the CA interface circuit 3 shown in FIG. 7;

FIG. 12 is a view showing a first part of a table of input and output signals and terminals of CA modules 14 including an IC card using an ISDB-T system in Japan, a CI card using a DVB-T system in Europe, and a cable card using an open cable system in North America in the system according to the first embodiment;

FIG. 13 is a view showing a second part of the table shown in FIG. 12;

FIG. 14 is a view showing a third part of the table shown in FIG. 12;

FIG. 15 is a view showing a table of video signals and audio signals outputted to a display driving circuit 208 via a display interface 206 and terminals shown in FIG. 6;

FIG. 16 is a view showing a table of respective detailed signals of MPEG-2TS signals from respective demodulators 12-1, 12-2, and 12-3 and terminals shown in FIG. 6;

EXPLANATIONS OF NUMERICAL REFERENCES

Figure 1:
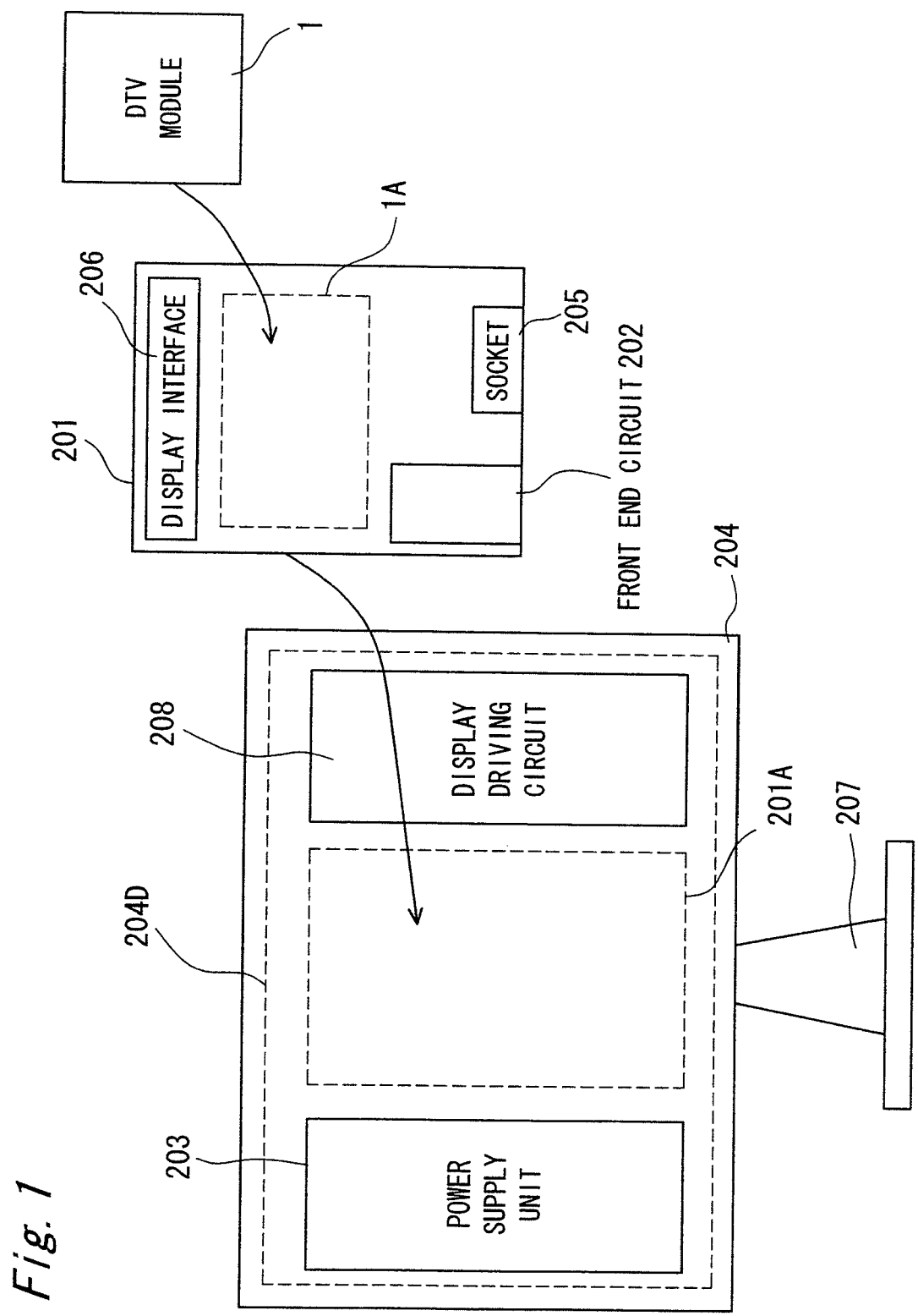
FIG. 1 is a partially exploded mounting view of a television receiver upon mounting a circuit module 1 on a mother-board 201 and upon mounting the mother-board 201 in a receiver housing 204, in a television receiver according to a first embodiment of the present invention.

1 . . . Circuit module,
2 . . . Decoder LSI,
3 . . . CA interface circuit,
3B . . . Buffer,
4 . . . Memory,
5 . . . VCXO,
6 . . . ROM,
7 . . . Capacitor,
9 . . . Solder ball,
10 . . . Capacitor,
12, 12-1, 12-2, and 12-3 . . . Demodulator,
12A . . . Antenna,
13 . . . Card socket,
13-1 . . . IC card socket,
13-2 . . . CI card socket,
13-3 . . . Cable card socket,
14, 14-1, 14-2, and 14-3 . . . CA module,
18 . . . Decoder,
19 . . . CPU,
19B . . . Bus,
22 . . . IC card interface,
22B . . . Buffer,
23 . . . IC card connector,
24 and 25 . . . Signal line,
31 . . . Supply voltage changing-over switch,
31A, 31B, and 32 . . . Power supply terminal,
33, 34, 35, 36, 37, 38, 39, 40, 40A, 40B, 41, 42, and 43 . . . Buffer,
201, 201-1, 201-2, 201-3, and 313 . . . Mother-board,
202 . . . Tuner,
203 . . . Power supply unit,
204 . . . Television set,
204D . . . Display,
205 . . . Socket,
206 . . . Display interface,
207 . . . Support base,
208 . . . Display driving circuit,
209-1, 209-2, and 209-3 . . . EEPROM,
301 . . . Silicon tuner,
302 . . . Land,
303 . . . Connecting terminal for signal separation,
304 . . . Memory,
305-1, 305-2, and 305-3 . . . Demodulator,
306 . . . Oscillation crystal,
307 . . . Via,
308 . . . Ethernet controller layer,
309 . . . Decoder layer,
310, 310-1, 310-2, and 310-3 . . . Demodulation function layer,
311 . . . Silicon tuner layer,
314 . . . Connector,
316 . . . Multi-layered circuit module,
321 . . . Land,
401, 411, 708, 712, 712a, 807, 809, 922, and 925 . . . Extension function layer substrate,
402 . . . Ethernet interface,
403 . . . Hard disk drive,
404 . . . Communication controller,
412 . . . Cable modem,
412a . . . HDMI chip,
501, 502, 504, 506, 508, 514, 701, 702, 707, 709, 711, 712, 719, 719a, 804, 806, 808, 810, 904, and 905 . . . Signal wiring layer substrate,
620-1, 620-2, 620-3, 710-1, 710-2, 710-3, 805-1, 805-2, and 805-3 . . . Demodulation function layer substrate,
507, 706, and 803 . . . Decoder layer substrate,
521 . . . Through hole,
523 . . . Via,
524, 906, and 907 . . . Bump,
612-1, 612-2, and 612-3 . . . Tuner,
703, 704, 714, 705, 801, 802, and 812 . . . Inter-substrate layer,
921 and 924 . . . Image quality improvement function LSI,
R1 and R2 . . . Region,
Rp1 and Rp2 . . . Pull-up resistor, and
T1, T2, T3, T4, T5, T6, T7, T8, T9, T10, T11, T12, and T13 . . . Connecting terminal.

BEST MODE FOR CARRYING OUT THE INVENTION

Embodiments according to the present invention will be described hereinafter with reference to the drawings. Further, the same reference numerals are given to the same components.

First Embodiment

Figure 2:
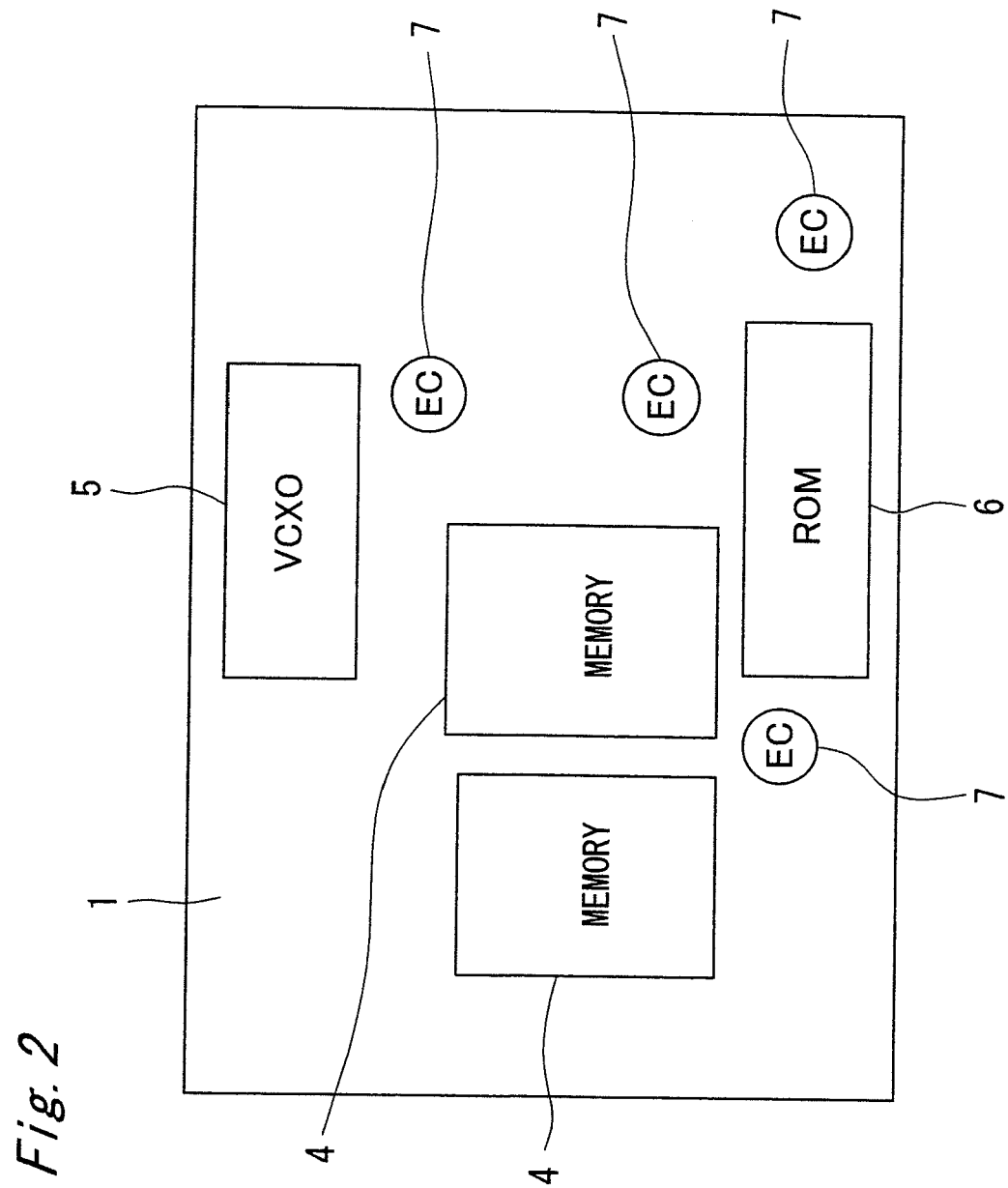
FIG. 2 is a top view of the circuit module 1 shown in FIG. 1.
Figure 3:
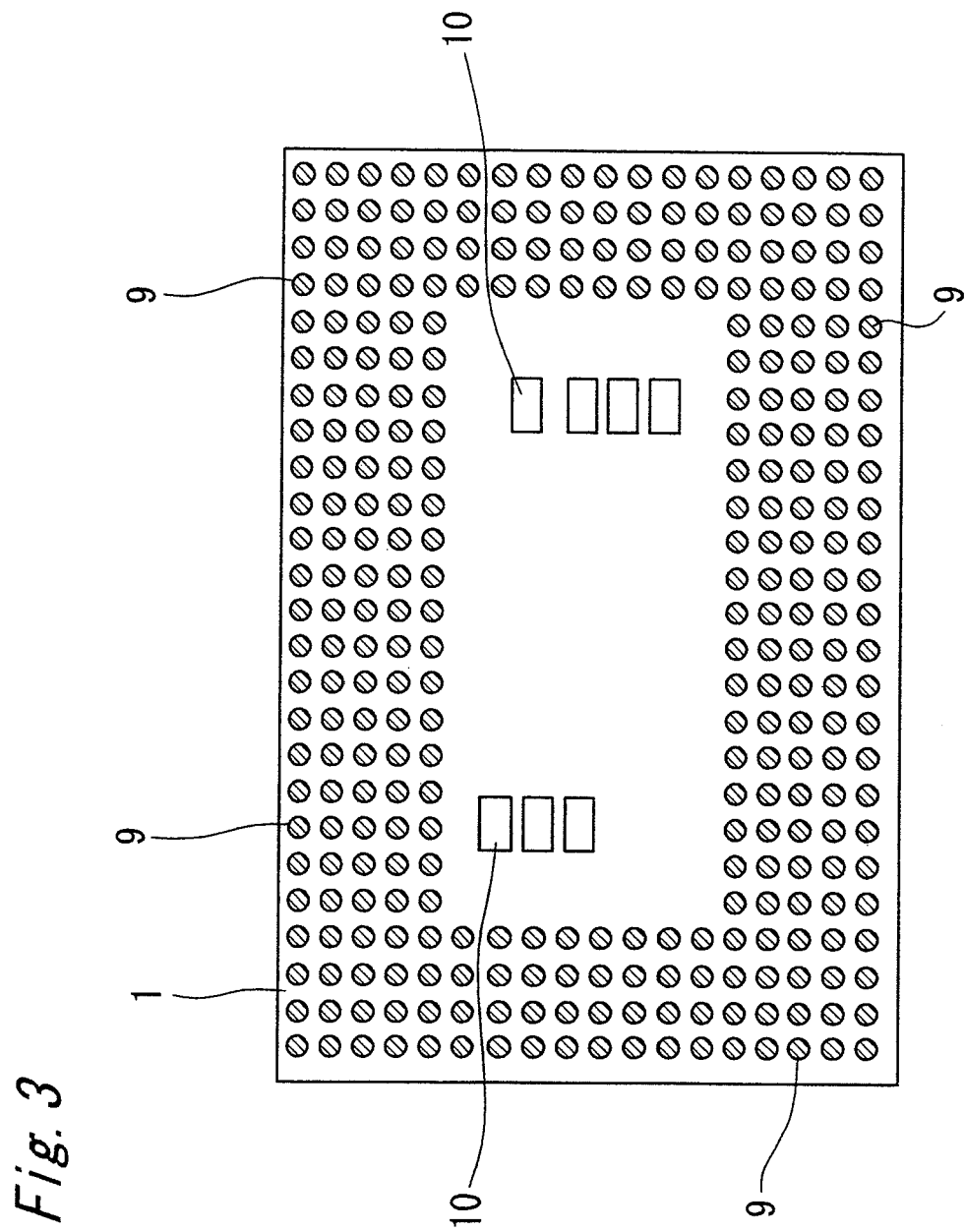
FIG. 3 is a back side view of the circuit module 1 shown in FIG. 1.
Figure 4:
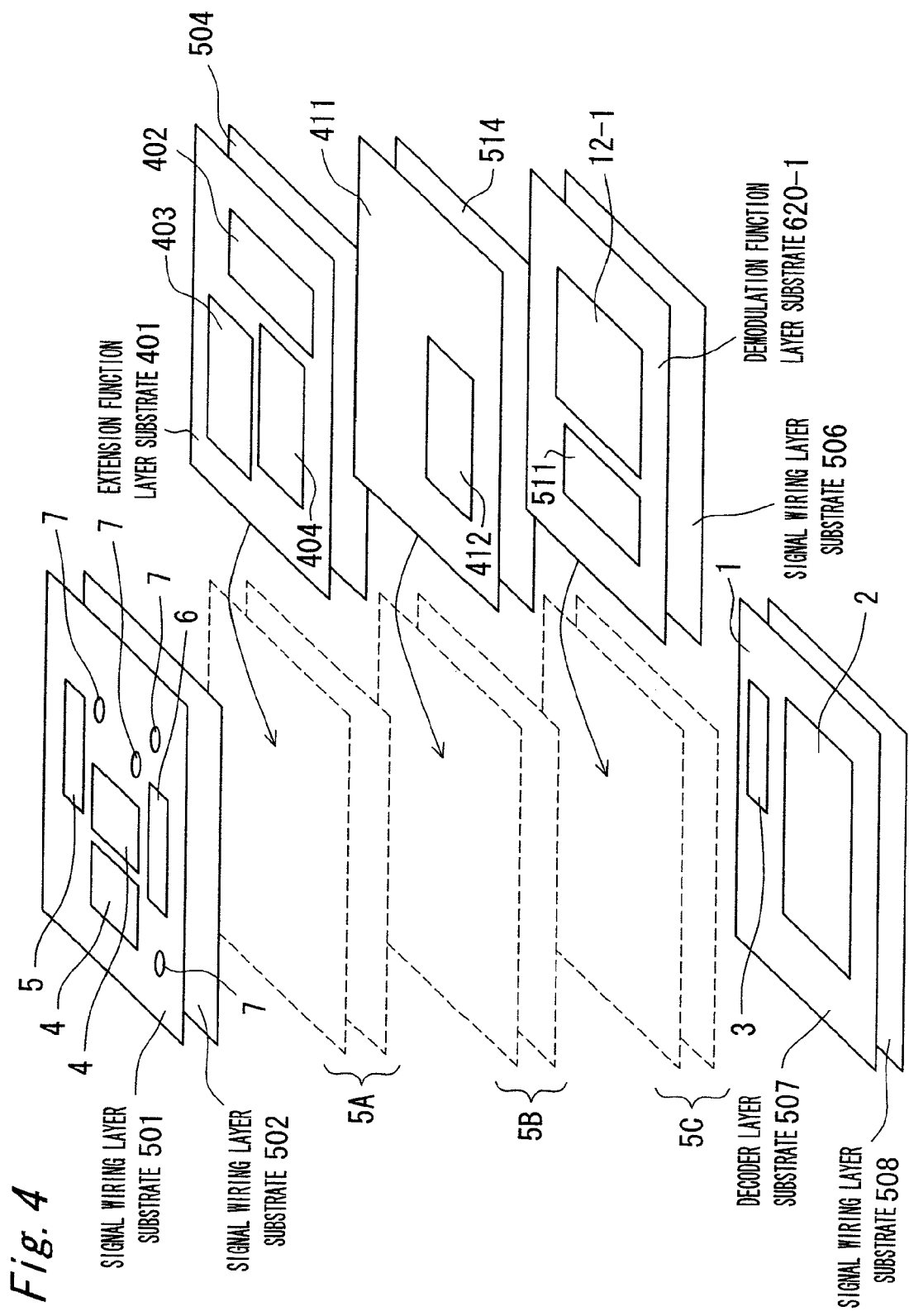
FIG. 4 is an exploded perspective view showing a multi-layer structure of the circuit module 1 shown in FIG. 1.
Figure 5:
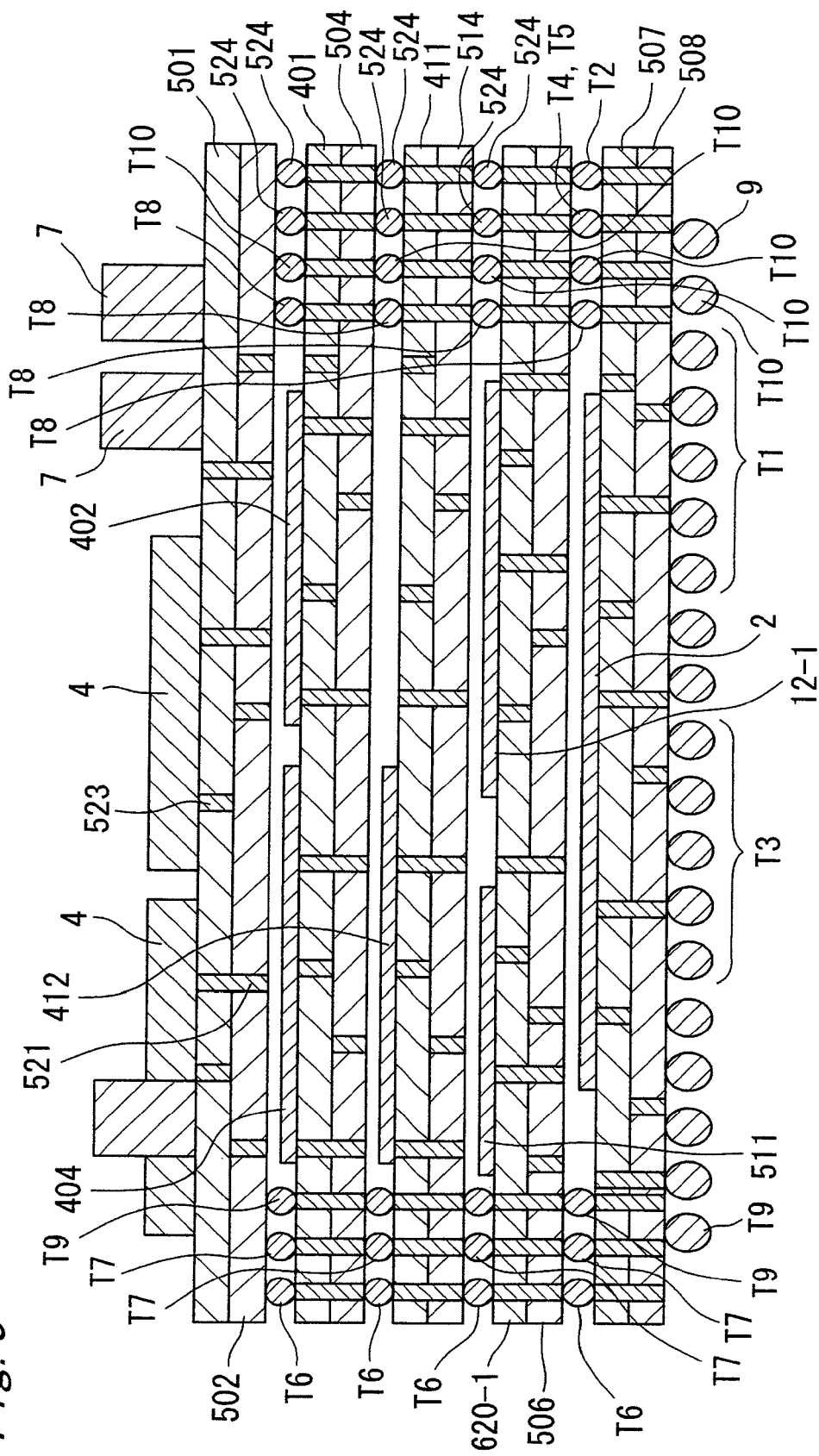
FIG. 5 is a sectional view showing the multi-layer structure of the circuit module 1 shown in FIG. 1.

FIG. 1 is a partially exploded mounting view of a television receiver upon mounting a circuit module 1 on a mother-board 201 and upon mounting the mother-board 201 in a receiver housing 204 in a television receiver according to a first embodiment of the present invention. In addition, FIG. 2 is a top view of the circuit module 1 shown in FIG. 1, and FIG. 3 is a back side view of the circuit module 1 shown in FIG. 1. Further, FIG. 4 is an exploded perspective view showing a multi-layer structure of the circuit module 1 shown in FIG. 1. FIG. 5 is a sectional view showing the multi-layer structure of the circuit module 1 shown in FIG. 1. The present embodiment is characterized in that the circuit module 1 according to the first embodiment is mounted, and a display 204D such as a liquid crystal display, a plasma display, or the like is mounted. Further, FIG. 1 is a rear view, and the display 204D is mounted on a front face which is the back side of FIG. 1. Further, it may be configured that the other television receiver, for example, a set-top box, a mobile terminal, and the circuit module 1 in a PC are mounted in the television receiver.

Referring to FIG. 1, the circuit module 1 is mounted on the mother-board 201 which is mounted with a tuner 202 of each nation and region, a socket 205 for connecting CA modules 14-1, 14-2, and 14-3 of each market (See FIG. 6, collectively given reference numeral 14 hereinafter), and a display interface 206 for outputting a digital audio signal or an analog audio signal, and a digital video signal (these signals are content signals including so-called audio-visual signal). The display interface 206 is provided for connecting the video signal and the audio signal outputted from the circuit module 1 to a connected display such as a liquid crystal display, a plasma display, and a CRT display, and the display interface 206 is realized by a different circuit in response to connecting specifications on the display side. Further, the audio signal is outputted to a speaker provided inside the display or outside the display. The mother-board 201 is formed with a plurality of lands corresponding to an arrangement of a plurality of solder balls 9, and the mother-board 201 and the circuit module 1 are physically and electrically connected by a reflow process. The mother-board 201 to which the circuit module 1 is connected is incorporated in a housing of a television set 204 supported by a support base 207 together with a power supply unit 203 and a display drive unit 208. Further, the display interface 206 is connected to the display 204D via a display driving circuit 208.

Referring to FIG. 1, the circuit module 1 for the television receiver is mounted at a position 1A of the mother-board 201 made of a dielectric substrate, and the mother-board 201 is mounted at a position 201A of the receiver housing 204.

The mother-board 201 provided with the lands corresponding to the solder balls 9 of the circuit module 1 is prepared for each nation, region, and market. Accordingly, it makes possible to commercialize a television receiver to each nation, region, and market by connecting to the circuit module 1. In addition, even to the same nation, region, and market, for example, when the television set and the set-top box which are different in a display device such as a liquid crystal digital television set, a plasma television set, and a CRT television set are commercialized, the mother-board 201 provided with the lands corresponding to the circuit module 1 is prepared for each display device. Accordingly, the television set provided with each display device can be commercialized by connecting to the circuit module 1. Similarly, the television set provided with each display device for each nation, region, and market can be commercialized.

Further, in the present embodiment, the connecting method by the reflow process using the solder balls and the lands is used as the connecting method between the circuit module 1 and the mother-board 201. However, the present invention is not limited to this, and a connecting method by a connector and cable may be used provided that the circuit module 1 and the mother-board 201 are physically and electrically connected.

Referring to FIG. 2, circuit components mounted on the component arrangement surface that is the upper surface of the circuit module 1 include a working memory 4 of a decoder LSI 2 to be described later, a voltage controlled crystal oscillator (referred to as a VCXO hereinafter) 5 for generating a clock of the decoder LSI 2 and outputting the same, a ROM 6 for storing data such as a program code for a CPU in the decoder LSI 2, and a plurality of capacitors 7 connected to a power supply (not shown) for each circuit component. That is, the VCXO 5 that is a semiconductor for analog signal processing, the memory 4 that is a semiconductor for digital signal processing, and the ROM 6 are mounted together on the circuit module 1.

Referring to FIG. 3, the circuit components mounted on the soldering surface that is the back side of the circuit module 1 include a plurality of capacitors 10 connected to the power supply of the decoder LSI 2, and the plurality of solder balls 9 that are external terminals of the circuit module 1 and connects the signal lines and power supply lines upon mounting the circuit module 1 on the mother-board 201. The upper surface and the back side of the circuit module 1 are mainly mounted with general-purpose circuit components.

Figure 6:
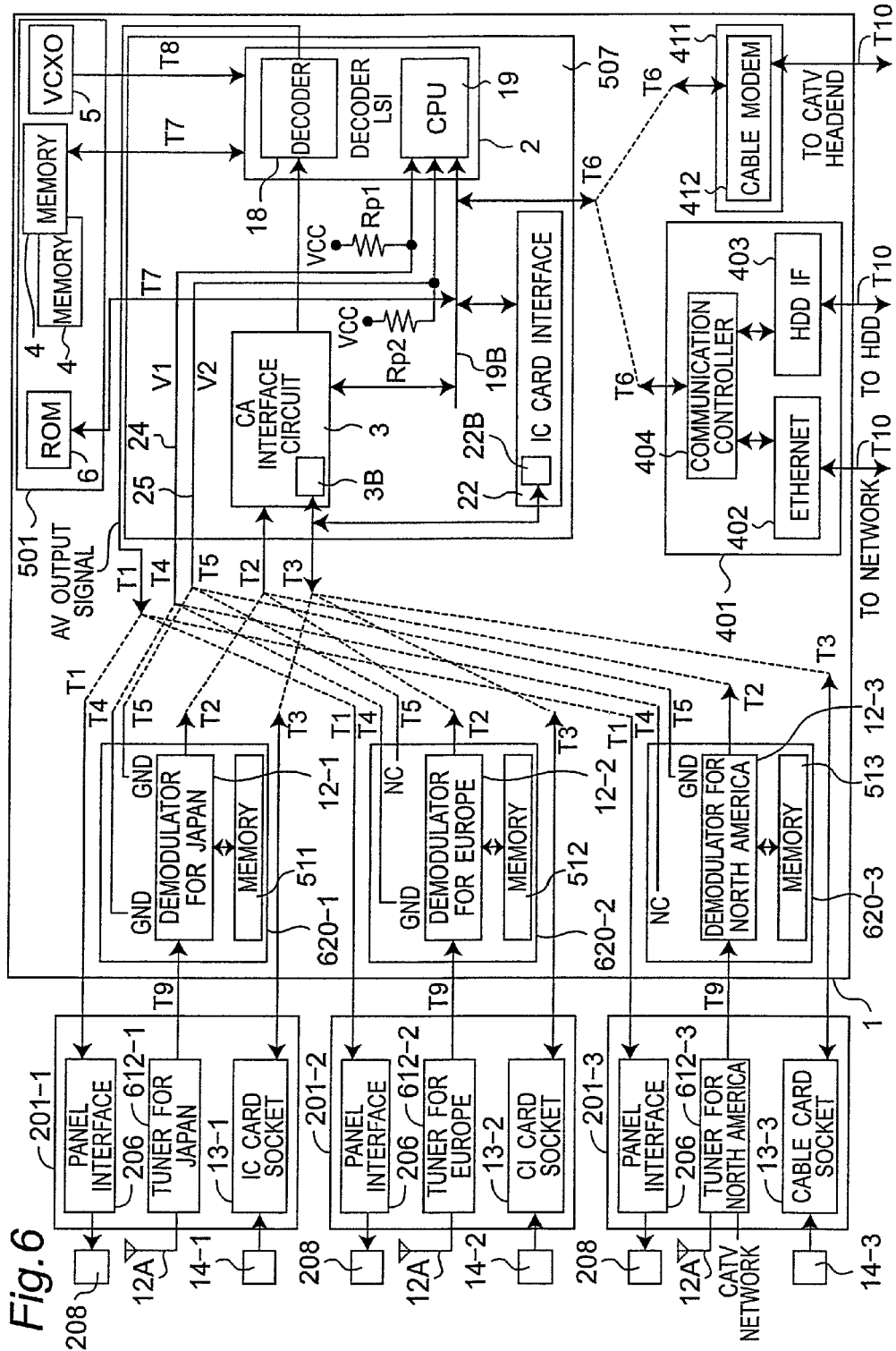
FIG. 6 is a block diagram showing a system configuration including the circuit module 1 and mother-boards for countries 201-1, 201-2, and 201-3 connected to the circuit module 1 according to the first embodiment of the present invention.

Referring to FIG. 4, the circuit module 1 is composed of a plurality of printed circuit board layers 501, 502, 401, 504, 411, 514, 620-1, 506, 507, and 508 having a multi-layer structure, and circuit components mounted on those layers. As shown in FIG. 4, the circuit module 1 includes the following:

(a) the signal wiring layer substrate 501 on the upper surface side on which the circuit components 4 to 7 shown in FIG. 2 are mounted;

(b) the signal wiring layer substrate 502;

(c) the extension function layer substrate 401 for extending a network function, and is mounted with an Ethernet interface 402 (in this case, Ethernet is a trademark, referred to as the same hereinafter), a hard disk drive interface 403, and a communication controller 404 as shown in FIG. 6;

(d) the signal wiring layer substrate 504;

(e) the extension function layer substrate 411 for extending a network function, and is mounted with a cable modem 412 as shown in FIG. 6;

(f) the signal wiring layer substrate 514;

(g) the demodulation function layer substrate 620-1 for the demodulation function for Japan, and is mounted with a demodulator for Japan 12-1 and a memory for a demodulator 511 as shown in FIG. 6;

(h) the signal wiring layer substrate 506;

(i) the decoder layer substrate 507 for the decode function, and is mounted with a CA interface circuit 3 that is a common interface directly connectable to the decoder LSI 2 for performing decode processing corresponding to a compression system in digital television broadcasting of each nation and region, and a CA module 14 at each market, as shown in FIG. 6; and (j) the signal wiring layer substrate 508;

The circuit module 1 has the multi-layered structure multi-layered in the thickness direction of the respective substrates so that the substrates substantially become parallel to each other.

In this case, the Ethernet interface 402, the hard disk drive interface 403, the communication controller 404, the demodulator for Japan 12-1, the memory for the demodulator 511, the decoder LSI 2, and the CA interface circuit 3 are mounted on the inside layer. Accordingly, the configuration is of a semiconductor bare chip, and then, it is possible to mount on the substrate by wire bonding and flip chip bonding. In addition, each substrate set represents a multi-layer substrate. FIG. 4 shows an example of a two-layer substrate. However, the number of layers is not limited, and a multi-layer substrate equal to or larger than four layers may be used.

As for the extension function layer substrate 401 and the signal wiring layer substrate 504, respective substrate sets concerning a plurality of types of the extension functions are prepared, and lamination or multi-layering can be made by selecting one of the substrate sets and by replacing the same substrate. The selected extension function layer substrate 401 and the signal wiring layer substrate 504 are multi-layered at a position 5A of the circuit module 1. In addition, the selected extension function layer substrate 411 and the signal wiring layer substrate 514 are multi-layered at a position 5B of the circuit module 1. In this case, a plurality of types of functions can be extended by laminating a plurality of types of the extension function layer substrates 401 and 411. Further, in FIG. 4, a first pair of the substrates 401 and 411 and a second pair of the substrates 411 and 514 are inserted. However, any one of the pairs may be inserted. In addition, a plurality of types of the demodulation function layer substrates 620-1 and the signal wiring layer substrate 506 are prepared for each nation and region. Accordingly, lamination can be made by selecting and replacing the same substrate. The selected demodulation function layer substrate 620-1 and the signal wiring layer substrate 506 are multi-layered at a position 5C of the circuit module 1.

By being configured as described above, the circuit module 1 can be micro-miniaturized into a semiconductor chip size or an LSI package size as compared with the prior art. In addition, a demodulation function and an extension function can be added by laminating without increasing an area thereof. In addition, the types of the demodulation function and the extension function can be selected by replacing the types of the laminating substrates. Further, the extension function layer substrate 401, the demodulation function layer substrate 620-1, and the decoder layer substrate 507 that are the inside layers may be mounted with a capacitor and a resistor together with a semiconductor bare chip of an LSI and a memory. This leads to increase in the mounting rate of the circuit components in the inner package of the circuit module 1, and then, the DTV broadcast receiver using the circuit module 1 can be further reduced in size.

Next, the multi-layered structure of the circuit module 1 will be described using FIG. 5. The signal wiring layer substrate 501 and 502 are glued together by a predetermined adhesive, and general-purpose circuit components such as the memory 4 and the capacitor 7 are mounted on the signal wiring layer substrate 501. In this case, the circuit components 4 to 7 shown in FIG. 2 are mounted. The wiring between the upper surface of the signal wiring layer substrate 501 and the upper surface of the signal wiring layer substrate 502 is connected through vias 523, and wiring between the upper surface of the signal wiring layer substrate 501 and the back side of the signal wiring layer substrate 502 is connected through through holes 521. There are many vias 523 and many through holes 521 in the respective substrates 401, 504, 411, 514, 620-1, 506, 507, and 508 shown in FIG. 5. Description of each of the vias and the through holes is omitted. Further, in this description, terms of "through hole" and "via" are used. In this case, the through hole means a through hole conductor which is made of a conductor filled in a through hole, and the via means a via conductor which is made of a conductor filled in the via.

In addition, the extension function layer substrate 401 and the signal wiring layer substrate 504 are glued together using the predetermined adhesive, and the signal wiring layer substrate 502 and the extension function layer substrate 401 are electrically and physically connected by a plurality of bumps 524 that are connecting terminals. The bump 524 is an electrical conductor connected on the land made of a conductive thin film prepared on the upper surface and the back side of the respective substrates 502 and 401, and this is the same hereinafter. Referring to FIG. 5, only seven bumps 524 are shown between the signal wiring layer substrate 502 and the extension function layer substrate 401. Then there are actually many bumps between this interlayer and the other interlayers. Description of each of the bumps 524 will be omitted. The respective substrates 501, 502, 401, 504, and the like are printed circuit board having a thickness of several hundreds μm. The bump 524 is preferably a protruded electrode made of gold, silver, or the like having a height of several μm to several tens μm, or a solder ball having a diameter of several hundreds μm. Therefore, a circuit component such as a bare chip mounted on the inside layer is required to be mounted by making thinner than the bump height in such case.

Further, the extension function layer substrate 411 and the signal wiring layer substrate 514 are glued together using the predetermined adhesive, and the signal wiring layer substrate 504 and the extension function layer substrate 411 are electrically and physically connected by a plurality of bumps 524 that are connecting terminals. The bump 524 is an electrical conductor connected on the land made of a conductive thin film prepared on the upper surface and the back side of the respective substrates 514 and 411. Referring to FIG. 5, only seven bumps 524 are shown between the signal wiring layer substrate 504 and the extension function layer substrate 411. Then there are actually many bumps between this interlayer and the other interlayers.

Furthermore, the demodulation function layer substrate 620-1 and the signal wiring layer substrate 506 are glued together using the predetermined adhesive, and the signal wiring layer substrate 514 and the demodulation function layer substrate 620-1 are electrically and physically connected by a plurality of bumps 524. In addition, the decoder layer substrate 507 and the signal wiring layer substrate 508 are glued together using the predetermined adhesive, and the signal wiring layer substrate 506 and the decoder layer substrate 507 are electrically and physically connected by a plurality of bumps 524. A plurality of solder balls 9 is formed on the back side of the wiring layer substrate 508.

The physical arrangements and transmitting electrical signal types of the bumps 524 between the signal wiring layer substrate 504 and the demodulation function layer substrate 620-1 are determined by relatively in common and preliminarily defining respective types of the extension function layer substrates 401 and 411 and the signal wiring layer substrates 504 and 514. The physical arrangements and transmitting electrical signal types of the bumps 524 between the signal wiring layer substrate 506 and the decoder layer substrate 507 are determined by preliminarily in common defining the respective types of the demodulation function layer substrate 620-1 and the signal wiring layer substrate 506. The detailed types of the electrical signals between the signal wiring layer substrate 504 and the demodulation function layer substrate 620-1, and between the signal wiring layer substrate 506 and the decoder layer substrate 507 will be described later.

Next, referring to FIG. 5, the arrangement method defined in common on the connecting terminals such as the bump 524 and the solder ball 9 will be described hereinafter. Connecting terminals T2 (the rightmost connecting terminals shown in FIG. 5), which are connecting conductors including the solder ball 9, the bump 524, and the through hole and transmits the MPEG-2_TS signals inputted from the demodulator 12-1 to the decoder LSI 2, are arranged by being formed between respective substrates from the demodulation function layer substrate 620-1 to the decoder layer substrate 507. Connecting terminals T4 and T5 (second connecting terminals from the rightmost end shown in FIG. 5) including, for example, the bumps for transmitting type-identifying information for identifying a type of the demodulation function layer substrate 620-1, are arranged by being formed between respective substrates from the demodulation function layer substrate 620-1 to the decoder layer substrate 507. Connecting terminals T6 (the leftmost connecting terminals shown in FIG. 5) including the bumps for connecting the extension function layer substrate 401 are arranged by being formed between respective substrates from the extension function layer substrate 401 to the decoder layer substrate 507. Connecting terminals T7 (second connecting terminals from the leftmost end shown in FIG. 5) including the bumps for connecting the memory 4 and the ROM 6 are arranged by being formed between respective substrates from the signal wiring layer substrate 501 to the decoder layer substrate 507. Connecting terminals T8 (fourth connecting terminals from the rightmost end shown in FIG. 5) including the bump connectable to the VCXO 5 are arranged by being formed between respective substrates from the signal wiring layer substrate 501 to the decoder layer substrate 507. Connecting terminals T1 including the solder balls 9 for connecting a video signal and an audio signal outputted from the decoder LSI 2 and inputted to the display driving circuit 208 via the display interface 206, and connecting terminals T3 including the solder balls 9 connected to the socket 205 which is connected to each CA module 14 are arranged by being formed between respective substrates from the decoder layer substrate 507 to the main board 201 (See FIG. 1). Connecting terminals T9 including, for example, the solder balls 9 and the bumps for transmitting an intermediate frequency signal inputted from the tuner 202 to the demodulator 12-1 are arranged by being formed between respective substrates from the demodulation function layer substrate 620-1 to the main board 201. As to be described in detail later, connecting terminals T10 including the solder balls 9 for transmitting communication packet data from a network to the Ethernet interface 402, and for transmitting content data from the hard disk drive to the hard disk drive interface 403 are arranged by being formed between respective substrates from the extension function layer substrate 401 to the main board 201.

In addition, from FIG. 5, the followings are turned out:

(1) For example, the connecting terminals T6 to T10 including the bumps 524 are arranged on the outer side than the circuit components mounted on the inside layer substrates 401, 411, 620-1, and 507. Therefore, the circuit components can be mounted in the vicinity of the substrate center with higher area efficiency and in such a state with small restriction of the connecting terminals T6 to T10, and the connecting terminals T6 to T10 can be arranged with better area efficiency and a small required area.

(2) The solder balls 9 located at the outermost lines (two left and right lines and two upper and lower lines located outermost shown in FIG. 3 (these four lines form a rectangular shape)) are arranged on the inner side than the connecting terminals T6 to T10 which are located at the outermost lines. Therefore, the solder balls 9 can be mounted with higher area efficiency and with small restriction of the connecting terminals T6 to T10.

(3) A land diameter on the circuit module 1 for connecting the connecting terminals T6 to T10 is smaller than a land diameter on the circuit module 1 for connecting the solder balls 9, and an arrangement interval of the connecting terminals T6 to T10 is smaller than an arrangement interval of the solder balls 9. Therefore, further reduction in size can be achieved by mounting an inside layer portion of the circuit module 1 in high density.

(4) The connecting terminals T8 including the bumps are arranged on the inner side than the other connecting terminals T6, T7, T9, and T10. Therefore, regarding the connecting clock signals especially required for electrical characteristics, the wiring distances between the circuit components can be particularly shortened. As a result, the transmission delay time of the clock signal is shortened, and signal transmission performance can be improved. Further, the false operation due to waveform distortion generated by a clock signal reflection or the like, the interference on the tuner due to radiation noise, and the like can be suppressed.

Further, the multi-layered structure may be a structure, so-called a silicon through electrode (also referred to as SI through electrode) in which the above described bump 524 is formed on the upper surface and the back side of the silicon chip, and a plurality of silicon chips are electrically connected with the bumps and are multi-layered.

Therefore, the bump 524 group formerly served as only for connecting layers can be dealt as interface connector terminals for replacing the layers. As a result, selection of an extending function can be selected by replacing the layer. Therefore, as for the extension function layer substrate 401 or 411 and the signal wiring layer substrate 504 or 514, respective substrate sets concerning a plurality of types of the extension functions are prepared, and lamination or multi-layering can be made by selecting one of the substrate sets and by replacing the same. A plurality of types of the functions can be extended by laminating a plurality of types of the extension function layer substrates 401. In addition, a plurality of types of the demodulation function layer substrate 620-1 and the signal wiring layer substrate 506 are prepared for each nation and region. Accordingly, lamination or multi-layering can be made by selecting and replacing the same.

In addition, since the interlayer is capable of directly connecting with an interlayer connecting terminal group such as the bump 524 and the via 523, the simple structure which does not require any intermediate member having wiring such as an interposer in the interlayer can be realized. In addition, a pitch of a usual connector for use in the connection between the substrates is several mm. On the other hand, a pitch of the bump 524 is approximately several ten μm to several hundred μm. Therefore, the bump 524 is used as a connector terminal. Then the required area of the connector can be remarkably reduced as compared with the case where the usual connector for use in the connection between the substrates is used, and this leads to reduction in the size thereof.

In addition, each of the decoder layer substrate 507 and the signal wiring layer substrate 508, the extension function layer substrate 401 and the signal wiring layer substrate 504, the extension function layer substrate 411 and the signal wiring layer substrate 514, and the demodulation function layer substrate 620-1 and the signal wiring layer substrate 506 serves as a single substrate, respectively, and then, the operation can be also confirmed by each single piece. Therefore, the decoder layer substrate 507 and the signal wiring layer substrate 508, the extension function layer substrate 401 and the signal wiring layer substrate 504, the extension function layer substrate 411 and the signal wiring layer substrate 514, and the demodulation function layer substrate 620-1 and the signal wiring layer substrate 506, the operation of each of which is confirmed by the single piece, are combined. Then they are multi-layered on the circuit module 1, and then the circuit module 1 can improve the manufacturing yield thereof. Further, in FIG. 5, lamination or multi-layering is performed in the order of the extension function layer substrates 401 and 411, the demodulation function layer substrate 620-1, and the decoder layer substrate 507 from the upper surface. In this case, the lamination order is not limited.

In addition, as shown in FIG. 5, the decoder LSI 2 is arranged at roughly the center of the decoder layer substrate 507 of the circuit module 1, and the working memory 4 is arranged at roughly the center of the upper surface of the circuit module 1. Therefore, the wiring between the decoder LSI 2 and the working memory 4 has the length substantially equal to the thickness of eight substrates and four bumps, and then, the wiring can be shortened. Therefore, since an inductor component and a stray capacitance component in the wiring can be suppressed, and electrical characteristics are improved, the transmission delay time of the electrical signals is shortened, and signal transmission performance can be improved. Further, the false operation due to waveform distortion generated by an electrical signal reflection or the like, the interference on the tuner due to radiation noise, and the like can be suppressed.

In addition, the demodulator 12-1 is arranged at roughly the center of the demodulation function layer substrate 620-1. The wiring between the decoder LSI 2 and the demodulator 12-1 has the length substantially equal to the thickness of two substrates and one bump, and then, the wiring can be shortened. Therefore, since an inductor component and a stray capacitance component in the wiring can be suppressed, and electrical characteristics of the wiring are improved. The transmission delay time of the electrical signal is shortened, and signal transmission performance can be improved. Further, the false operation due to waveform distortion generated by an electrical signal reflection or the like, the interference on the tuner due to radiation noise, and the like can be suppressed.

In addition, the communication controller 404 is arranged at roughly the center of the extension function layer substrate 401. The wiring between the decoder LSI 2 and the communication controller 404 has the length substantially equal to the thickness of six substrates and three bumps, and then, the wiring can be shortened. Therefore, since an inductor component and a stray capacitance component in the wiring can be suppressed, and electrical characteristics of the wiring are improved, and then, the transmission delay time of the electrical signals is shortened, and signal transmission performance can be improved. Further, the false operation due to waveform distortion generated by an electrical signal reflection or the like, the interference on the tuner due to radiation noise, and the like can be suppressed.

In addition, the decoder layer substrate 507 mounted with a decoder common to each nation and region, the demodulation function layer substrate 620-1 mounted with a demodulator to each region, and the extension function layer substrates 401 and 411 mounted with a function extending LSI corresponding to a network or the like are multi-layered. Accordingly, it is possible to miniaturize the same into a semiconductor chip size or an LSI package size by incorporating a demodulator that has been conventionally mounted on a mother-board, and a function extension LSI that has been conventionally mounted on the function extension substrate. As a result, the mother-board and the function extension substrate can be reduced in size, and this leads to miniaturization of the digital television receiver.

Further, in the above embodiment, there is shown a configuration in which respective circuit components are multi-layered by being mounted on the plurality of printed circuit boards 501, 502, 401, 504, 620-1, 506, 507, and 508 of the circuit module 1. However, the present invention is not limited to this, and the above respective circuit components may be multi-layered by being mounted on the semiconductor chip, and stored in a LSI package by connecting with the bump.

FIG. 6 is a block diagram showing a system configuration including the circuit module 1 and the mother-board 201 shown in FIG. 1. The system configuration shown in FIG. 6 will be described hereinafter.

Referring to FIG. 6, mother-boards 201-1, 201-2, and 201-3 (collectively given reference numeral 201 hereinafter), any one of which is to be selected, are composed of tuners 612-1, 612-2, and 612-3 (collectively given reference numeral 612 hereinafter) connected to antennas 12A. Card sockets 13-1, 13-2, and 13-3 (collectively given reference numeral 13 hereinafter) into which the CA modules 14 are inserted; and the display interfaces 206. Further, the tuner 612 is of a tuner such as the tuner 202 explained in FIG. 1. In addition, the circuit module 1 includes the decoder layer substrate 507 mounted with the decoder LSI 2 provided with the decoder 18 and the CPU 19, the CA interface circuit 3, and the IC card interface 22, the wiring layer substrate 501 mounted with a plurality of memories 4, the VCXO 5, and the ROM 6, demodulation function layer substrates 620-1, 620-2, and 620-3 (collectively given reference numeral 620 hereinafter) mounted with demodulators 12-1, 12-2, and 12-3 (collectively given reference numeral 12 hereinafter), the network extension function layer substrate 401, and the CATV modem extension function layer substrate 411. In this case, the VCXO 5 and the memory 4 are connected to the decoder LSI 2, and the memory 4, the CPU 19, the CA interface circuit 3, the ROM 6, the IC card interface 22 are connected via a bus 19B. Further, description of the substrate configuration of the circuit module 1 shown in FIG. 6 is the same as that of the substrate configuration shown in FIGS. 4 and 5. In this case, some of the substrates are not shown in the drawing.

The tuner 612 of the mother-board 201 receives a digital television broadcasting wave signal via the antenna 12A, frequency converts the digital television broadcasting wave signal into a predetermined intermediate frequency signal, and outputs the same to the demodulator 12 in the circuit module 1. The demodulator 12 demodulates the above frequency-converted intermediate frequency signal into the MPEG-2_TS signal (this signal includes a video digital data signal and an audio digital data signal) using the connected memory 511, and outputs the same to the CA interface circuit 3. The CA interface circuit 3 guarantees the operation by physically and electrically connecting the interface with the MPEG-2_TS signal. Even if the demodulator 12 is any of the demodulator 12-2 in conformity with the DVB-T system, the demodulator 12-1 in conformity with the ISDB-T system, and the demodulator 12-3 in conformity with the ATSC system using a VSB system, the demodulator can be directly connected to the CA interface circuit 3.

The socket 205 shown in FIG. 1, includes the IC card socket 13-1, the CI card socket 13-2, and the cable card socket 13-3. Since any of the CI card in the DVB-T system and a cable card in an open cable has the same physical specifications as a PC card (each have electrically different specifications), the cards can be connected by inserting into the same socket. The IC card has physical specifications different from each other. In the circuit module 1 according to the present embodiment, connection with the CA module 14 is guaranteed physically and electrically as to be described later, and then, any one of the CI card, the cable card, and the IC card can be connected by directly inserting. The circuit module 1 can be commercialized by guaranteeing the operation by connecting to the CA module 14 in America and Europe.

The circuit configuration of the CA interface circuit 3 will be described in detail later. The operation of the CA interface circuit 3 is controlled by the CPU 19, and the CA interface circuit 3 includes a circuit for inputting the MPEG-2_TS signal from the demodulator 12 and for outputting the same to the decoder 18 of post descrambler processing, and an interface circuit for guaranteeing the operation by electrically connecting to the CA modules 14 (the CI card and the cable card). The MPEG-2_TS signal from the demodulator 12 is outputted to the CA modules 14 (the CI card and the cable card) via the CI card socket 13-2 or the cable card socket 13-3, and is descrambled by the CA modules 14 (the CI card and the cable card). The MPEG-2_TS signal of post descrambling is outputted from the CA modules 14 (the CI card and the cable card) to the decoder 18 in the decoder LSI 2 via the CI card socket 13-2 or the cable card socket 13-3. In addition, the CA interface circuit 3 is also connected to the bus 19B of the CPU 19 in order to access a resister or a memory, in which an attribute is written, in the CA modules 14 (the CI card and the cable card). That is, the CA interface circuit 3 performs input and output processing on a plurality of stream signals and data signals communicated among the demodulator 12, the CA module 14 (the CI card and the cable card), the decoder 18, and the CPU 19 to the CA module 14 (the CI card and the cable card).

The IC card socket 13-1 is a socket into which the CA module 14 (the IC card) is inserted. The CA module 14 of the ISDB-T system has the same physical specifications and electrical specifications as those of the IC card, and therefore, the CA module 14 can be connected to the IC card socket 13-1. The IC card interface 22 is inserted between the IC card socket 13-1 and the bus 19B of the CPU 19, and executes interface processing of electrical input and output on the signals between the IC card connected to the IC card socket 13-1 and the CPU 19. Further, the number of connecting terminals of the IC card is 8. The circuit module 1 can be commercialized by guaranteeing the operation by also connecting to the CA module 14 in Japan.

In addition, the circuit module 1 is characterized in that the IC card interface 22 and the CA interface circuit 3 are connected by putting together to the common connecting terminal T3.

A buffer 22B is provided on the connecting terminal T3 side of the IC card interface 22, and a buffer 3B is provided on the connecting terminal T3 side of the CA interface circuit 3. In this case, the buffers 3B and 22B are turned on/off by the control of the CPU 19. The connecting terminal T3 side of each of the buffers 3B and 22B is connected to the connecting terminal T3. Further, in this description, term of "buffer" means a buffer amplifier.

When the demodulation function layer substrate for Japan 620-1 which uses the ISDB-T system described with reference to FIG. 6 is connected, the CPU 19 turns the buffer 22B on, and turns the buffer 3B off. At this time, electrical specifications of the connecting terminal T3 conform to a system which uses the IC card, and becomes electrical specifications of the IC card determined by the IC card interface 22. On the other hand, when the demodulation function layer substrate for Europe 620-2 which uses the CI card, or the demodulation function layer substrate for North America 620-3 which uses the cable card are connected. The CPU 19 turns the buffer 22B off, and turns the buffer 3B on. At this time, the electrical specifications of the connecting terminal T3 conform to a system which uses the cable card or the CI card, and becomes electrical specifications of the cable card or the CI card determined by the CA interface circuit 3. This allows the connecting terminal T3 to be used for the IC card interface 22 and the CA interface circuit 3. That is, when the demodulation function layer substrate 620-1 is connected to the decoder layer substrate 507, the IC card socket 13-1 and the IC card interface 22 are connected, and the IC card interface 22 operates. On the other hand, when the demodulation function layer substrate 620-2 or 620-3 is connected to the decoder layer substrate 507, the CI card socket 13-2 or the cable card socket 13-3 is connected to the CA interface circuit 3, and the CA interface circuit 3 operates.

The decoder LSI 2 is composed of the decoder 18 and the CPU 19 which are hardware engines, and the decoder LSI 2 performs decoding processing which inputs the MPEG-2_TS signal, decodes the MPEG-2_TS signal to a video signal and an audio signal, and outputs the same. The decoder LSI 2 can decode the MPEG-2_TS signal by adapting to the difference among the MPEG-2 specifications in the DVB-T system, and the system such as the ATSC and the ISDB-T, the H.264 which is to be standardized in the future, and the like. The decoded video signal and audio signal are outputted to the display device via the panel interface 206. In addition, a video signal and an audio signal are inputted from an interface such as the Ethernet or the HDMI, decoding processing is performed, and the decoded video signal and audio signal are outputted to the display device via the panel interface 206.

The plurality of memories 4 are connected to the CPU 19 and the decoder 18 in the decoder LSI 2, used as a secondary cache memory and the other application's working memory of data signals of the CPU 19, and also used as a working memory of data signals in encoding processing of the decoder 18. In addition, the VCXO 5 generates an MPEG-2 system clock 27 MHz or the like in which the decoder 18 uses, and outputs the same to the decoder LSI 2. Further, the ROM 6 stores a program code and data for operating the CPU 19, and is connected to the bus 19B of the CPU 19 so that the stored program code and data can be read from the CPU 19.

The thus configured circuit module 1 can guarantee the operation in a single piece by physically and electrically connecting to the demodulator 12 and the CA module 14 in the DVB-T system, the ISDB-T system, the ATSC system, and the open cable system. The circuit module 1 can also decode a compressed video signal and audio signal in the DVB-T system, the ISDB-T system, the ATSC system, the open cable system, and the like, and can output the same.

In addition, FIG. 6 shows the circuit module 1, three types of the mother-boards 201-1, 201-2, and 201-3 to each nation and region, which are connected to the circuit module 1, and two types of the network extension function layer substrate 401 and the CATV modem extension function layer substrate 411. In addition, the circuit module 1 is composed of the signal line wiring substrate 501 multi-layered on the decoder layer substrate 507, any one of three types of the demodulation function layer substrates 620-1, 620-2, and 620-3, and two types of the network extension function layer substrate 401 and the CATV modem extension function layer substrate 411. The circuit module 1 is characterized in that the circuit module 1 can be connected to any one of the three types of the mother-boards 201-1, 201-2, and 201-3. In addition, the decoder layer substrate 507 is characterized in that the decoder layer substrate 507 can be connected to any one of the three types of the demodulation function layer substrates 620-1, 620-2, and 620-3. In addition, the decoder layer substrate 507 is characterized in that the decoder layer substrate 507 can be connected by laminating any one, or both, of the two types of the network extension function layer substrate 401 and the CATV modem extension function layer substrate 411.

Further, a features of the present embodiment is that the connecting terminals T1 to T8 of the decoder layer substrate 507 and the connecting terminals T9 and T10 of the circuit module 1 are grouped according to application, and relatively and commonly connected using connectable specifications on the respective demodulation function layer substrates 620-1, 620-2, and 620-3, the network extension function layer substrate 401, the CATV modem extension function layer substrate 411, and the respective mother-boards 201-1, 201-2, and 201-3. The connecting terminals T1 to T5 are concretely grouped as follows:

(a) the connecting terminal T1 for transmitting the digital or analog video signals and the audio signals, which are outputted from the decoder 18 and inputted to the display driving circuit 208 via the display interface 206;

(b) the connecting terminal T4 or T5 for the control voltage V1 or V2, which inputs type-identifying data information for identifying a type of the demodulation function layer substrate 620-1, 620-2 or 620-3 to the CPU 19;

(c) the connecting terminal T2 connected to the demodulator 12-1, 12-2, or 12-3 for use in each destination to each nation and region, for transmitting the digital MPEG-2_TS signal inputted from the demodulator 12-1, 12-2, or 12-3 to the CA interface circuit 3;

(d) the connecting terminal T3 connected to the IC card socket 13-1, the CI card socket 13-2, or the cable card socket 13-3, into which each CA module 14 is inserted, for transmitting a digital input and output data signal and a stream signal of the CA module inserted into the socket;

(e) the connecting terminal T6 connected to the bus 19B of the CPU 19, for transmitting a digital data signal by connecting to the network extension function layer substrate 401 or the CATV modem extension function layer substrate 411;

(f) the connecting terminal T7 for transmitting a digital data signal by connecting the decoder LSI 2 to the memory 4 or the ROM 6;

(g) the connecting terminal T8 for transmitting a digital clock signal by connecting the decoder LSI 2 to the VCXO 5;

(h) the connecting terminal T9 for transmitting an analog intermediate frequency signal by connecting the tuner 612 to the demodulator 12; and (i) the connecting terminal T10 for transmitting a digital data signal by connecting the network to the Ethernet interface 402, the hard disk drive to the hard disk drive interface 403, and the CATV head-end to the cable modem 412.

In this case, the connecting terminal T3 is connected to the CA interface circuit 3 or the IC card interface 22 via the buffer 3B or the buffer 22B, as described above.

Referring to FIG. 6, the demodulation function layer substrate for Japan 620-1 includes the demodulator for Japan 12-1 and a circuit for outputting the control voltages V1 and V2 each having an electric potential of a grounding conductor. When the decoder layer substrate 507 is connected to the demodulation function layer substrate for Japan 620-1, the CPU 19 reads the control voltages V1 and V2, recognizes that the demodulation function layer substrate 620-1 is connected, and recognizes that a digital television broadcasting wave signal of the ISDB-T system is inputted. Then, the CPU 19 sets the decoder 18 to perform decoding processing of the video signal and the audio signal in conformity with the ISDB-T system, on the MPEG-2_TS signal inputted from the demodulator for Japan 12-1 via the connecting terminal T2. In addition, as described above, the CPU 19 connects the IC card socket 13-1 to the IC card interface 22 via the connecting terminal T3 and the buffer 22B. At this time, the display interface 206 receives the video signal and the audio signal outputted from the decoder 18 in the circuit module 1 via the connecting terminal T1, performs a predetermined interface processing, and then, outputs the same to the display 204D via the display driving circuit 208.

In addition, the demodulation function layer substrate for Europe 620-2 includes the demodulator for Europe 12-2, and a circuit for outputting the control voltage V1 having the electric potential of the grounding conductor and a control voltage V2 (not connected) having a supply voltage Vcc on the circuit module 1 side. When the decoder layer substrate 507 is connected to the demodulation function layer substrate for Europe 620-2, the CPU 19 reads the control voltages V1 and V2, recognizes that the demodulation function layer substrate for Europe 620-2 is connected, and recognizes that a digital television broadcasting wave signal of the DVB-T system is inputted. Then, the CPU 19 sets the decoder 18 to perform decoding processing of the video signal and the audio signal in conformity with the DVB-T system, on the MPEG-2_TS signal inputted from the demodulator for Europe 12-2 via the connecting terminal T2. In addition, as described above, the CPU 19 connects the CI card socket 13-2 to the CA interface circuit 3 via the connecting terminal T3 and the buffer 3B, and sets an operation mode of the CA interface circuit 3 to the DVB-T system. At this time, the display interface 206 receives the video signal and the audio signal outputted from the decoder 18 of the circuit module 1 via the connecting terminal T1, performs a predetermined interface processing, and then, outputs the same to the display 204D via the display driving circuit 208.

Further, the demodulation function layer substrate for North America 620-3 includes the demodulator for North America 12-3, and a circuit for outputting a control voltage V1 (not connected) having the supply voltage Vcc on the circuit module 1 side and the control voltage V2 having the electric potential of the grounding conductor. When the decoder layer substrate 507 is connected to the demodulation function layer substrate for North America 620-3, the CPU 19 reads the control voltages V1 and V2, recognizes that the demodulation function layer substrate for North America 620-3 is connected, and recognizes that a digital television broadcasting wave signal of the ATSC system and the open cable system is inputted. Then, the CPU 19 sets the decoder 18 to perform decoding processing of the video signal and the audio signal in conformity with the ATSC system, on the MPEG-2_TS signal inputted from the demodulator for North America 12-3 via the connecting terminal T2. In addition, as described above, the CPU 19 connects the cable card socket 13-3 to the CA interface circuit 3 via the connecting terminal T3 and the buffer 3B, and sets an operation mode of the CA interface circuit 3 to the open cable system. At this time, the display interface 206 receives the video signal and the audio signal outputted from the decoder 18 of the circuit module 1 via the connecting terminal T1, performs a predetermined interface processing, and then, outputs the same to the display 204D via the display driving circuit 208.

FIGS. 12, 13, and 14 are views showing tables of the input and output signals and terminals of the CA modules 14 including the IC card using the ISDB-T system in Japan, the CI card using the DVB-T system in Europe, and the cable card using the open cable system in North America in the system according to the first embodiment. As is apparent from FIG. 12 to FIG. 14, the CA modules of the respective systems can be connected in common to the decoder layer substrate 507 using the connecting terminals T3. In addition, the tables show that the input and output signals and the terminals change depending on the above respective systems.

FIG. 15 is a view showing a table of the video signals and the audio signals outputted to the display driving circuits 208 via the display interfaces 206 and terminals shown in FIG. 6. As is apparent from FIG. 15, the display interfaces 206 of the respective mother-boards 201-1, 201-2, and 201-3 can be connected in common to the decoder layer substrate 507 using the connecting terminals T1. In addition, the table shows that the signals and the terminals do not change depending on the above respective systems.

FIG. 16 is a view showing a table of respective detailed signals of MPEG-2TS signals from respective demodulators 12-1, 12-2, and 12-3 and terminals shown in FIG. 6. As is apparent from FIG. 16, the respective demodulators 12-1, 12-2, and 12-3 can be connected in common to the decoder layer substrate 507 using the connecting terminals T2. In addition, the table shows that the signals and the terminals do not change depending on the above respective systems.

As described above, the connecting terminals T3 connected to the respective CA modules 14 via the sockets 13-1, 13-2, and 13-3 can change electrical specifications on the decoder layer substrate 507 side in response to the types of the demodulation function layer substrates 620-1, 620-2, and 620-3, or the CA modules 14. In this case, the physical structures of the connecting terminals T3 are the same. The physical structures of the other connecting terminals T1, T2, T4, and T5 are the same in the respective demodulation function layer substrates 620-1, 620-2, and 620-3. Therefore, the demodulation function layer substrates 620-1, 620-2, and 620-3 for use in each destination to each nation and region can be readily replaced for the decoder layer substrate 507.

In addition, referring to FIG. 6, the CPU 19 is connected to the communication controller 404 in the network extension function layer substrate 401, or the cable modem 412 in the CATV modem extension function layer substrate 411 via the bus 19B thereof and the connecting terminals T6, and the CPU 19 performs communication with the controller 404 or 412 using signals such as an address signal and a data signal. Further, a bridge circuit (not shown) provided with, for example, a PCI bus is inserted on the bus 19B side of the connecting terminal T6, and the network extension function layer substrate 401 or the CATV modem extension function layer substrate 411 may be connected to the PCI bus.

The network extension function layer substrate 401 is provided for laminating in the case of extending a network-related function in the circuit module 1, and includes the communication controller 404, the Ethernet interface 402, and the hard disk drive interface 403. The network-related function can be realized by combining the decoder layer substrate 507 with the network extension function layer substrate 401. For example, the network-related function is provided for receiving a service such as a video on demand service which downloads content data from a communication server and listen to and view the downloaded contents by connecting the network extension function layer substrate 401 to a broadband network such as an Internet.

The Ethernet interface 402 is connected to a network via the connecting terminal T10 and the solder ball 9, and transmits and receives a communication packet. The Ethernet interface 402 receives, for example, content data composed of a plurality of packets that constitute the contents on the basis of the control of the communication controller 404. The communication controller 404 stores the received content data in a hard disk drive (not shown) via the connecting terminal T10 and the solder ball 9 by controlling the hard disk drive interface 403. In displaying the content data, on the basis of an indication signal from the CPU 19, the communication controller 404 reads the content data stored in the hard disk drive, and outputs the same to the CA interface circuit 3 and the decoder 18 via the connecting terminal T6 and the bus 19B, and then, decoding and display processing are executed by the control of the CPU 19. Further, the content data may be directly outputted to and stored in the memory 4 via the CPU 19 without temporarily storing in the hard disk drive.

In addition, the CATV modem extension function layer substrate 411 is provided with the cable modem 412, and is provided for connecting in the case of extending a CATV modem function in the circuit module 1. The CATV modem function can be realized by laminating the decoder layer substrate 507 to the CATV modem extension function layer substrate 411. The CATV modem function is a function which, for example, downloads application software data such as games from a server connected to a CATV head-end. The cable modem 412 is connected to the CATV head-end via T6 and the solder ball 9, and transmits and receives the communication packet. On the basis of an indication signal from the CPU 19, the cable modem 412 receives software data composed of a plurality of packets that constitute application software, for example, and then, outputs the same data to the memory 4 via the connecting terminal T6, the bus 19B, and the CPU 19, then stores the same data. After that, the software is executed by the CPU 19, and the decoding and display processing are executed.

Such network-related function and CATV modem function are generally demanded in the high-end digital television receiver which is offered to users who require a more sophisticated function. The configuration that combines the extension function layer substrate 401 or 411 with the decoder layer substrate 507 can be easily developed from a low-end television receiver whose function is not extended to a high-end television receiver whose function can be extended. In addition, since the function extension substrate 401 or 411 can be connected using the common connecting terminal T6, the extending function can be easily selected.

Further, since a nation and region where a service corresponding to the function extension is implemented, are known in advance, the CPU 19 reads out predetermined control voltages for identifying the demodulation function layer substrates 620-1, 620-2, and 620-3, and can determine whether or not the function is extended for each destination. For example, when the service is implemented in Japan, the CPU 19 recognizes that the demodulation function layer substrate for Japan 620-1 is connected to the decoder layer substrate 507, and can allow the connection of the function extension substrate. On the other hand, when the service is not implemented except in Japan, the CPU 19 recognizes that the demodulation function layer substrate for Japan 620-1 is not connected to the decoder layer substrate 507, and the CPU 19 can prohibit any connection of the function extension substrate.

Referring to FIG. 6, signal lines 24 and 25 of the control voltages V1 and V2 inputted to the CPU 19 are pull-upped by being connected to a power supply terminal Vcc of a voltage supply of 3.3 V via pull-up resistors Rp1 and Rp2, and connected to the demodulation function layer substrate 620 mounted with the demodulator 12 and the memory 511, respectively. The control voltages V1 and V2, each can be set to 0 that is the low level (corresponding to a voltage of 0 V) or 1 that is the high level (corresponding to a voltage of 3.3 V) at the demodulation function layer substrate 620 side by connecting to the grounding conductor (GND) or non-connecting (NC). The demodulation function layer substrate 620 can be set to four operation modes at the CPU 19 by a combination of the two levels of the control voltages V1 and V2. That is, the CPU 19 can use the two control voltages V1 and V2 as a type-identifying data signal for identifying a type of the demodulation function layer substrate 620. For example, the CPU 19 can identify by distinguishing the demodulation function layer substrate for Europe 620-2 using the DVB-T system, the demodulation function layer substrate for Japan 620-1 using the ISDB-T system, and the demodulation function layer substrate for America 620-3 using the ATSC system and the open cable system. In this case, since the demodulation function layer substrate 620 changes according to the type of the demodulator 12, the type of the demodulation function layer substrate 620 changes in response to the system of the digital television broadcasting wave signal which the demodulator 12 receives and outputs. Therefore, the CPU 19 can identify the type of demodulation function layer substrate 620 and the broadcasting system of the digital television broadcasting wave signal inputted to the decoder 18 by using the two control voltages V1 and V2. Similarly, it goes without saying that the type of the extension function layer substrate can be also identified.

Figure 8:
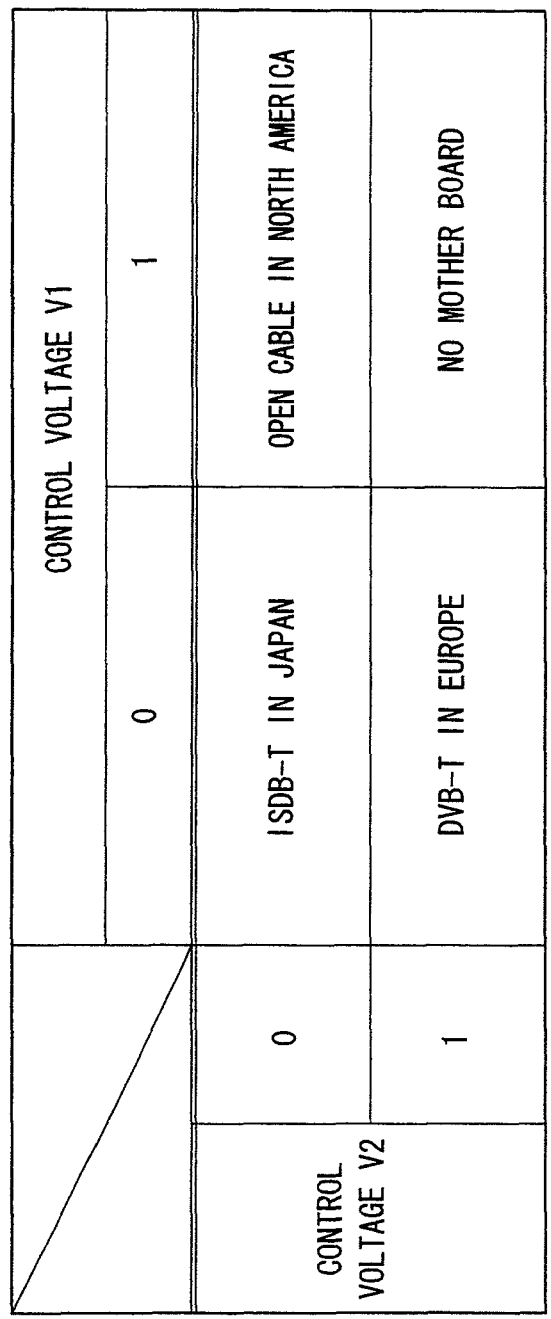
FIG. 8 is a view showing a table of set values of respective control voltages V1 and V2 shown in FIG. 6.

FIG. 8 is a view showing an example of a table of set values of the respective control voltages V1 and V2 shown in FIG. 6. Referring to FIG. 8, in the demodulation function layer substrate for Japan 620-1 (which is a substrate formed in conformity with the ISDB-T system), the control voltage V1 is set to 0, and the control voltage V2 is set to 0. In addition, in the demodulation function layer substrate 620-3 for use in the ATSC system and the open cable in North America (which is a substrate formed in conformity with the ATSC system and the open cable system), the control voltage V1 is set to 1, and the control voltage V2 is set to 0. Further, in the demodulation function layer substrate 620-2 for the DVB-T in Europe (which is a substrate formed in conformity with the DVB-T system), the control voltage V1 is set to 0, and the control voltage V2 is set to 1. Furthermore, when the control voltage V1 is set to 1 and the control voltage V2 is set to 1, the CPU 19 judges that the demodulation function layer substrate 620 is not connected. In this case, when the demodulation function layer substrate 620 is multi-layered and connected, the CPU 19 recognizes changes in the type of the demodulation function layer substrate 620 according to changes in the control voltages V1 and V2, each changing from 1. After that, the CPU 19 reads the control voltages V1 and V2, and sets a decoding system of the decoder LSI 2 and an operation mode of the interface processing of the CA interface circuit 3 in response to the levels of the control voltages.

In the above embodiment, the two control voltages V1 and V2 are used as the type-identifying data signals for identifying the type of the demodulation function layer substrate 620 and the broadcasting system of inputted digital television broadcasting wave signal. However, the number of the control voltages and the type and the number of the demodulation function layer substrate 620 are not limited. In addition, a memory for storing type-identifying data, which detects the type of the demodulation function layer substrate 620 and the broadcasting system of the inputted digital television broadcasting wave signal, is mounted on the demodulation function layer substrate 620 side, and the memory is connected to the CPU 19, and then, the CPU 19 may identify the type of the demodulation function layer substrate 620 and the broadcasting system of the digital television broadcasting wave signal by reading the type-identifying data from the memory. That is, the type-identifying data for identifying the demodulation function layer substrate 620 and the broadcasting system of the inputted digital television broadcasting wave signal is stored outside the decoder layer substrate 507. The CPU 19 accesses the memory or the like in which the type-identifying data is stored by connecting the demodulation function layer substrate 620, and the CPU 19 identifies the type of the demodulation function layer substrate 620 and the broadcasting system of the inputted digital television broadcasting wave signals.

Figure 7:
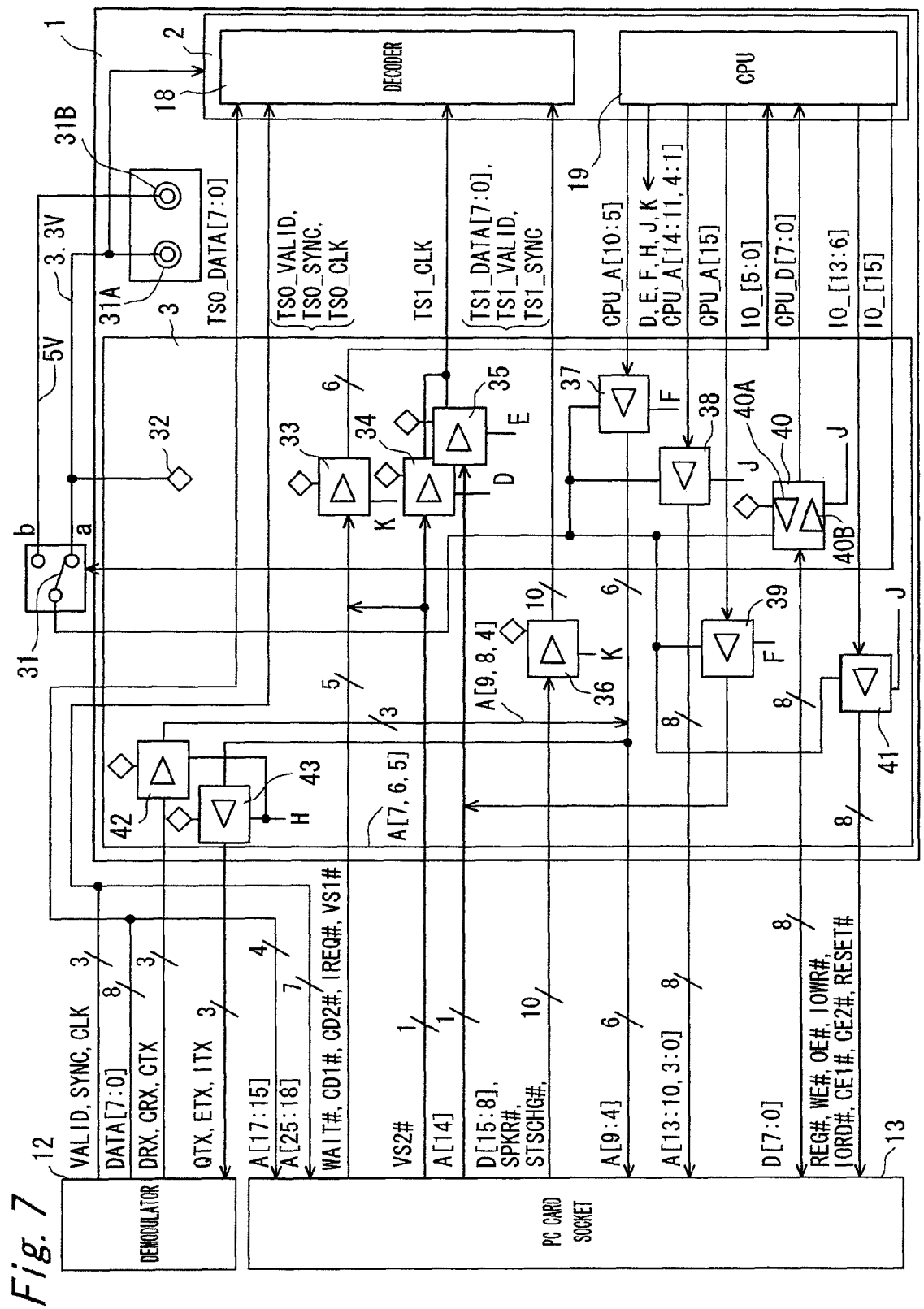
FIG. 7 is a circuit diagram showing a configuration of a CA interface circuit 3 formed in the circuit module 1 shown in FIG. 1.

FIG. 7 is a circuit diagram showing a configuration of the CA interface circuit 3 formed in the circuit module 1 shown in FIG. 1.

Description of symbols of respective buffers 33 to 43 shown in FIG. 7 will be explained. Each of the symbols of the respective buffers 33 to 43 shows a circuit in which one or more buffers are connected in parallel. The number of the buffers connected in parallel is indicated by the number of signal lines which is shown on the signal lines shown in FIG. 6. In addition, in triangles of the respective buffers 33 to 43, a vertex having the sharpest angle of a triangle shows the output side, the side facing the vertex shows the input side, and a horizontal direction of the triangle shows a traveling direction of a signal thereof. The power supply line is connected to the rectangular upper side including the triangle of each of the buffers 33 to 43. On the other hand, the signal line of the enable control signal from the CPU 19 for performing on/off control of the output of each of the buffers 33 to 43 is connected to the rectangular lower side.

Among the power supply lines of the respective buffers 33 to 43, the power supply lines of the buffers 33, 34, 35, 36, 40, 42, and 43 are connected to a power supply terminal 31A of 3.3 V via a power supply terminal 32 indicated by ◇. On the other hand, the power supply lines of the buffers 37, 38, 39, 40, and 41 connected to the card socket 13 are connected to an output terminal of a supply voltage changing-over switch 31. In addition, a supply voltage of 3.3 V from the power supply terminal 31A is supplied to the decoder LSI 2. The power supply terminal 31A of 3.3 V is connected to a contact "a" of the supply voltage changing-over switch 31, and a power supply terminal 31B of 5 V is connected to a contact "b" of the supply voltage changing-over switch 31. Switching of the supply voltage changing-over switch 31 is controlled by an IO [15] signal that is a general-purpose IO of the CPU 19. In an initial state, the supply voltage changing-over switch 31 is switched to the contact "a". When the supply voltage changing-over switch 31 is switched to the contact "a," the supply voltage of 3.3 V is supplied to the respective buffers 37, 38, 39, 40, and 41. On the other hand, when the supply voltage changing-over switch 31 is switched to the contact "b," a supply voltage of 5 V is supplied to the respective buffers 37, 38, 39, 40, and 41. Further, the power supply terminals 31A and 31B are connected to the power supply unit 203 via the solder balls 9 of the circuit module 1 and the mother-board 201. As to be described in detail later, the CPU 19 controls to output an appropriate supply voltage to the buffers 37, 38, 39, 40, and 41 in response to setting information from the CA module 14 connected to the card socket, or the mother-board 101.

In the enable control signals D, E, F, H, J, and K of the respective buffers 33 to 43, when the enable control signals are turned on, input signals inputted to the respective buffers 33 to 43 are directly outputted. On the other hand, when the enable control signals are turned off, the input signals inputted to the respective buffers 33 to 43 are not outputted. In this case, the output terminals thereof are put into a high-impedance state. That is, output signals of the respective buffers 33 to 43 are turned on/off by the enable control signals D, E, F, H, J, and K (referred to as "respective buffers 33 to 43 are turned on/off" hereinafter). The respective enable control signals are outputted from the CPU 19 via a general-purpose IO port of the CPU 19. In this case, a connecting terminal name of the general-purpose IO port is shown by a bit number subsequent to a character string "IO_" in FIG. 7. That is, in the description and drawings, for example, a character string IO_[13:6] denotes signal bits from Bit 6 to Bit 13 of the IO port.

The connection with the connecting terminals of the card sockets 13-2 and 13-3 shown in FIG. 7 will be described using connecting terminal names of input and output of a 16-bit PC card and pin allocation of a memory card specified in the non-patent document 4 in order to define the physical connection.

The buffer 42 is composed of three circuits, and has input terminals to which DRX, CRX, and CTX signals that are control signals from the demodulator 12 in conformity with the open cable system are inputted, and output terminals connected to the output terminals of the buffer 37 and address A [9, 8, 4] terminals of the card socket 13. The on/off control of the buffer 42 is performed by the enable control signal H outputted from the CPU 19. In addition, the supply voltage of 3.3 V is supplied to the buffer 42. Further, the detail of the demodulator in conformity with the open cable system is disclosed in the non-patent document 4.

The buffer 43 is composed of three circuits, and has input terminals connected to A [7, 6, 5] terminals of the card socket 13 and the output terminal of the buffer 37, and output terminals. Then QTX, ETX, and ITX signals that are control signals to the demodulator 12 in conformity with the open cable system are outputted from the output terminals. The on/off control of the buffer 43 is performed by the enable control signal H outputted from the CPU 19. In addition, the supply voltage of 3.3 V is supplied to the buffer 43. Further, when the demodulator 12 does not conform to the open cable system, both the buffer 42 and the buffer 43 are turned off.

The buffer 33 is composed of six circuits, and has input terminals connected to WAIT#, CD1#, CD2#, IREQ#, VS1#, and VS2# terminals that are control signal terminals from the card socket 13, and output terminals connected to IO_[5:0] that are general-purpose IO ports of the CPU 19. Further, a symbol # given at the last of the signal name denotes a low active signal. The on/off control of the buffer 33 is performed by the enable control signal K outputted from the CPU 19. In addition, the supply voltage of 3.3 V is supplied to the buffer 33.

The buffer 34 is made up of one circuit, and has an input terminal connected to a VS2# terminal of the card socket 13, and an output terminal, and an output signal from the output terminal is outputted to the decoder 18 as a TS1_CLK signal that is a clock input signal in the MPEG-2_TS signal. The on/off control of the buffer 34 is performed by the enable control signal D outputted from the CPU 19. In addition, the supply voltage of 3.3 V is supplied to the buffer 34.

The buffer 35 is made up of one circuit, and has an input terminal connected to an A [14] terminal of the card socket 13, and an output terminal, and an output signal from the output terminal is outputted to the decoder 18 as a TS1_CLK signal that is a clock input signal in the MPEG-2_TS signal. The on/off control of the buffer 35 is performed by the enable control signal E outputted from the CPU 19. In addition, the supply voltage of 3.3 V is supplied to the buffer 35.

The buffer 36 is composed of ten circuits, and has input terminals and output terminals, the input terminals of eight circuits of the ten circuits of the buffer 36 are connected to data D [15:8] terminals of the card socket 13, and the output terminals thereof are connected to TS1_DATA [7:10] that are data input signals in the MPEG-2_TS signal in the decoder 18. In addition, the input terminals of two circuits of the ten circuits of the buffer 36 are connected to SPKR# and STSCHG# terminals of the card socket 13. The output signals from the output terminal thereof are outputted to the decoder 18 as a TS1_VALID signal and a TS1_SYNC signal that are an effective signal and a synchronizing signal in the MPEG-2_TS signal. The on/off control of the buffer 36 is performed by the enable control signal K outputted from the CPU 19. In addition, the supply voltage of 3.3 V is supplied to the buffer 36.

The buffer 37 is composed of six circuits, and has input terminals to which A [10:5] signals that are address signals outputted from the CPU 19 are inputted, and the output terminals connected to address A [9:4] terminals of the card socket 13, a 3-bit output terminal of the buffer 42, and a 3-bit input terminal of the buffer 43. The on/off control of the buffer 37 is performed by the enable control signal F outputted from the CPU 19. In Addition, a supply voltage outputted from the supply voltage changing-over switch 31 is supplied to the buffer 37.

The buffer 38 is composed of eight circuits, and has input terminals to which A [14:11] signals and A [4:1] signals that are address signals outputted from the CPU 19 are inputted, and the output terminals connected to address A [13:10] and [3:0] terminals of the card socket 13. The on/off control of the buffer 38 is performed by the enable control signal J outputted from the CPU 19. In addition, the supply voltage outputted from the supply voltage changing-over switch 31 is supplied to the buffer 38.

The buffer 39 is made up of one circuit, and has an input terminal to which A [15] signal that is an address signal outputted from the CPU 19, and the output terminal connected to an address A [14] of the card socket 13 and a 1-bit input terminal of the buffer 35. The on/off control of the buffer 39 is performed by the enable control signal F outputted from the CPU 19. In addition, the supply voltage outputted from the supply voltage changing-over switch 31 is supplied to the buffer 39.

In the connection of the above address signal, the reason why the address signal of the CPU 19 is shifted to the higher order by 1-bit in the address signal of the card socket 13 is because there is provided a system configuration which performs word access in accessing the PC card or the like connected to the card socket 13 from the CPU 19. If the byte access configuration is provided, the address signal is connected without shifting to the higher order.

The buffer 40 is composed of eight circuits, and bidirectional buffers are configured by being connected in parallel. In this case, the buffer 40 includes (a) a buffer 40A which performs buffer processing from the CPU 19 to the card socket 13, and (b) a buffer 40B which performs buffer processing from the card socket 13 to the CPU 19. In addition, a signal direction is controlled by a directional control signal (not shown) from the CPU 19. One input and output terminal of the buffer 40 is connected to data D [7:0] terminals of the card socket 13, and the other input and output terminal of the buffer 40 is connected to data D [7:0] terminals through which the CPU 19 inputs and outputs. The on/off control of the output of the buffer 40 is performed by the enable control signal J outputted from the CPU 19. Further, the supply voltage outputted from the supply voltage changing-over switch 31 is supplied to the buffer 40A, and the supply voltage of 3.3 V from the power supply terminal 31A is supplied to the buffer 40B.

The buffer 41 is composed of eight circuits, and has input terminals to which IO [13:6] signals of general-purpose IO ports of the CPU 19 are inputted, and the output terminals connected to REG#, WE#, OE#, IOWR#, IORD#, CE1#, CE2#, and RESET terminals of the card socket 13. The on/off control of the buffer 41 is performed by the enable control signal J outputted from the CPU 19. In addition, the supply voltage outputted from the supply voltage changing-over switch 31 is supplied to the buffer 41.

In the thus configured CA interface circuit 3, the MPEG-2_TS signal outputted from the demodulator 12 is once inputted to the CA module 14 via the card socket 13, descrambled by the CA module 14, and then, outputted to the decoder 18. The MPEG-2_TS signal such as a clear channel which is not scrambled may be outputted to the decoder 18 without via the CA module 14. In addition, when the MPEG-2_TS signal is descrambled using the IC card without using the CA module 14 in a manner similar to that of the ISDB-T system, the MPEG-2_TS signal may be outputted to decoder 18 without via the CA module 14. As for signal connection capable of selecting a path, VALID, SYNC, and CLK signals that are an effective signal, a synchronizing signal, and a clock signal among the MPEG-2_TS signals outputted from the demodulator 12 are outputted to A [28:18] terminals of the card socket 13, and are also outputted to the decoder 18 as TS0_VALID, TS0_SYNC, and TS0_CLK that are the effective signal, the synchronizing signal, and the clock signal, which are control signals in the MPEG-2_TS signals. In addition, DATA [7:0] signals that are data output signals among the MPEG-2_TS signals outputted from the demodulator 12 are outputted to A [17:15] terminals of the card socket 13, and are also outputted to the decoder 18 as TS0_DATA [7:0] signals that are the data input signals in the MPEG-2_TS signals. In this case, since the CPU 19 can recognize whether or not the MPEG-2_TS signal is the clear channel which is not scrambled, on the basis of program information or the like, the CPU 19 sets the decoder 18 to select any signal system of the TS0 signal system or the TS1 signal system in response to the recognition.

Further, referring to FIG. 7, since IOIS16#, INPACK#, and VPP terminal among the connecting terminals of the card socket 13 are not particularly related to the present invention, their description will be omitted. In addition, the supply voltage outputted from the supply voltage changing-over switch 31 is outputted to the power supply terminal Vcc in the card socket 13. In addition, pull-up resistors are connected between the power supply terminal Vcc and CD1#, CD2#, VS1#, and VS2# terminals in the card socket 13.

Further, the names of the signals connected to the decoder LSI 2 and the signals of VALID, SYNC, CLK, and DATA [7:0] connected to the demodulator 12 are merely shown as examples for the sake of explanation, and are not particularly specified by the standards or the like.

FIG. 9 is a view showing a table of on/off states of the enable control signals D, E, F, H, J, and K supplied from the CPU 19 to the respective buffers 33 to 43 in the system shown in FIG. 1 using the CA interface circuit 3. FIG. 9 shows setting of the respective enable control signals D, E, F, H, J, and K on the type of the demodulation function layer substrate 620 connected to the decoder layer substrate 507, and the type and state of the CA module 14 inserted into the card socket 13. FIG. 13 shows setting of on/off of the buffers 33 to 4 by the enable control signals D, E, F, H, J, and K.

Referring to FIG. 9, when the demodulation function layer substrate for Japan 620-1 using the ISDB-T system is connected to the decoder layer substrate 507, the buffers 34 to 43 to which the enable control signals D, E, F, H, and J other than the enable control signal K are applied, are controlled to be turned off. This is because the control is made such that the CA module 14 in conformity with the ISDB-T system is not inserted into the card sockets 13-2 and 13-3, and the ISDB-T system is inserted into the IC card socket 13-1. This is also because the control is to avoid that the output of the buffer is turned on when the CA module 14 to a different market is inserted into the card socket 13. The CPU 19 can detect whether or not the CA module 14 is inserted by monitoring a signal level of the CD1# terminal or the CD2# terminal via the buffer 33. Since the attribute of the card is written in the memory in the CA module 14, the CPU 19 can recognize whether or not it is the CI card or the cable card after inserting the CA module 14 by reading the attribute via the buffer 40. The circuit module 1 receives the signal showing the attributes of the CA module 14 from the mother-board 201. This can judge the type of the CA module 14 inserted in the CPU 19.

A specific example of control for the CA interface circuit 3 using the mother-board 201 of each system will be described with reference to FIG. 7.

The demodulation function layer substrate for Europe 620-2 using the DVB-T system is connected to the decoder layer substrate 507, the buffers 33 and 34 are turned on, and the buffer 35 is turned off. At this time, the VS2# terminal of the card socket 13 is connected to a TS1_CLK signal terminal of the decoder 18 via the buffer 34, and a clock signal is supplied. In addition, the buffer 37 is turned on, and the buffer 42 is turned off. At this time, CPU_A [10:5] terminals of the CPU 19 are connected to the A [9:4] terminals of the card socket 13 via the buffer 37. In addition, the buffer 39 is turned on. At this time, a CPU_A [15] terminal of the CPU 19 is connected to the A [14] terminal of the card socket 13 via the buffer 39. In addition, since the buffer 40 is turned on, an address signal and a data signal are outputted to the card socket 13 from the CPU 19 of the CPU 19.

In addition, when the demodulation function layer substrate for America 620-3 using the ATSC system and the open cable system is connected to the decoder layer substrate 507, and the cable card is inserted in the card socket 13. In a memory state that is an initial state of the cable card, the buffer 34 and the buffer 35 are turned off, and a TS1_CLK terminal of the decoder 18 is not connected to the card socket 13. In addition, the buffer 37 is turned on, and the buffer 42 is turned off. At this time, the CPU_A [10:5] terminals of the CPU 19 are connected to the A [9:4] terminals of the card socket 13 via the buffer 37. In addition, the buffer 39 is turned on. Then, the CPU_A [15] terminals of the CPU 19 is connected to the A [14] terminal of the card socket 13 via the buffer 39. Further, the buffer 40 is turned on. Accordingly, the address signal and the data signal are outputted to the card socket 13 from the CPU 19 of the CPU 19.

Further, when the cable card is inserted in the card socket 13, in a so-called cable card state in which the cable card is changed into an operational state, the buffer 34 is turned off, and the buffer 35 is turned on. At this time, the A [14] terminal of the card socket 13 is connected to the TS1_CLK terminal of the CPU 19 via the buffer 35, and the clock signal from the card socket 13 is outputted to the decoder 18 as the TS1_CLK. In addition, the buffers 37 and 39 are turned off. At this time, the CPU_A [15] terminal of the CPU 19 is not connected to the A [14] terminal of the card socket 13, and the CPU_A [10:5] terminals of the CPU 19 are not connected to the A [9:4] terminals of the card socket 13. Further, the buffers 42 and 43 are turned on, and DRX, CRX, and CTX signals that are control signals from the demodulator 12 are outputted to the A [9, 8, 4] terminals of the card socket 13 via the buffer 42. In addition, QTX, ETX, and ITX signals that are control signals from A [7:3] terminals of the card socket 13 are outputted to the demodulator 12 via the buffer 43.

Next, power supply control supplied to the respective buffers 33 to 43, and power supply control supplied to the power supply terminal Vcc of the card socket 13, which are executed by the CPU 19, will be described using FIG. 10. FIG. 10 shows a table of the supply voltage supplied to the respective buffers 33 to 43 and the PC card shown in FIG. 7 in the system shown in FIG. 1 using the CA interface circuit 3 shown in FIG. 7. That is, FIG. 10 shows setting of the supply voltage changing-over switch 31 on the type of the demodulation function layer substrate 620 connected to the circuit module 1 and the type and state of the CA module 14 inserted into the card socket 13. Further, FIG. 10 shows the supply voltage outputted from the supply voltage changing-over switch 31.

Referring to FIG. 10, when the demodulation function layer substrate for Japan 620-1 using the ISDB-T system is connected to the decoder layer substrate 507, or when the CA module 14 is not inserted, the supply voltage of 3.3 V is supplied. In addition, when the demodulation function layer substrate for Europe 620-2 using the DVB-T system is connected to the decoder layer substrate 507, the supply voltage of 5 V is supplied. When the demodulation function layer substrate for America 620-3 using the ATSC system and the open cable system is connected to the decoder layer substrate 507, and the cable card is inserted in the card socket 13, and the control is made to supply the supply voltage of 3.3 V.

Figure 11:
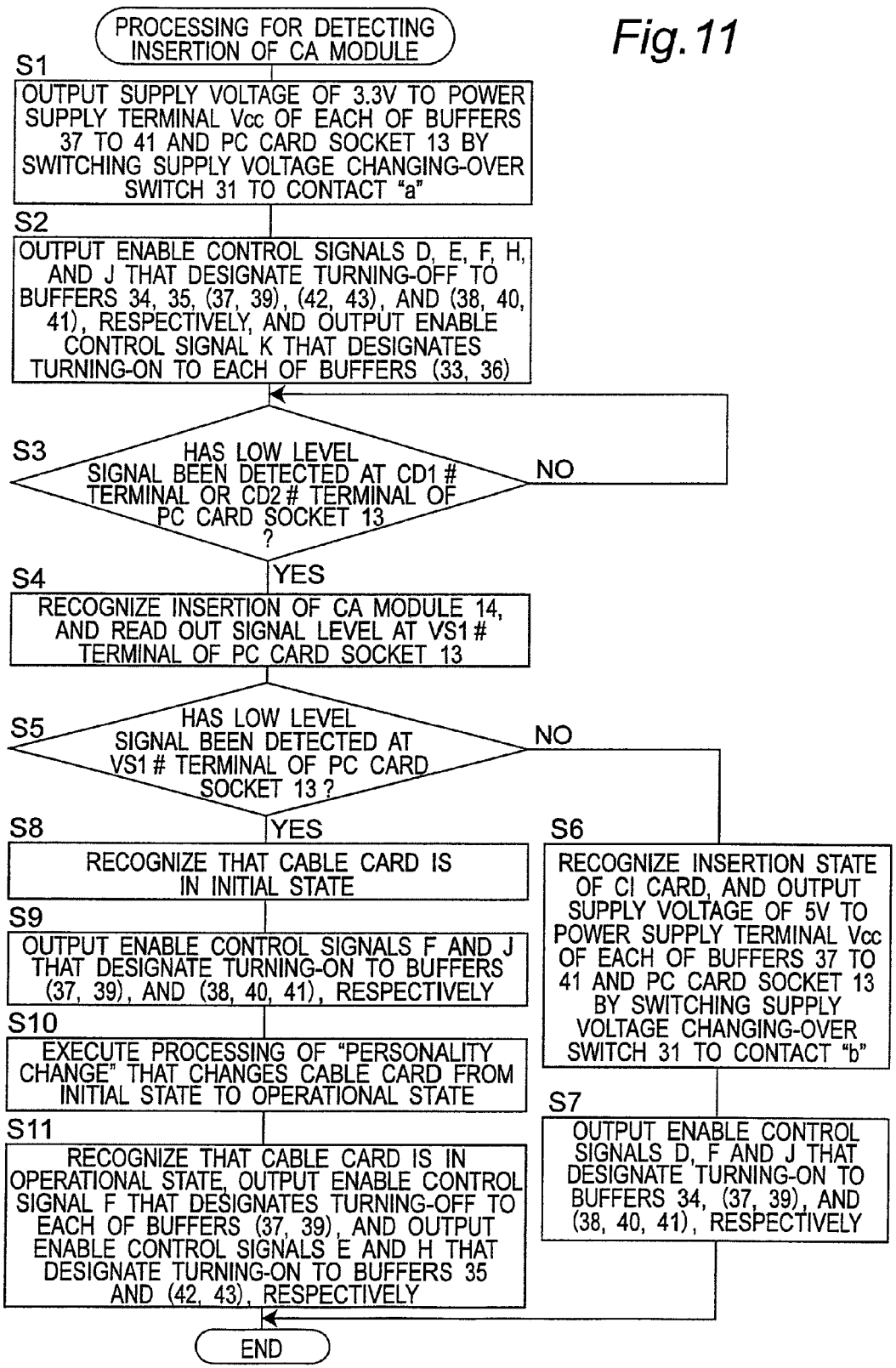
FIG. 11 is a flow chart showing processing for detecting insertion of a CA module executed by the CPU 19 shown in FIG. 7.

FIG. 11 is a flow chart showing processing for detecting insertion of the CA module executed according to the CPU 19 shown in FIG. 6.

Referring to FIG. 11, first of all, in step S1, the supply voltage of 3.3 V is outputted to the power supply terminal Vcc of each of the buffers 37 to 41 and the card sockets 13-2 and 13-3 by switching the supply voltage changing-over switch 31 to the contact "a." After that, in step S2, the enable control signals D, E, F, H, and J that designate turning-off are outputted to the buffers 34, 35, (37, 39), (42, 43), and (38, 40, 41), respectively, and the enable control signal K that designates turning-on is outputted to each of the buffers (33, 36). Then, in step S3, it is judged whether or not a low level signal has been detected at the CD1# terminal or the CD2# terminal of the card socket 13-2 and 13-3, and then, the process in step S3 is repeated till this result becomes YES. When the result is YES, in step S4, the insertion of the CA module 14 is recognized, and signal levels at the VS1# terminal of the card sockets 13-2 and 13-3 are read out. In step S5, it is judged whether or not the low level signal has been detected at the VS1# terminal of the card sockets 13-2 and 13-3. If YES, the process goes to step S8. At the same time, if NO, the process goes to step S6.

In step S6, an insertion state of the CI card is recognized, and the supply voltage of 5 V is outputted to the power supply terminal Vcc of each of the buffers 37 to 41 and the card sockets 13-2 and 13-3 by switching the supply voltage changing-over switch 31 to the contact "b." Further, in step S7, the enable control signals D, F, and J that designate turning-on are outputted to the buffers 34, (37, 39) and (38, 40, 41), respectively, and then, the processing is ended.

In step S8, it is recognized that the cable card is in an initial state: and in step S9, the enable control signals F and J that designate turning-on are outputted to the buffers (37, 39), and (38, 40, 41), respectively. After that, in step S10, processing of "personality change" that changes the cable card from the initial state to an operational state is executed. Then in step S11, it is recognized that the cable card is in the operational state, the enable control signal F that designates turning-off is outputted to each of the buffers (37, 39), the enable control signals E and H that designate turning-on are outputted to the buffers 35 and (42, 43), respectively, and the processing is ended.

By executing the above processing for detecting insertion of the CA module, the types of the CA modules 14 inserted to the card sockets 13-2 and 13-3 can be detected, the appropriate enable control signals D, E, F, H, J, and K can be set, and the supply voltages can be set. Further, specifications of the CD1#, CD2#, and VS1# terminals of the card sockets 13-2 and 13-3 are disclosed in the non-patent document 4.

As described above, according to the system configuration and the buffer control in the CA interface circuit 3 according to the present embodiment, when the CI card or the cable card is inserted or not inserted in the card sockets 13-2 or 13-3, the connection between the decoder LSI 2 and the card socket 13-2 or 13-3, and the supply voltage level in the connection can be suitably set.

The thus configured system configuration and buffer control in the CA interface circuit 3 according to the first embodiment can suitably set electrical specifications between the decoder LSI 2 and the card socket 13, for example, the connection and the voltage level in the connection, when the CI card or the cable card is not inserted in the card socket 13. In addition, even when any demodulation function layer substrate 620 of the demodulation function layer substrate for Japan 620-1 using an ISDB-T system, the demodulation function layer substrate for Europe 620-2 using the DVB-T system, and the demodulation function layer substrate for America 620-3 using the ATSC system and the open cable system is connected to the decoder layer substrate 507, the electrical specifications between the decoder LSI 2 and the card socket 13, for example, the connection and the voltage level in the connection can be suitably set. In addition, in the first embodiment, as for a user's using method of the digital television receiver, control of the CPU 19 can be simplified by limiting the digital television receiver to preliminarily turn off when the CI card or the cable card is inserted into or removed from the card sockets 13-2 and 13-3. Concretely speaking, the setting control of the electrical specifications between the decoder LSI 2 and the card socket 13 when the CI card or the cable card is inserted or not inserted in the card socket 13 is omitted. Then the setting control of the electrical specifications between the decoder LSI 2 and the card socket 13 may be performed by only the type of the demodulation function layer substrate 620. This is possible because the CA module used for each nation and region is specified and determined by the broadcasting system.

Further, control of the decoder 18 by the CPU 19 will be described hereinafter. When the demodulation function layer substrate for Japan 620-1 using the ISDB-T system is connected to the decoder layer substrate 507, conversion to a video signal and an audio signal is performed by executing decoding processing using a decoding method in conformity with the ISDB-T system on the MPEG-2_TS signal inputted from the demodulator 12. In addition, when the demodulation function layer substrate for Europe 620-2 using the DVB-T system is connected to the decoder layer substrate 507, conversion to a video signal and an audio signal is performed by executing decoding processing using a decoding method in conformity with the DVB-T system on the MPEG-2_TS signal inputted from the demodulator 12. Further, when the demodulation function layer substrate for America 620-3 using the ATSC system and the open cable system is connected to the decoder layer substrate 507, conversion to a video signal and an audio signal is performed by executing decoding processing using a decoding method in conformity with the ATSC system on the MPEG-2_TS signal inputted from the demodulator 12.

Figure 17:
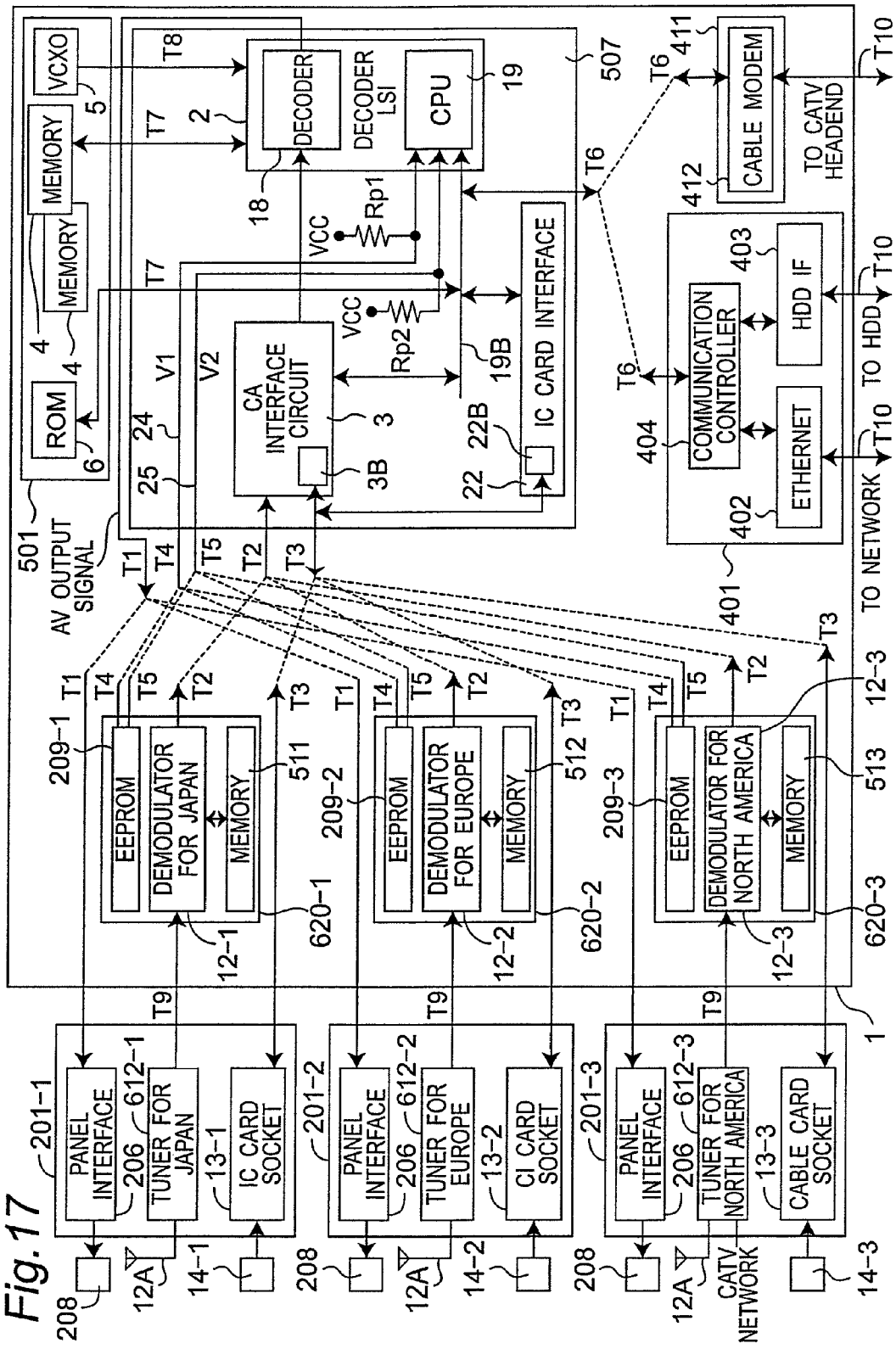
FIG. 17 is a block diagram showing a system configuration including a circuit module 1 and mother-boards for countries 201-1, 201-2, and 201-3 connected to a circuit module 1 according to a modified embodiment of the first embodiment of the present invention.

FIG. 17 is a block diagram showing a system configuration including a circuit module 1 and mother-boards for countries 201-1, 201-2, and 201-3 connected to the circuit module 1 according to a modified embodiment of the first embodiment of the present invention. In a third embodiment, in the demodulation function layer substrates for countries 620-1, 620-2, and 620-3, type-identifying data signals for setting types of the demodulation function layer substrates 620-1, 620-2, and 620-3 are prepared according to whether or not the respective signal lines 24 and 25 of the control voltages V1 and V2 are connected or are not connected (NC) to the grounding conductor (GND). However, the present invention is not limited to this, and as shown in FIG. 17, it may be configured such that EEPROMs 209-1, 209-2, and 209-3 that are nonvolatile memories for storing setting data of control voltages V1 and V2 are mounted in demodulation function layer substrates 620-1, 620-2, and 620-3, a CPU 19 reads type-identifying data from the EEPROM 209-1, 209-2, and 209-3. Accordingly, a type-identifying data signal is generated, and types of the demodulation function layer substrates 620-1, 620-2, and 620-3 are detected. In addition, storing means for storing setting data of the control voltages V1 and V2 is not any EEPROM, and a flash memory, a resister, or the like may be used.

As described above, according to the circuit module 1 of the present embodiment, a decoder layer substrate 507 mounted with a decoder LSI 2 and a CA interface circuit 3, the demodulation function layer substrate 620 mounted with a demodulator 12, and an extension function layer substrate 401 mounted with an extension function LSI. The operation can be guaranteed by physically and electrically connecting a single piece of the circuit module 1 to a tuner 612 and a CA module 14 in the DVB-T system, the ISDB-T system, the ATSC system, and the open cable system, and compressed video signals and audio signals in the DVB-T system, the ISDB-T system, the ATSC system, and the open cable system can be decoded.

In addition, the circuit module 1 can be commercialized in small size and at lightweight to a semiconductor chip size or an LSI package size. In addition, the circuit module 1 can commercialize a television set of each display device by also connecting to mother-boards of a liquid crystal display, a plasma display, a CRT display, and a set-top box. Therefore, the circuit module 1 according to the present embodiment is used, and the mother-board 201 mounted with the tuner 612 of each nation and region, card socket 13-2, 13-3 or an IC card socket 13-1 for the CA module 14 of each market, and an interface 206 for each display device is designed and connected. Accordingly, the manufacturers of the digital television receiver can easily commercialize digital television receivers provided with each display device to each nation, region, and market at low cost, in small size, and at lightweight as compared with the prior art.

Further, the extension function layer substrate 401 can be provided with the network-related function, and also provided with the CATV modem function. Therefore, the circuit module 1 according to the present embodiment is used, and the mother-board 201 mounted with the tuner 612 of each nation and region, the card socket 13-2, 13-3 or the IC card socket 13-1 for the CA module 14 of each market, and the interface 206 for each display device is designed and connected. Accordingly, the manufacturers of the digital television receiver can easily commercialize digital television receivers from low-end to high-end to each region and market at low cost, in small size, and at lightweight as compared with the prior art.

Second Embodiment

Figure 18:
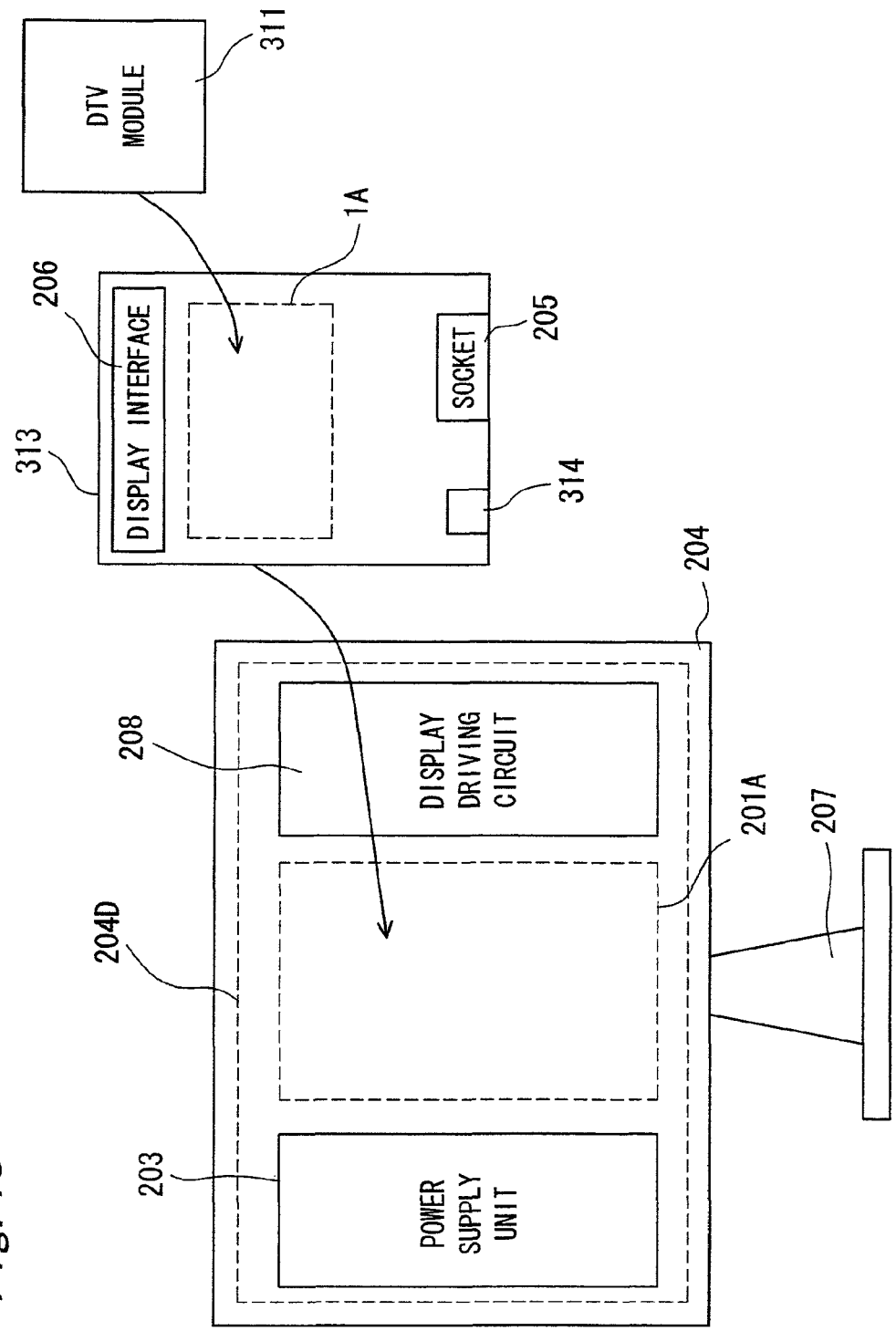
FIG. 18 is a partially exploded mounting view of a television receiver upon mounting a circuit module 311 on a mother-board 313 and upon mounting the mother-board 313 in a receiver housing 204 in a television receiver according to a second embodiment of the present invention.
Figure 19:
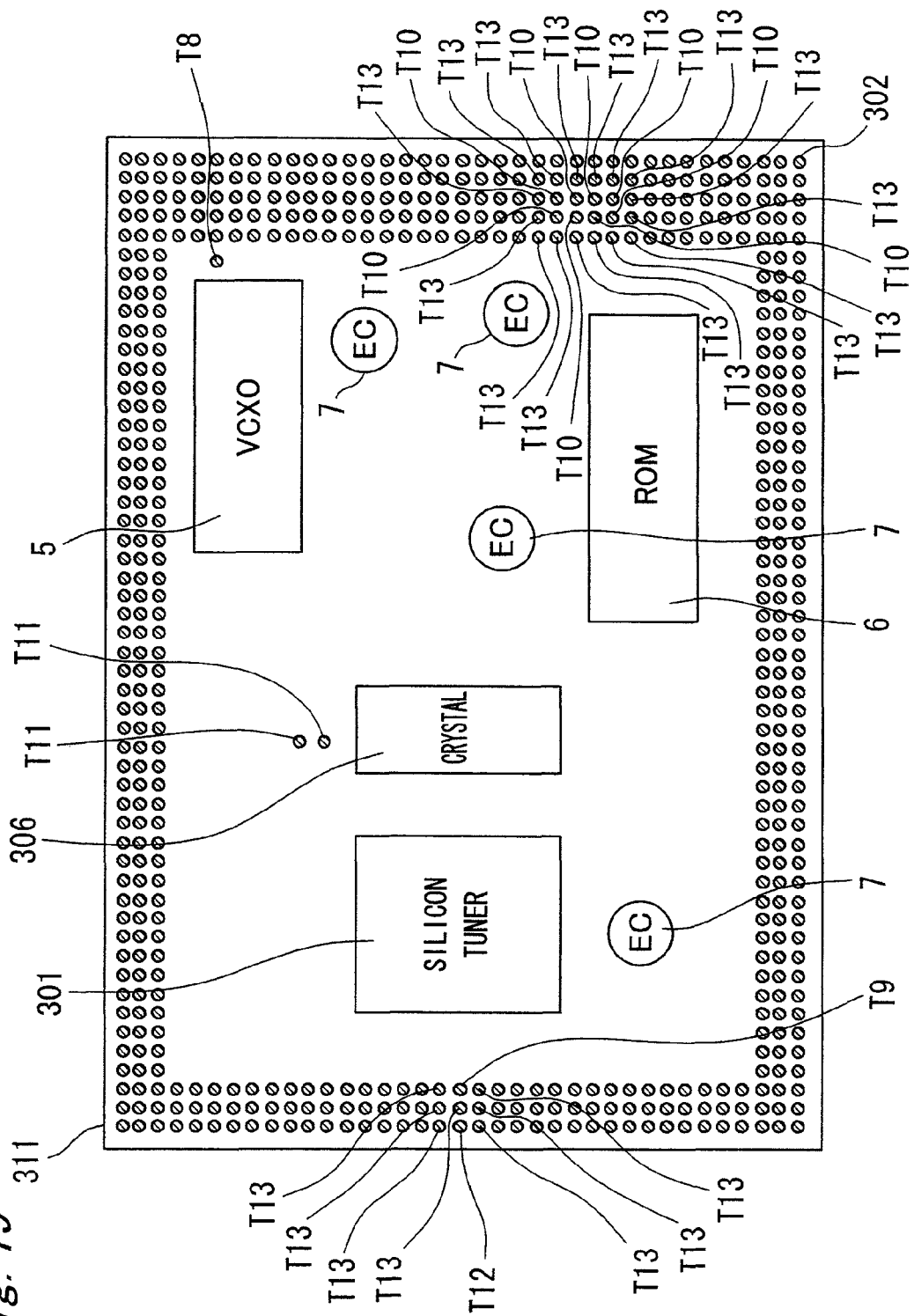
FIG. 19 is a top view of the circuit module 311 shown in FIG. 18.
Figure 20:
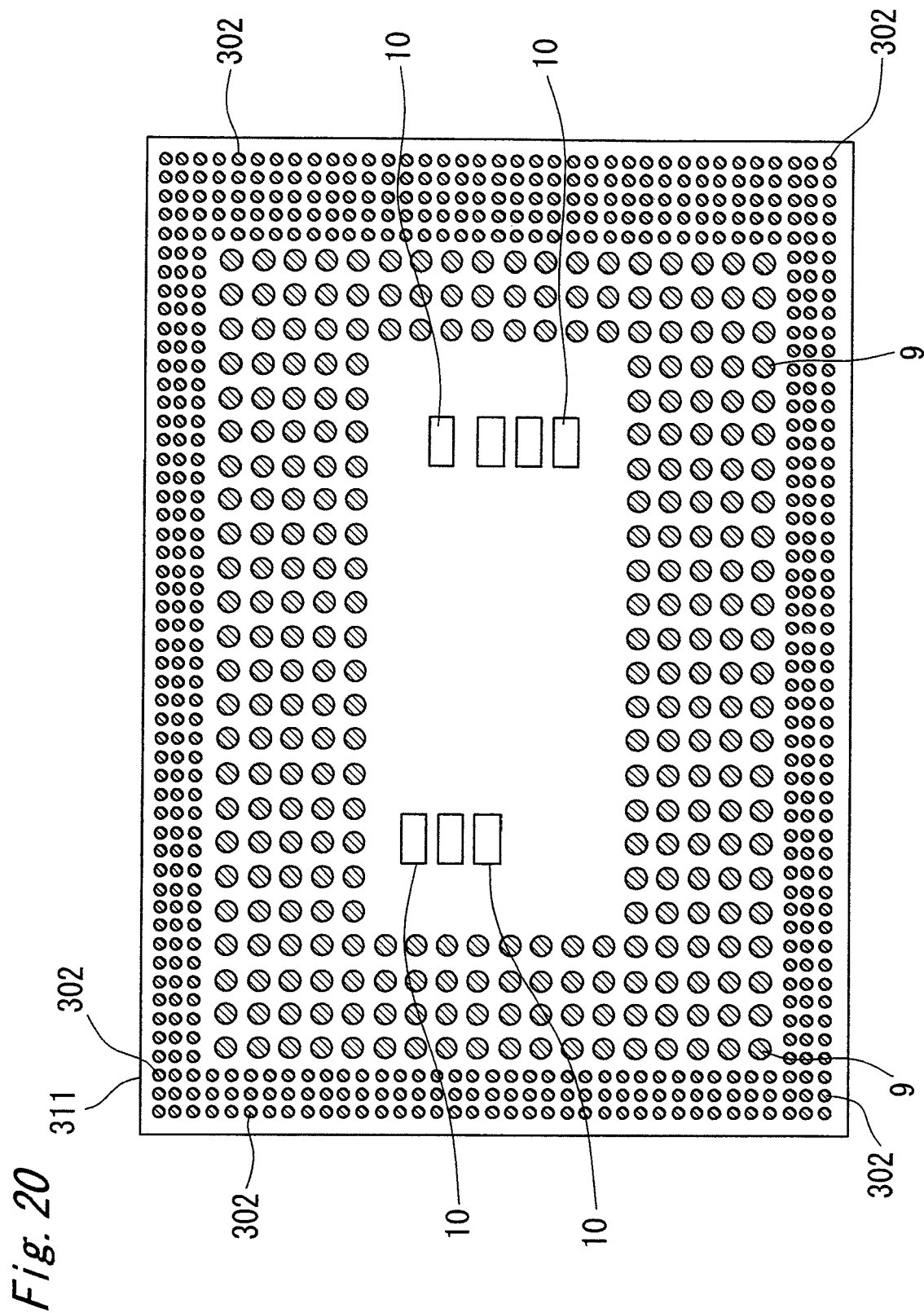
FIG. 20 is a back side view of the circuit module 311 shown in FIG. 18.
Figure 21:
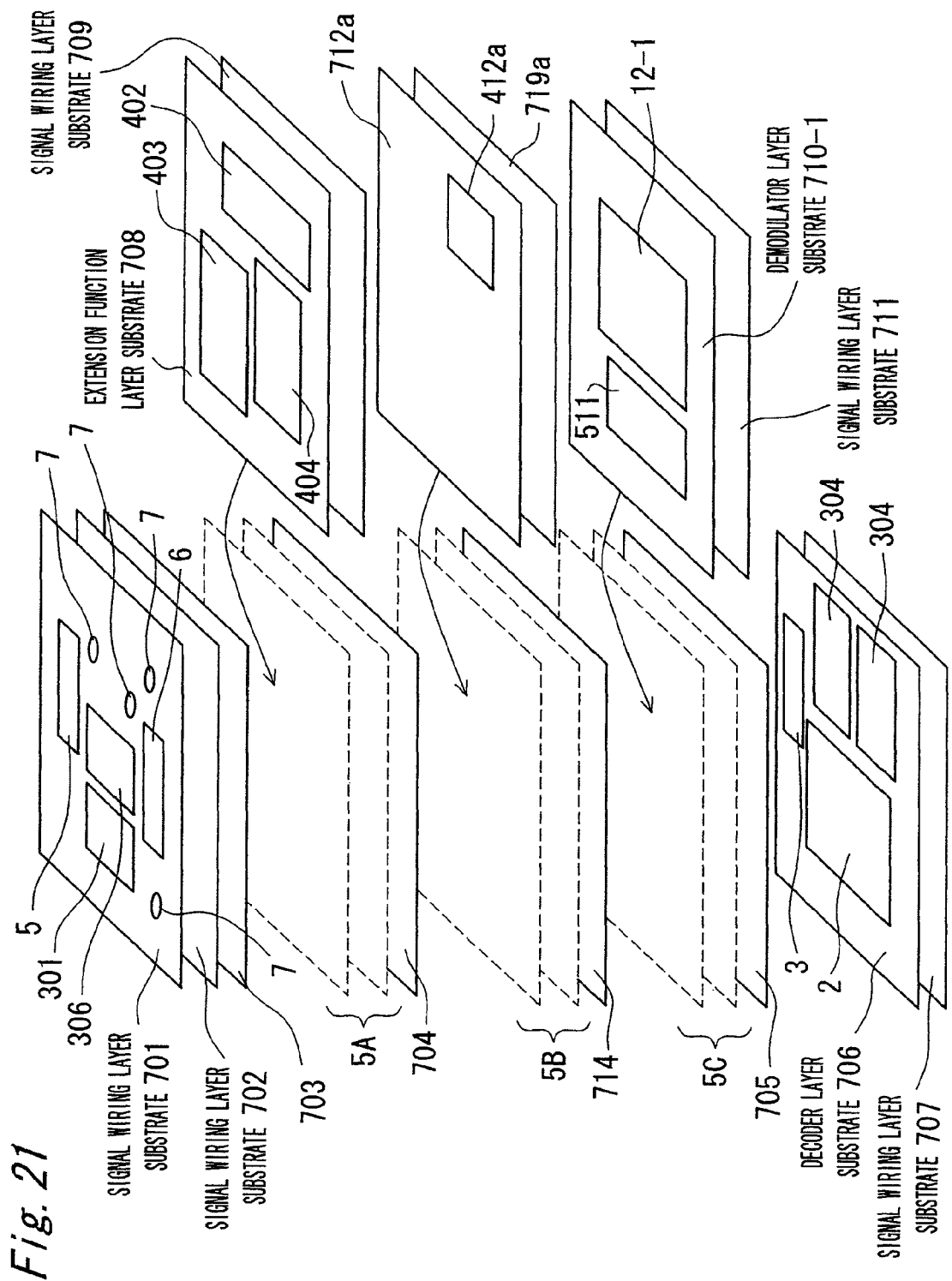
FIG. 21 is an exploded perspective view showing a multi-layer structure of the circuit module 311 shown in FIG. 18.
Figure 22:
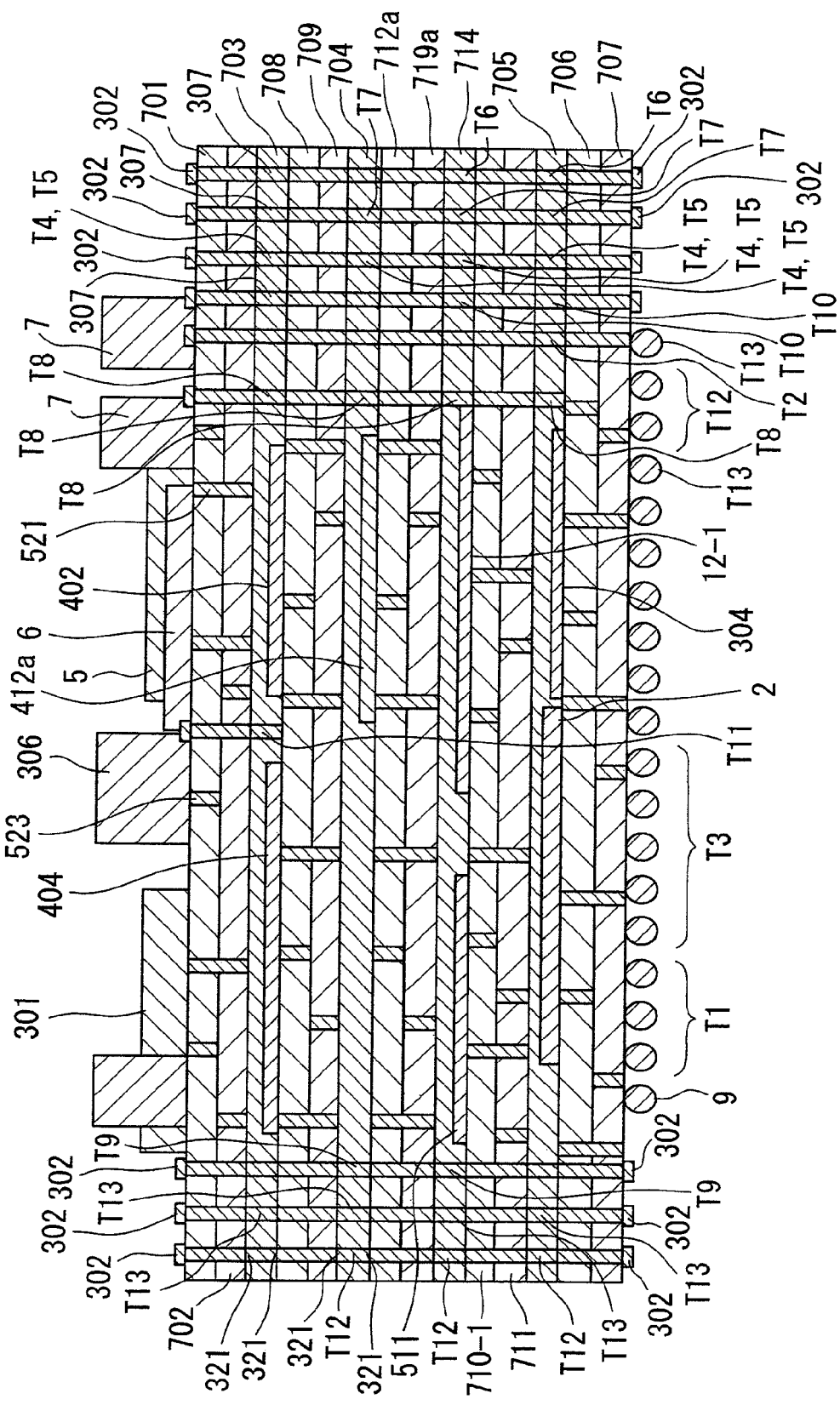
FIG. 22 is a sectional view showing the multi-layer structure of the circuit module 311 shown in FIG. 18.
Figure 23:
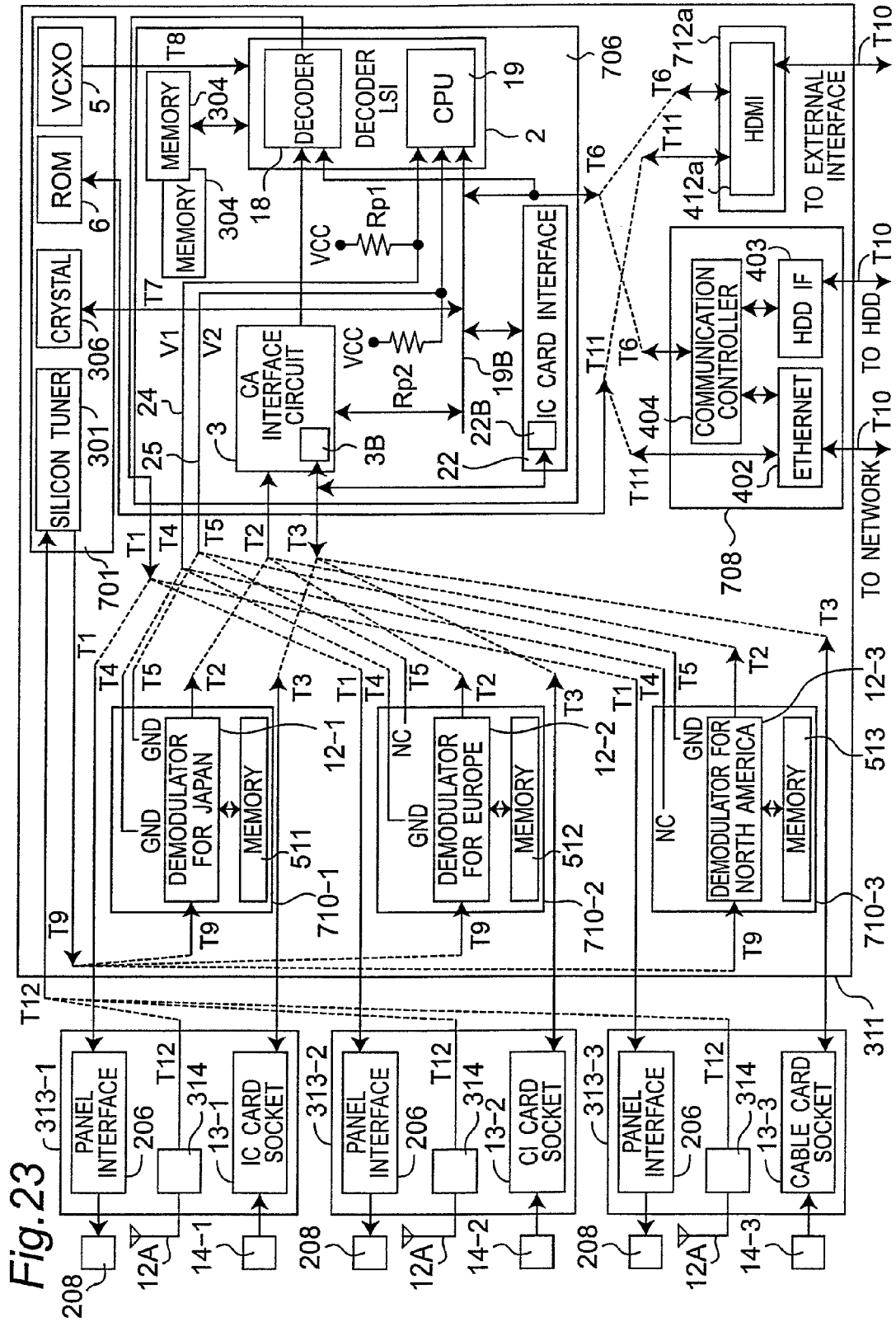
FIG. 23 is a block diagram showing a system configuration including the circuit module 311 and mother-boards for countries 313-1, 313-2, and 313-3 connected to the circuit module 311 according to the second embodiment of the present invention.

FIG. 18 is a partially exploded mounting view of a television receiver upon mounting a circuit module 311 on a mother-board 313 and upon mounting the mother-board 313 in a receiver housing 204 in a television receiver according to a second embodiment of the present invention. In addition, FIG. 19 is a top view of the circuit module 311, and FIG. 20 is a back side view of the circuit module 311. Further, FIG. 21 is an exploded perspective view showing a multi-layer structure of the circuit module 311. FIG. 22 is a sectional view showing the multi-layer structure of the circuit module 311. FIG. 23 is a block diagram showing a system configuration including the circuit module 311 and mother-boards for countries 313-1, 313-2, and 313-3 connected to the circuit module 311 according to the second embodiment of the present invention.

The television set according to the second embodiment will be described hereinafter with reference to FIG. 18 to FIG. 23. In FIG. 18 to FIG. 23, the same reference numerals are given to those similar to components in the first embodiment, and their detail description will be omitted.

Referring to FIG. 18, the circuit module 311 for a television receiver is mounted in the mother-board 313 where a connector 314 for inputting a digital television broadcasting wave signal, a socket 205 for connecting a CA module of each market, and a display interface 206 for outputting a digital audio signal or an analog audio signal and a digital video signal are mounted. In this case, the circuit module 311 is mounted at a position 1A of the mother-board 313 made of a dielectric substrate, and the mother-board 313 is mounted at a position 201A of the receiver housing 204.

The mother-board 313 is prepared for each nation, region, and market, and then, it makes possible to commercialize a television receiver to each nation, region, and market by connecting to the circuit module 311. In addition, the mother-board 313 is prepared for each display device, and accordingly, a television set provided with each display device can be commercialized. Similarly, the television set provided with each display device for each nation, region, and market can be commercialized.

Referring to FIG. 19, the circuit components mounted on the component arrangement surface that is the upper surface of the circuit module 311 include a silicon tuner 301 which inputs a television broadcasting wave signal of each nation and region, and performs frequency conversion to an intermediate frequency signal; the VCXO 5 that is a circuit component for analog signal processing, which generates a clock of the decoder LSI 2, and outputs the same; the ROM 6 which stores data such as a program code for the CPU in the decoder LSI 2; an oscillation crystal 306 for generating a clock of an Ethernet interface 402, and for outputting the same clock, and a plurality of capacitors 7 connected to a power supply (not shown) for each circuit component. Further, the silicon tuner 301 includes a digital signal processor (referred to as a DSP hereinafter) that performs frequency conversion processing or the like in a silicon chip formed on a silicon substrate, and a control program for controlling the DSP is stored in an EEPROM and is executed. Accordingly, receiving processing of a radio analog signal such as a television broadcasting wave signal can be performed. In this case, the silicon tuner 301 which has been recently developed is known as a tuner in which a receiver circuit that has been configured by a hitherto known analog circuit is configured by a silicon chip including an analog to digital conversion circuit and a digital circuit in the semiconductor chip. In the analog circuit, receiving specifications are determined by replacing a coil and a capacitor on the television broadcasting wave signal that is an analog signal. In the digital circuit, the receiving specifications are determined by an arithmetic circuit in the semiconductor chip after performing digital conversion. Therefore, even in a single semiconductor chip, a television broadcasting wave signal of each nation and region can be received.

Referring to FIG. 20, the circuit components mounted on the soldering surface that is the back side of the circuit module 311 include a plurality of capacitors 10 connected between a power supply terminal of the decoder LSI 2 and the grounding conductor, and a plurality of solder balls 9 that are external terminals of the circuit module 311, for connecting signal lines and power supply lines upon mounting the circuit module 311 on the mother-board 313. The upper surface and the back side of the circuit module 311 are mainly mounted with general-purpose circuit components.

A plurality of lands 302 are formed at each substrate end circumference portion on the upper surface and the back side of the circuit module 311 as shown in FIGS. 19 and 20. In this case, each land 302 is made of a conductive metal thin film, and each land 302 has a smaller diameter than a diameter of the solder ball 9 and formed in high density so that an arrangement interval thereof is small. In addition, each land 302 is characterized to be formed on the outer side than the solder ball 9 on the substrate of the circuit module 311. Among the plurality of lands 302, the lands 302 located at the same coordinate on the upper surface and the back side are connected with each other and electrically connected using a through hole 521, a via 523, or a via 307 (to be described later).

Referring to FIG. 21, the circuit module 311 is composed of a plurality of printed circuit board layers 701, 702, 708,

712a, 719a, 710-1, 711, 706, and 707 having a multi-layer structure, inter-substrate layers 703, 704, 714, and 705, and circuit components mounted on those layers. As shown in FIG. 21, the circuit module 311 includes the following:

(a) the signal wiring layer substrate 701 on the upper surface side where the circuit components shown in FIG. 19 are mounted;

(b) the signal wiring layer substrate 702;

(c) the extension function layer substrate 708 for extending the network function, and is mounted with the Ethernet interface 402, the hard disk drive interface 403, and the communication controller 404;

(d) the signal wiring layer substrate 709;

(e) the HDMI (High Definition Multimedia Interface) extension function layer substrate 712a for extending the interface mounted with an HDMI chip 412a having an HDMI function that is an input and output interface function for a digital video signal and an audio signal mainly for home electric appliances and AV equipment;

(f) the signal wiring layer substrate 719a;

(g) the demodulation function layer substrate 710-1 for the demodulation function for Japan mounted with the demodulator for Japan 12-1 and the memory for a demodulator 511;

(h) the signal wiring layer substrate 711;

(i) the decoder layer substrate 706 for the decode function mounted with the CA interface circuit 3 that is the common interface directly connectable to the decoder LSI 2 for performing decode processing corresponding to the compression system in digital television broadcasting of each nation and region, the memory 304 that is a working memory of the decoder LSI 2, and the CA module at each market; and (j) the signal wiring layer substrate 707;

and the circuit module 311 has a multi-layered structure multi-layered in the thickness direction of the respective substrates so that the respective substrates substantially become parallel to each other.

In this case, the Ethernet interface 402, the hard disk drive interface 403, the communication controller 404, the HDMI chip 412a, the demodulator for Japan 12-1, the memory for the demodulator 511, the decoder LSI 2, the memory 304, and the CA interface circuit 3 are mounted on the inside layer, and then, the configuration is of a semiconductor bare chip. Therefore, it is possible to mount on the substrate by wire bonding and flip chip bonding.

As for the extension function layer substrate 708 and signal wiring layer substrate 709, or extension function layer substrate 712a and the signal wiring layer substrate 719a, respective substrate sets concerning a plurality of types of the extension functions are prepared, and then, lamination or multi-layering can be made by selecting one of the substrate sets and by replacing the same. The selected extension function layer substrate 708 and the signal wiring layer substrate 709 are multi-layered at a position 5A of the circuit module 311. In addition, the selected extension function layer substrate 712a and the signal wiring layer substrate 719a are multi-layered at a position 5B of the circuit module 311. Further, a plurality of types of the demodulation function layer substrates 710-1 and the signal wiring layer substrate 711 are prepared for each nation and region, and then, accordingly, lamination or multi-layering can be made by selecting and replacing the same. The selected demodulation function layer substrate 710-1 and the signal wiring layer substrate 711 are multi-layered at a position 5C of the circuit module 311.

The inter-substrate layer 703 is multi-layered between the signal wiring layer substrate 702 and the extension function layer substrate 708, the inter-substrate layer 704 is multi-layered between the signal wiring layer substrate 709 and the extension function layer substrate 712a, the inter-substrate layer 714 is multi-layered between the signal wiring layer substrate 719a and the demodulation function layer substrate 710-1, and the inter-substrate layer 705 is multi-layered between the signal wiring layer substrate 711 and the decoder layer substrate 706. The inter-substrate layers 703, 704, 714, and 705 are substrates for transmitting signals between the upper and lower substrates, and for embedding the circuit components mounted on the upper and lower substrates inside. The material thereof can be served as a substrate for use in an adhesive sheet member and a printed circuit board. The inter-substrate layers 703, 704, 714, and 705 are prepared with through holes for forming vias 307 (to be described later) for transmitting signals between respective substrates, and cutout portions conforming to shapes of the circuit components to be embedded. The via 307 is formed by filling metal material such as conductive gold, copper, silver, or the like in the through hole. The via 307 is formed for electrically connecting between the lands arranged relatively in common in the upper and lower substrates of the inter-substrate layer 703. Therefore, the inter-substrate layer 703 is not required to prepare a wiring pattern on the layer surface, and can be realized with a simple structure and material.

Since the silicon tuner 301 is further mounted, the thus formed configuration can further improve a mounting rate of the circuit components as compared with the first embodiment. Therefore, the digital broadcast receiver can further be reduced in size by using the circuit module 311. In addition, since the HDMI chip 412a is also mounted, the other interface can further be extended in function. Further, any connection between respective substrates through the bump or the ball is not required as compared with the first embodiment. Therefore, any process for forming the bump and any reflow process for connecting the solder ball are not required, and then, the manufacturing process can be simplified. In addition, the via usually used in a printed circuit board can be directly connected between the substrates. Therefore, a printed circuit board with a multi-layer structure incorporated with a bare chip can be realized.

Next, the multi-layered structure of the circuit module 311 will be described using FIG. 22. The signal wiring layer substrates 701 and 702 are glued together by a predetermined adhesive, and general-purpose circuit components such as the VCXO 5, the capacitor 7, and the oscillation crystal 306 are mounted on the signal wiring layer substrate 701. In this case, the circuit components shown in FIG. 19 are mounted. The wiring between the upper surface of the signal wiring layer substrate 701 and the upper surface of the signal wiring layer substrate 702 is connected through the via 523. The wiring between the upper surface of the signal wiring layer substrate 701 and the back side of the signal wiring layer substrate 702 is connected through the through hole 521. Referring to FIG. 22, actually, there are many vias 523 and through holes 521. In this case, the detailed description of each via and through hole is omitted.

The extension function layer substrate 708 and the signal wiring layer substrate 709 are glued together using the predetermined adhesive, and the signal wiring layer substrate 702 and the extension function layer substrate 708 are physically connected with the inter-substrate layer 703 sandwiched therebetween. If the inter-substrate layer 703 is an adhesive sheet member, the signal wiring layer substrate 702 and the extension function layer substrate 708 are glued together by pressing using the predetermined adhesive. If the inter-substrate layer 703 is used for a printed circuit board, the signal wiring layer substrate 702 and the extension function layer substrate 708 are glued together using the predetermined adhesive in a manner similar to that of the extension function layer substrate 708 and the signal wiring layer substrate 709. The signal wiring layer substrate 702 and the extension function layer substrate 708 are electrically connected through a plurality of vias 307 formed in the inter-substrate layer 703. The via 307 is connected to a land 321 made of a conductive thin film provided on the upper surface and the back side of the respective substrates. Actually, the thickness of the land 321 is thin, for example, several μm to several ten μm.

Referring to FIG. 22, only nine vias 307 are shown between the signal wiring layer substrate 702 and the extension function layer substrate 708. Then there are actually many vias in response to the land 302. The detailed description of each via 307 will be omitted. In this case, the substrates 701 and 708 are printed circuit boards having a thickness of several hundred μm, and the inter-substrate layer 703 has a thickness from several ten μm to several hundred μm. Therefore, a circuit component such as a bare chip mounted on the inside layer is required to be mounted by making thinner than the thickness of the inter-substrate layer.

The signal wiring layer substrates 701 and 702 are glued together using the predetermined adhesive, and the signal wiring layer substrate 702 and the extension function layer substrate 708 are physically connected with the inter-substrate layer 703 sandwiched therebetween. In this case, the signal wiring layer substrate 702 and the extension function layer substrate 708 are electrically connected through the plurality of vias 307 formed in the inter-substrate layer 703. The extension function layer substrate 708 and the signal wiring layer substrate 709 are glued together using the predetermined adhesive, and the signal wiring layer substrate 709 and the extension function layer substrate 712a are physically connected with the inter-substrate layer 704 sandwiched therebetween. In this case, the signal wiring layer substrate 709 and the extension function layer substrate 712a are electrically connected through the plurality of vias 307 formed in the inter-substrate layer 704. The extension function layer substrate 712a and the signal wiring layer substrate 719a are glued together using the predetermined adhesive, and the signal wiring layer substrate 719a and the demodulation function layer substrate 710-1 are physically connected with the inter-substrate layer 714 sandwiched therebetween. In this case, the signal wiring layer substrate 719a and the demodulation function layer substrate 710-1 are electrically connected through the plurality of vias 307 formed in the inter-substrate layer 714. The decoder layer substrate 706 and the signal wiring layer substrate 707 are glued together using the predetermined adhesive, and the signal wiring layer substrate 711 and the decoder layer substrate 706 are physically connected with the inter-substrate layer 705 sandwiched therebetween. In this case, the signal wiring layer substrate 711 and the decoder layer substrate 706 are electrically connected through the plurality of vias 307 formed in the inter-substrate layer 705. A plurality of solder balls 9 are mounted on the back side of the wiring layer substrate 707.

The physical arrangements and transmitting electrical signal types of the land 321 and the via 307 between the signal wiring layer substrate 702 and the extension function layer substrate 708, the physical arrangements and transmitting electrical signal types of the land 321 and the via 307 between the signal wiring layer substrate 709 and the extension function layer substrate 712a, and the physical arrangements and transmitting electrical signal types of the via 307 between the signal wiring layer substrate 719a and the demodulation function layer substrate 710-1 are determined by relatively in common and preliminarily defining respective types of the extension function layer substrates 708 and 712a, and the signal wiring layer substrates 709 and 719a. The physical arrangements and transmitting electrical signal types of the land 321 and the via 307 between the signal wiring layer substrate 711 and the decoder layer substrate 706 are determined by relatively in common and preliminarily defining respective types of the demodulation function layer substrate 710-1 and the signal wiring layer substrate 711.

The connecting terminals T6 to T10 according to the first embodiment are made of the bump or the solder ball. In the second embodiment, connecting terminals T11 to T13 are made of the land 321 or the via 307. As shown in FIG. 22, in addition to the connecting terminals T6 to T10 of the first embodiment, the connecting terminals T11 to T13 are arranged as follows:

(a) the connecting terminal T11 made of the land or the via connectable to the oscillation crystal 306, and the Ethernet interface 402 or the HDMI chip 412a is arranged by being formed between respective substrates from the signal wiring layer substrate 701, and from the extension function layer substrate 708 to the extension function layer substrate 712a in order to transmit a clock signal for the Ethernet interface 402 or the HDMI chip 412a;

(b) the connecting terminals T12 made of the land, the via, or the solder ball 9 connectable to the silicon tuner 301 and the connector 314 mounted on the main substrate 313 are arranged by being formed between respective substrates from the signal wiring layer substrate 701 to the main substrate 313 in order to transmit a television broadcasting wave signal that is an analog signal;

(c) the connecting terminals T13 made of the land or the via are connected to the grounding conductor, and are arranged by being formed between respective substrates from the signal wiring layer substrate 701 to the main substrate 313; and (d) the connecting terminals T8 and T11 made of the bump are arranged on the inner side than the other connecting terminals (or bumps). Therefore, regarding the connecting clock signals especially required for electrical characteristics, the wiring distances between the circuit components can be particularly shortened. The transmission delay time of the clock signal is shortened, and signal transmission performance can be improved.

In this case, the circuit module 311 is provided with the lands 302 on the upper surface or the back side of the substrate thereof, and T1 to T12 that are the connecting terminals among incorporated substrates can be electrically connected to the lands 302 on the upper surface or the back side using the via 307, the via 523, or the through hole 521. In addition, electrical connection can be made from the lands 302 on the upper surface to the lands 302 on the back side including the connecting terminals among the incorporated substrates.

In addition, for example, as shown in the left center portion in FIG. 19, the connecting terminals T13 are arranged by being formed so as to surround the connecting terminal T12. Therefore, the television broadcasting wave signal that is an analog signal which transmits the connecting terminal T12 can be electrically separated from the MPEG-TS signal of a digital signal, and then, the electrical interference of the digital signal against the analog signal can be suppressed. Further, for example, as shown in the right center portion in FIG. 19, sixteen connecting terminals T13 are arranged by being formed so as to surround eight connecting terminals T10. Therefore, signal of content data which transmit the connecting terminals T10 can be transmitted in a substantially coaxial cable system including the connecting terminals T13 made of the grounding conductor. This can suppress interference from the other signal and noise to the transmission of the content data.

Therefore, a group of the lands and the vias, which have been served as only interlayer connection in the circuit module related to the prior art, can be dealt with as connector terminals of the interface for replacing the layers. As a result, selection of the extending function can be selected by replacing the layers. Therefore, as for substrate sets of the extension function layer substrate 708 or 712*a* and the signal wiring layer substrate 709 or 719*a*, the substrate sets related to a plurality of types of the extension functions are prepared respectively, and then, lamination or multi-layering can be made by selecting one substrate set and replacing the same. In addition, as for substrate sets of the demodulation function layer substrate 710-1 and the signal wiring layer substrate 711, the substrate sets of a plurality of types of the demodulators are prepared respectively, and then, lamination or multi-layering can be made by selecting and replacing the same.

Further, the oscillation crystal 306 having a height of several mm is mounted on the signal wiring layer substrate 701, and is connected to the extension function layer wiring substrate 708 using T11 without mounting on the extension function layer wiring substrate 708, and without embedding into the inter-substrate layer 703, and then, the thickness of the inter-substrate layer 703 can be thin. In addition, the signal wiring layer substrate 701 and the signal wiring layer substrate 702 are standardized for each nation and region, and a plurality of types of the demodulation function layer substrates 710-1 and the signal wiring layer substrate 711 are prepared for each nation and region, and then, lamination or multi-layering can be made by the replacing the same. In addition, a pitch of a usual connector for use in the connection between respective substrates is several mm. On the other hand, a pitch of the via is approximately several ten μm to several hundred μm. Therefore, the via is used as a connector terminal. Accordingly, reduction in size can be remarkably achieved as compared with the case where the usual connector for use in the connection between the substrates is used. In addition, each of the decoder layer substrate 706 and the signal wiring layer substrate 707, the extension function layer substrate 708 and 712*a* and the signal wiring layer substrate 709 and 719*a*, and the demodulation function layer substrate 710-1 and the signal wiring layer substrate 711 serves as a single substrate, respectively. Therefore, the operation can be also confirmed by each single piece.

In addition, as shown in FIG. 22, the decoder LSI 2 and the working memory 304 are closely arranged on the same substrate. Therefore, the wiring between the decoder LSI 2 and the working memory 304 is shortened. When each of the decoder LSI 2 and the working memory 304 is a bare chip, the wiring between the chips can be more shortened. Therefore, since an inductor component and a stray capacitance component in the wiring can be suppressed, and electrical characteristics are improved. The transmission delay time of the electrical signal between the decoder LSI 2 and the working memory 304 is shortened, and signal transmission performance can be improved. Further, the false operation due to waveform distortion generated by an electrical signal reflection or the like, the interference on the tuner due to radiation noise, and the like can be suppressed.

In addition, the demodulator 12-1 is arranged at roughly the center of the demodulation function layer substrate 710-1. The wiring between the decoder LSI 2 and the demodulator 12-1 has the length substantially equal to the thickness of two substrates and one inter-substrate layer, and then, the wiring length can be remarkably shortened. Therefore, since an inductor component and a stray capacitance component in the wiring can be suppressed, and electrical characteristics of the wiring are improved. The transmission delay time of the electrical signal between the decoder LSI 2 and the demodulator 12-1 is shortened, and signal transmission performance can be improved. Further, the false operation due to waveform distortion generated by an electrical signal reflection or the like, the interference on the silicon tuner 301 due to radiation noise, and the like can be suppressed.

In addition, the communication controller 404 is arranged at roughly the center of the extension function layer substrate 708. The wiring between the decoder LSI 2 and the communication controller 404 has the length substantially equal to the thickness of six substrates and three inter-substrate layers, and then, the wiring length can be remarkably shortened. Therefore, since an inductor component and a stray capacitance component in the wiring can be suppressed, and electrical characteristics of the wiring are improved. The transmission delay time of the electrical signal between the decoder LSI 2 and the communication controller 404 is shortened, and signal transmission performance can be improved. Further, the false operation due to waveform distortion generated by an electrical signal reflection or the like, the interference on the silicon tuner 301 due to radiation noise, and the like can be suppressed. Further, the HDMI chip 412*a* is arranged at roughly the center of the HDMI extension function layer substrate 712*a*. The wiring between the decoder LSI 2 and the HDMI chip 412*a* has the length substantially equal to the thickness of four substrates and two inter-substrate layers, and then, the wiring length can be remarkably shortened. Therefore, since an inductor component and a stray capacitance component in the wiring can be suppressed, and electrical characteristics of the wiring are improved. The transmission delay time of the electrical signal between the decoder LSI 2 and the HDMI chip 412*a* is shortened, and signal transmission performance can be improved. Further, the false operation due to waveform distortion generated by an electrical signal reflection or the like, the interference on the silicon tuner 301 due to radiation noise, and the like can be suppressed.

FIG. 23 is a block diagram showing a system configuration including the circuit module 311 and the mother-board 313 shown in FIG. 18. The system configuration shown in FIG. 23, mainly different points from the first embodiment will be described hereinafter.

Referring to FIG. 23, the mother-boards 313-1, 313-2, and 313-3 (collectively given reference numeral 313 hereinafter) are composed of the connectors 314 connected to antennas 12A, card sockets 13-1, 13-2, and 13-3 (collectively given reference numeral 13 hereinafter) into which CA modules 14 are inserted, and the display interfaces 206.

In addition, the circuit module 311 includes the decoder layer substrate 706 mounted with the decoder LSI 2 provided with the decoder 18 and the CPU 19, a plurality of memories 304, the CA interface circuit 3, and an IC card interface 22; the wiring layer substrate 701 mounted with the silicon tuner 301, the VCXO 5, the ROM 6, and the oscillation crystal 306; demodulation function layer substrates 710-1, 710-2, and 710-3 (collectively given reference numeral 710 hereinafter) mounted with demodulators 12-1, 12-2, and 12-3 (collectively given reference numeral 12 hereinafter); the network extension function layer substrate 708; and the HDMI extension function layer substrate 712*a*.

In this case, the VCXO 5 and the memory 304 are connected to the decoder LSI 2, and the oscillation crystal 306 is connected to the Ethernet interface 402 or the HDMI chip 412*a* via the connecting terminal T11. In addition, the CPU 19, the CA interface circuit 3, the ROM 6, and the IC card interface 22 are connected via a bus 19B. In addition, the HDMI chip 412a or the communication controller 404, and the decoder 18 are connected via the bus 19B. That is, a digital video signal and an audio signal that are the content data from the HDMI chip 412a or the communication controller 404 can be inputted to the decoder 18. Further, description of the substrate configuration of the circuit module 311 shown in FIG. 23 is the same as that of the substrate configuration shown in FIGS. 21 and 22. In this case, some of the substrates are not shown in the drawing.

The silicon tuner 301 of the wiring layer substrate 701 receives a digital television broadcasting wave from the antenna 12A via the connector 314, frequency converts to a predetermined intermediate frequency signal, and outputs the same to the demodulator 12 in the demodulation function layer substrate 710. The demodulator 12 demodulates the above frequency-converted intermediate frequency signal into the MPEG-2_TS signal using the connected memory 511, and outputs the same signal to the CA interface circuit 3.

In addition, FIG. 23 shows the circuit module 311, three types of the mother-boards 313-1, 313-2, and 313-3 to each nation and region, and to each display device connected to the circuit module 311, the network extension function layer substrate 708, and the HDMI extension function layer substrate 712a. In addition, the circuit module 311 is composed of the signal line wiring substrate 701 multi-layered on the decoder layer substrate 706, any one of three types of the demodulation function layer substrates 710-1, 710-2, and 710-3, the network extension function layer substrate 708, and the HDMI extension function layer substrate 712a (further, in the present embodiment, at least one sheet of two sheets of the extension function layer substrates 708 and 712a can be mounted). Further, the circuit module 311 is characterized in that the circuit module 311 can be connected to any one of the three types of the mother-boards 313-1, 313-2, and 313-3. In addition, the decoder layer substrate 706 is characterized in that the decoder layer substrate 706 can be multi-layered to any one of the three types of the demodulation function layer substrates 710-1, 710-2, and 710-3. In addition, the decoder layer substrate 706 is characterized in that the decoder layer substrate 706 can be multi-layered to any one, or both, of the two types of the network extension function layer substrate 708 and the HDMI extension function layer substrate 712a.

According to the thus configured circuit module 311, the operation can be guaranteed by physically and electrically connecting a single piece of the circuit module 311 to the digital television broadcasting wave signals and the CA modules in the DVB-T system, the ISDB-T system, the ATSC system, and the open cable system, and compressed video signals and audio signals in the DVB-T system, the ISDB-T system, the ATSC system, and the open cable system can be decoded. In addition, the circuit module 311 can be commercialized in small size and at lightweight to a semiconductor chip size or an LSI package size. In addition, the circuit module 311 is also connected to a mother-board of a liquid crystal display, a plasma display, a CRT display, and a set-top box, and then, the circuit module 311 can select the optimum extension function for each display device and multi-layer or laminate the same. That is, the network function can be extended by laminating the network extension function layer substrate 708 for the liquid crystal display, and the interface function can be extended by laminating the HDMI extension function layer substrate 712a for the plasma display. Further, an image quality improvement function can be considered as other extension function.

Figure 36:
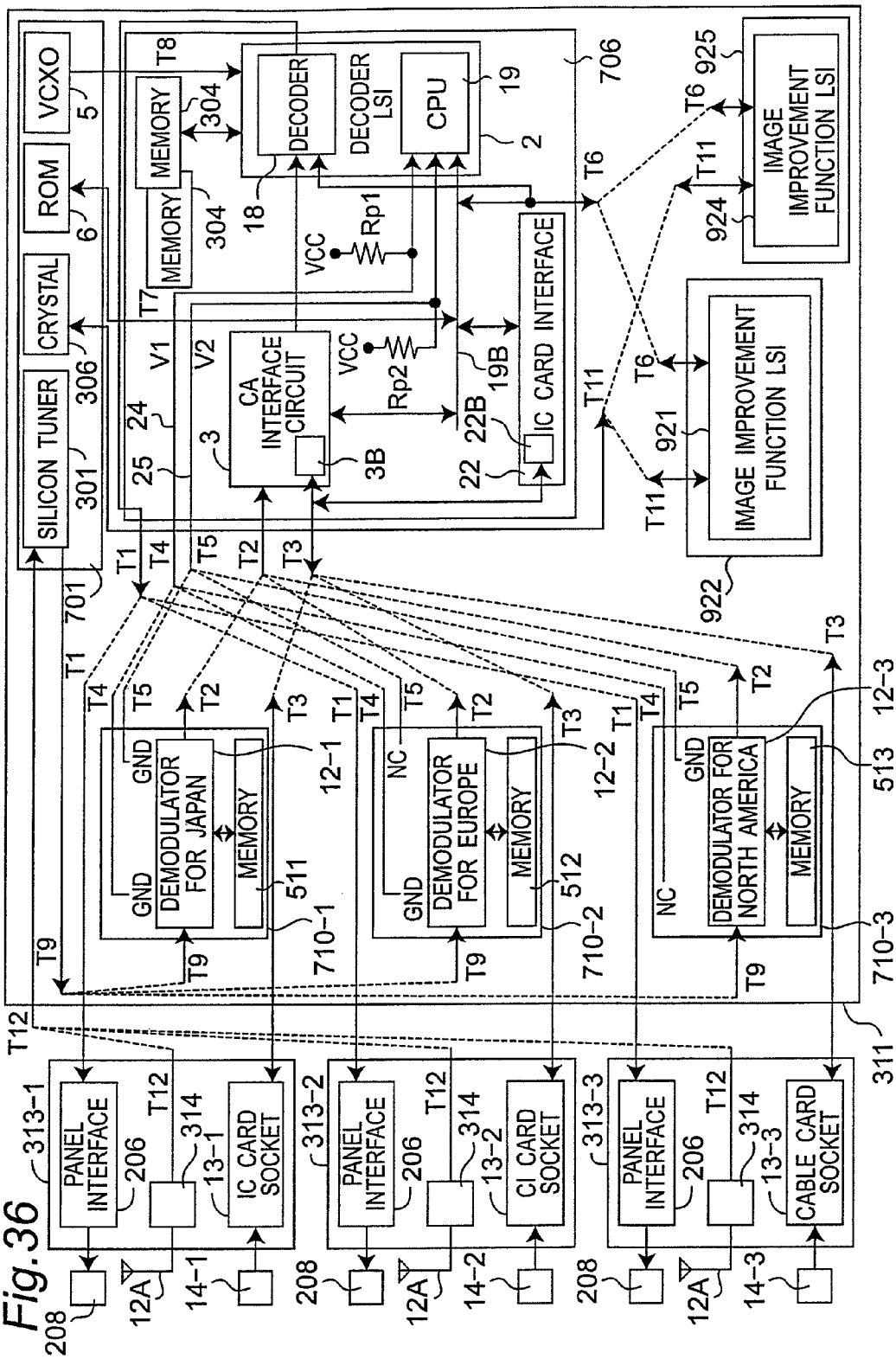
FIG. 36 is a block diagram of the circuit module shown in FIG. 23, provided with an image quality improvement function layer substrate according to a modified embodiment of the present invention.

FIG. 36 is a block diagram of the circuit module shown in FIG. 23, provided with an image quality improvement function layer substrate according to a modified embodiment of the circuit module 311 of the present invention. There are many cases in which a required image quality improvement function is generally different in response to characteristics of the display device. For example, a function for correcting movement of images is required in the case of the liquid crystal display. Then in the case of the plasma display, a function for extending image gradation characteristic is required. The circuit module 311 according to the present modified embodiment is characterized in that, in place of the network extension function layer substrate 708 and the HDMI extension function layer substrate 712a, an extension function layer substrate 922 which mounts an image quality improvement function LSI 921 for correcting movement of images on the liquid crystal display, an extension function layer substrate 925 which mounts a wiring layer substrate 923 and an image quality improvement function LSI 924 for extending image gradation characteristic, and a wiring layer substrate 926 are respectively prepared. A substrate set is replaced and multi-layered for the liquid crystal display or the plasma display, and then, the function is extended.

Referring to FIG. 36, the image quality improvement function LSI 921 incorporates a memory, an image signal is inputted from the decoder 18, the difference between frames is calculated, and an image movement component is detected. Further, in response to the detected result, the image quality improvement function LSI 921 generates a new frame from the previous and subsequent frames, and performs processing which outputs an image signal in which the new frame is inserted between the frames to the decoder 18. In addition, the image quality improvement function LSI 924 incorporates a memory, an image signal is inputted from the decoder 18, and a histogram in the frame is made. Further, in response to the detected result, the image quality improvement function LSI 924 extends a gradation component with high distribution density, and performs processing which outputs the resultant image signal to the decoder 18. In this case, the image quality improvement function LSI 921 and the image quality improvement function LSI 924 may be a configuration of a bare chip. That is, the extension function layer substrate 922 which mounts the image quality improvement function LSI 921 can be multi-layered for the liquid crystal display, and the extension function layer substrate 925 which mounts the image quality improvement function LSI 924 for extending image gradation characteristic can be multi-layered for the plasma display. In such cases, a digital image signal inputted and outputted between the image quality improvement function LSI 921 or the image quality improvement function LSI 924, and the decoder 18 is transmitted using the connecting terminal T6. Therefore, the circuit module 311 according to the present modified embodiment is used, and the mother-board 313 mounted with the interface 206 of each display device is designed and connected, and then, the manufacturers of the digital television receiver can easily commercialize digital television receivers provided with the optimum image quality improvement function for each display device at low cost, in small size, and at lightweight as compared with the prior art.

Therefore, the circuit module 311 according to the present embodiment is used, and the mother-board 313 mounted with the connector 314 for connecting the television broadcasting wave signal, the card socket 13-2, 13-3 or the IC card socket 13-1 for the CA module 14 of each market, and the interface 206 for each display device is designed, and then, the manufacturers of the digital television receiver can easily commercialize digital television receivers provided with each display device to each nation, region and market at low cost, in small size, and at lightweight as compared with the prior art.

Third Embodiment

Figure 24:
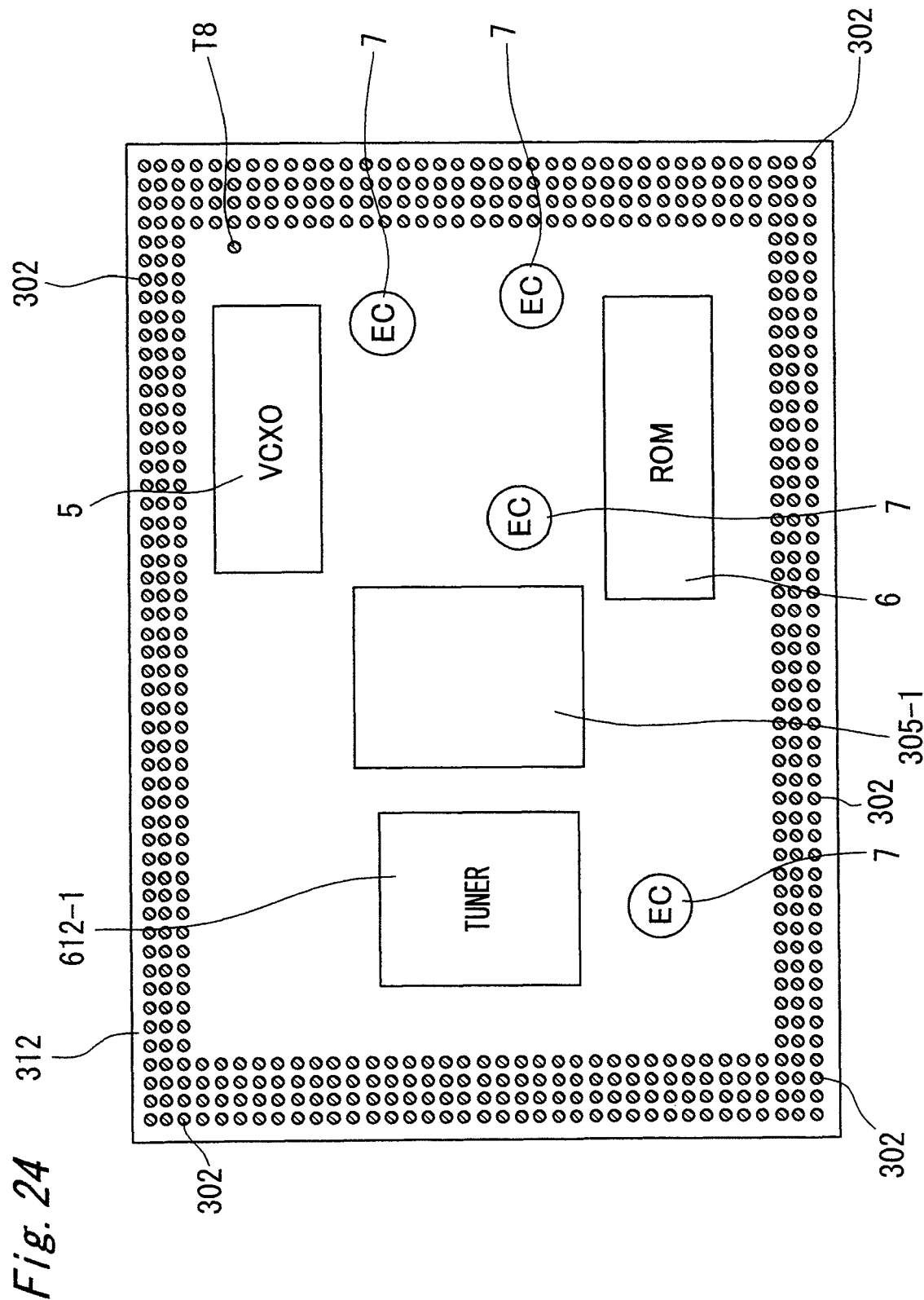
FIG. 24 is a top view of a circuit module 312 for use in a television set according to a third embodiment of the present invention.
Figure 25:
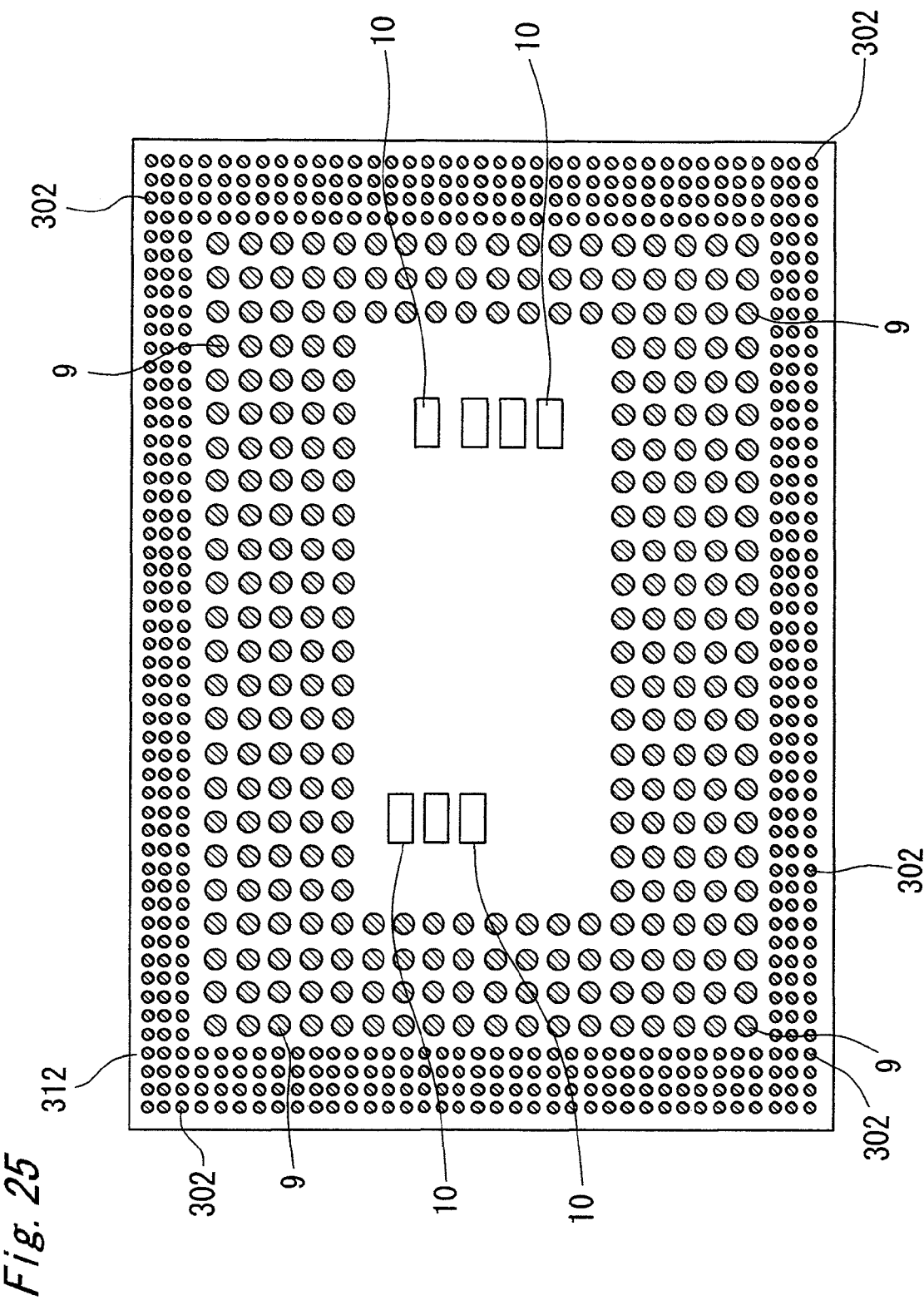
FIG. 25 is a back side view of the circuit module 312 shown in FIG. 24.
Figure 26:
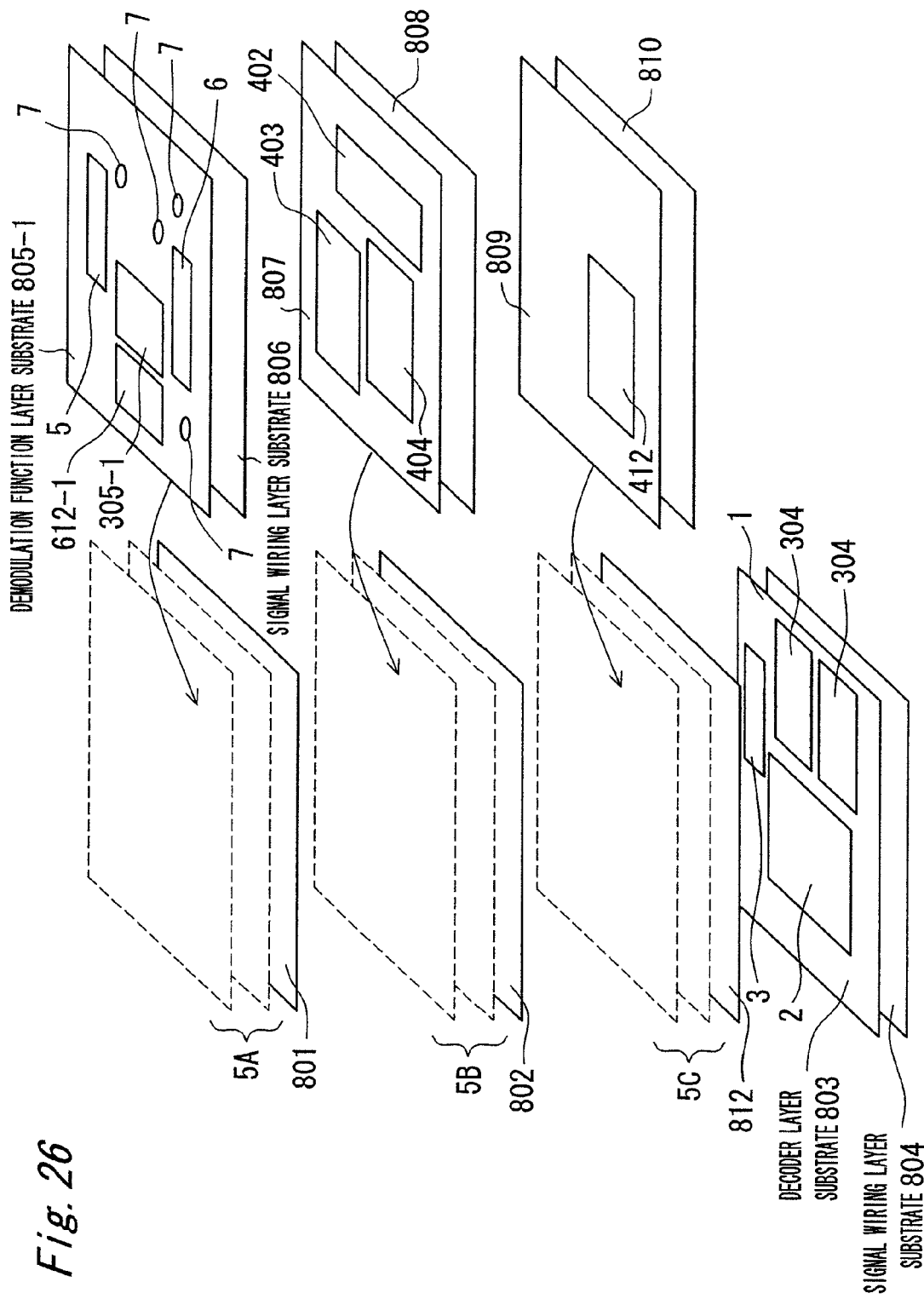
FIG. 26 is an exploded perspective view showing a multi-layer structure of the circuit module 312 shown in FIG. 24.
Figure 27:
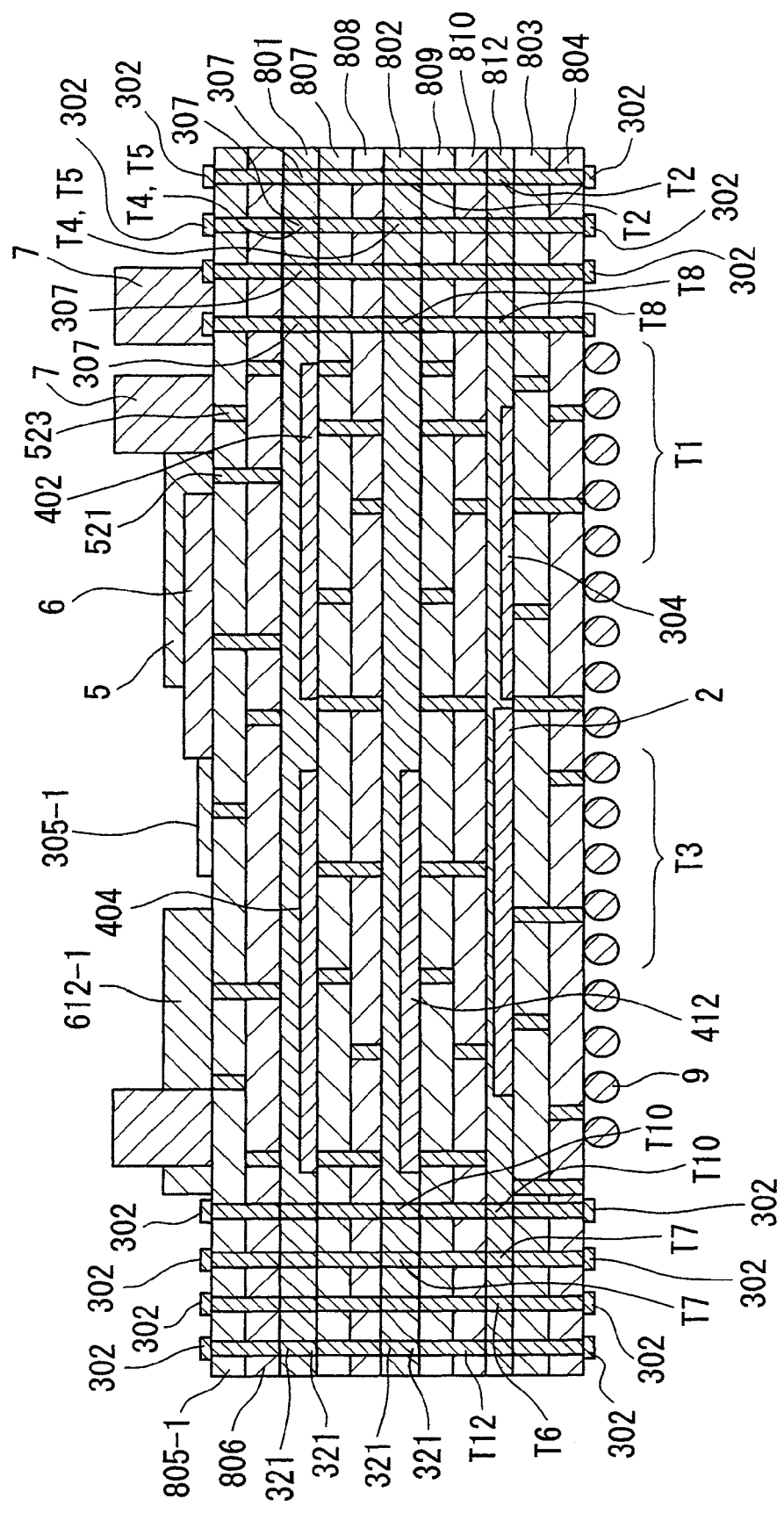
FIG. 27 is a sectional view showing the multi-layer structure of the circuit module 312 shown in FIG. 24.
Figure 28:
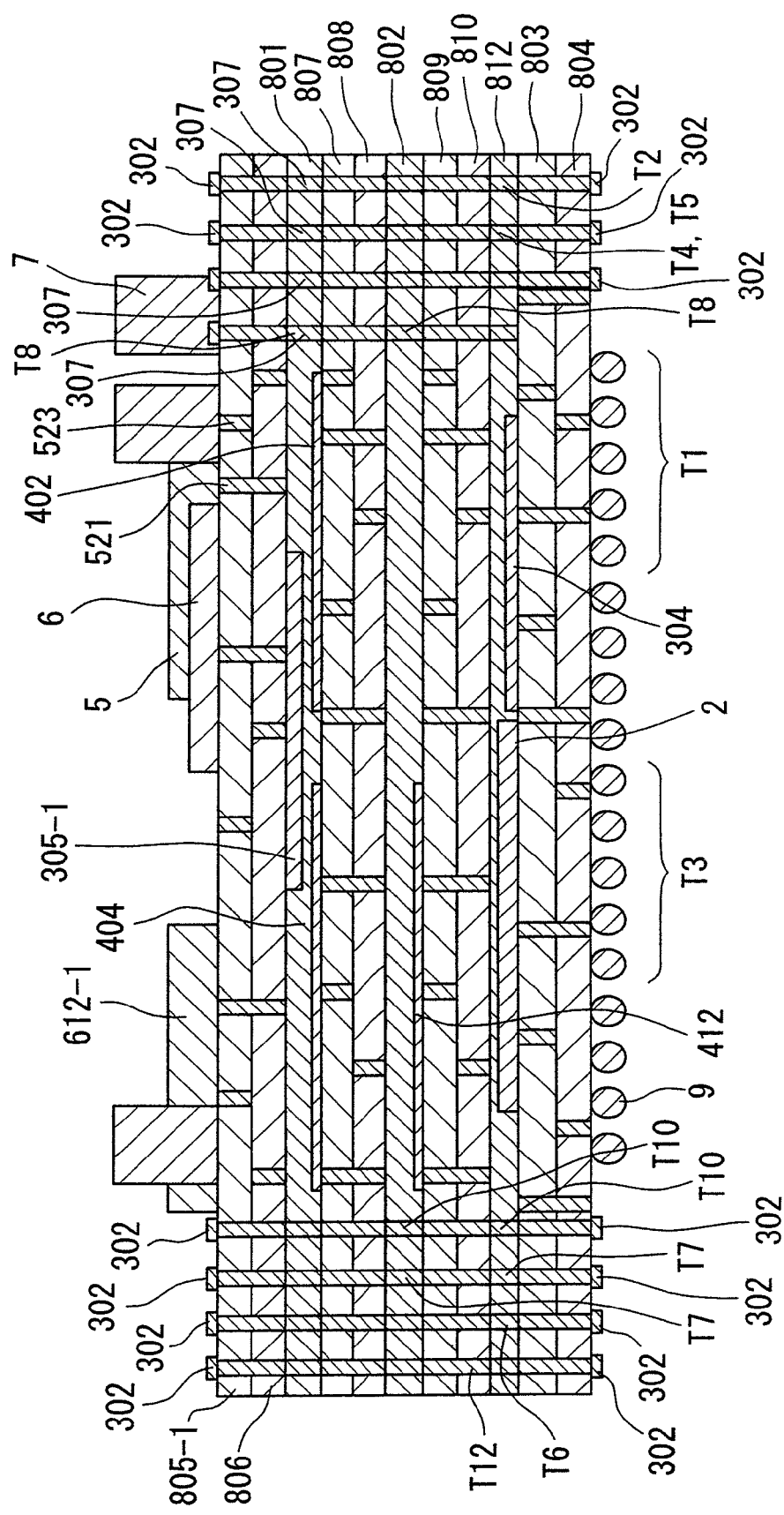
FIG. 28 is a sectional view showing a multi-layer structure according to a modified embodiment of the circuit module 312 shown in FIG. 24.
Figure 29:
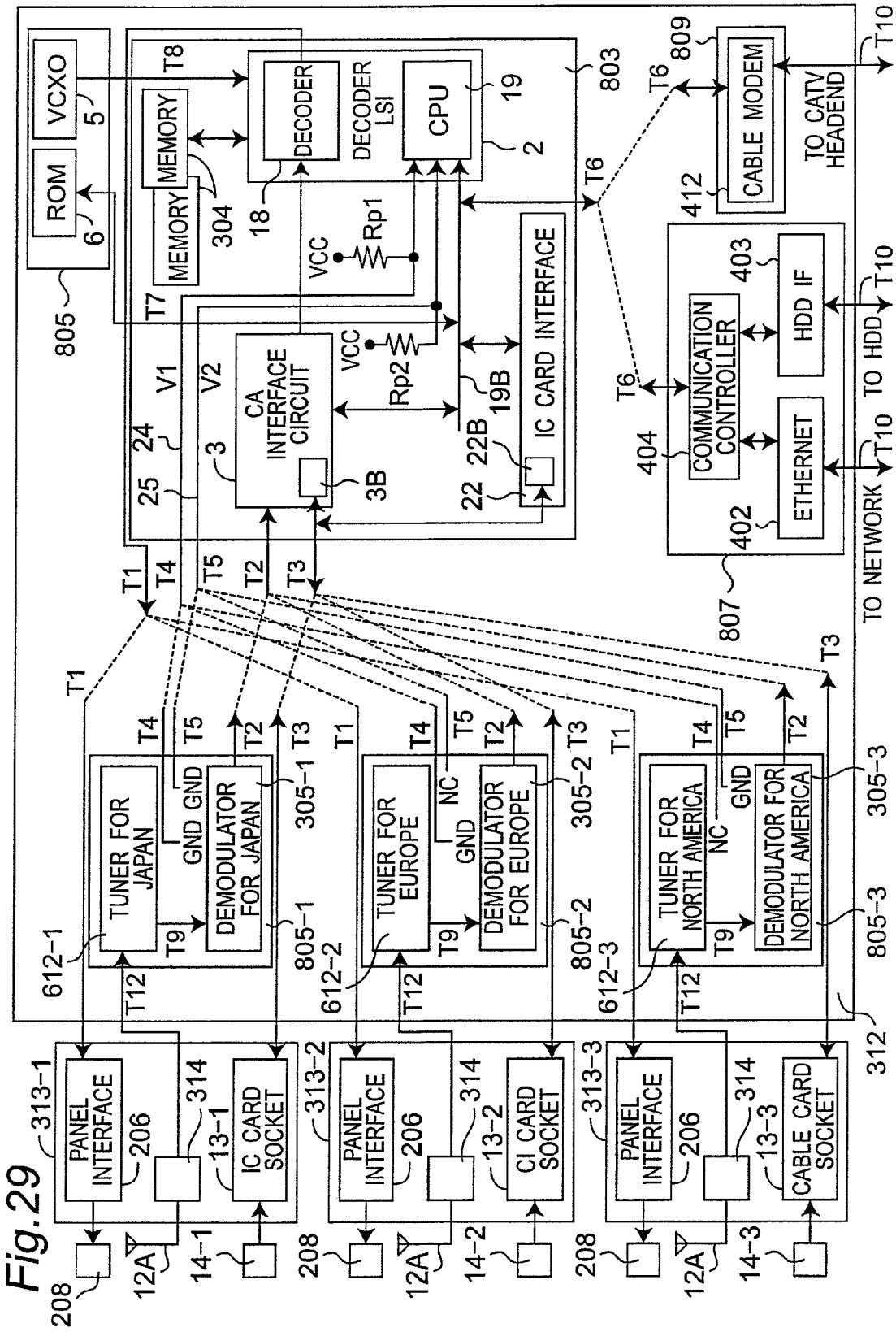
FIG. 29 is a block diagram showing a system configuration including the circuit module 312 and mother-boards for countries 313-1, 313-2, and 313-3 connected to the circuit module 312 according to the third embodiment of the present invention.

FIG. 24 is a top view of a circuit module 312 for use in a television set according to a third embodiment of the present invention. FIG. 25 is a back side view of the circuit module 312 shown in FIG. 24. FIG. 26 is an exploded perspective view showing a multi-layer structure of the circuit module 312 shown in FIG. 24. FIG. 27 is a sectional view showing the multi-layer structure of the circuit module 312 shown in FIG. 24. FIG. 28 is a sectional view showing a multi-layer structure according to a modified embodiment of the circuit module 312 shown in FIG. 24. FIG. 29 is a block diagram showing a system configuration including the circuit module 312 and mother-boards for countries 313-1, 313-2, and 313-3 connected to the circuit module 312 according to the third embodiment of the present invention.

The television set according to the third embodiment will be described hereinafter with reference to FIG. 24 to FIG. 29. In FIG. 24 to FIG. 29, the same reference numerals are given to those similar to components in the first and the second embodiments, and their detail description will be omitted.

Referring to FIG. 24, circuit components mounted on the component arrangement surface that is the upper surface of the circuit module 312 include a tuner for Japan 612-1, a demodulator 305-1, a VCXO 5 that is a circuit component for analog signal processing which generates a clock of a decoder LSI 2 and outputs the same, a ROM 6 for storing data such as a program code for a CPU in the decoder LSI 2, and a capacitor 7 connected to a power supply (not shown) for each circuit component. The demodulator 305-1 is a more integrated demodulator incorporating a memory 511 as compared with the demodulator 12-1.

Referring to FIG. 25, circuit components mounted on the soldering surface that is the back side of the circuit module 312 include a plurality of capacitors 10 connected between the power supply of the decoder LSI 2 and the grounding conductor. A plurality of solder balls 9, which are external terminals of the circuit module 312, and connect the signal lines and power supply lines upon mounting the circuit module 312 on the mother-board 313. The upper surface and the back side of the circuit module 312 are mainly mounted with general-purpose circuit components.

Referring to FIG. 26, the circuit module 312 is composed of a plurality of printed circuit board layers 805-1, 806, 807, 808, 809, 810, 803, and 804 having a multi-layer structure; a plurality of inter-substrate layers 801, 802, and 812; and circuit components mounted thereon. The circuit module 312 according to the third embodiment is characterized in that the number of the composed printed circuit boards is reduced, and a three layer construction is configured, as compared with the second embodiment, and can be realized with a simple structure.

As shown in FIG. 26, the circuit module 312 includes the following:

(a) the demodulation function layer substrate 805-1 for a demodulation function for Japan, mounted with the tuner for Japan 612-1 and the demodulator 305-1 shown in FIG. 24;

(b) the signal wiring layer substrate 806;

(c) the extension function layer substrate 807 for extending the network function, and is mounted with the Ethernet interface 402, the hard disk drive interface 403, and the communication controller 404;

(d) the signal wiring layer substrate 808;

(e) the extension function layer substrate 809 for extending the cable modem function, and is mounted with the cable modem 412;

(f) the signal wiring layer substrate 810;

(g) the decoder layer substrate 803 for the decode function mounted with a CA interface circuit 3 that is a common interface directly connectable to the decoder LSI 2 for performing decode processing corresponding to a compression system in digital television broadcasting of each nation and region, a memory 304 that is a working memory of the decoder LSI 2, and a CA module at each market; and (h) the signal wiring layer substrate 804; and the circuit module 312 has a multi-layered structure multi-layered in the thickness direction of the respective substrates so that the above respective substrates substantially become parallel to each other.

In this case, the Ethernet interface 402, the hard disk drive interface 403, the communication controller 404, the cable modem 412, the decoder LSI 2, the memory 304, and the CA interface circuit 3 are mounted on the inside layer, and then, the configuration is of the semiconductor bare chip, and therefore, it is possible to mount on the substrate by wire bonding and flip chip bonding.

As for the extension function layer substrate 809 and the signal wiring layer substrate 810, respective substrate sets concerning a plurality of types of the extension functions are prepared, and then, lamination or multi-layering can be made by selecting one of the substrate sets and by replacing the same. The selected extension function layer substrate 809 and signal wiring layer substrate 810 are multi-layered at a position 5C of the circuit module 312. In addition, as for the extension function layer substrate 807 and the signal wiring layer substrate 808, respective substrate sets concerning a plurality of types of the extension functions are prepared, and then, lamination or multi-layering can be made by selecting one of the substrate sets and by replacing the same. The selected extension function layer substrate 807 and the signal wiring layer substrate 808 are multi-layered at a position 5B of the circuit module 312. Further, a plurality of types of demodulation function layer substrates 805-1 and the signal wiring layer substrate 806 are prepared for each nation and region, and then, lamination or multi-layering can be made by selecting and replacing the same. The selected demodulation function layer substrate 805-1 and signal wiring layer substrate 806 are multi-layered at a position 5A of the circuit module 312.

The inter-substrate layer 801 is multi-layered between the signal wiring layer substrate 806 and the extension function layer substrate 807, the inter-substrate layer 802 is multi-layered between the signal wiring layer substrate 808 and the extension function layer substrate 809, and the inter-substrate layer 812 is multi-layered between the signal wiring layer substrate 810 and the decoder layer substrate 803. The inter-substrate layers 801, 802, and 812 are substrates for transmitting signals between the upper and lower substrates, and for embedding the circuit components mounted on the upper and lower substrates inside. A material thereof can be served as a substrate for use in an adhesive sheet member and a printed circuit board. The inter-substrate layers 801, 802, and 812 are prepared with through holes for forming vias 307 (to be described later) for transmitting signals between respective substrates, and cutout portions conforming to shapes of the circuit components to be embedded. The via 307 is formed by filling metal material such as conductive gold, copper, silver, or the like in the through hole. Therefore, any inter-substrate layer is not required to prepare a wiring pattern on the layer surface, and can be realized with a simple structure.

Since the tuner 612-1 is further mounted, the thus formed configuration can further improve a mounting rate of the circuit components as compared with the first embodiment. A digital television broadcast receiver can further be reduced in size by using the circuit module 312. Further, any connection between respective substrates through the bump or the ball is not required as compared with the first embodiment. Therefore, any process for forming the bump and any process for connecting the solder ball are not required, and therefore, the manufacturing can be simplified. In addition, the structure can be simplified by reducing the number of laminating substrates as compared with the second embodiment. Therefore, cost reduction of the digital television broadcast receiver can be achieved by using the circuit module 312.

FIG. 27 is a sectional view showing a multi-layer structure of the circuit module 312 shown in FIG. 24. Referring to FIG. 27, the demodulation function layer substrate 805-1 and the signal wiring layer substrate 806 are glued together using a predetermined adhesive, and general-purpose circuit components such as the tuner 612-1, the demodulator 305-1, the VCXO 5, and the capacitor 7 are mounted on the demodulation function layer substrate 805-1. In this case, the circuit components shown in FIG. 24 are mounted. The wiring between the upper surface of the demodulation function layer substrate 805-1 and the upper surface of the signal wiring layer substrate 806 is connected through a via 523. The wiring between the upper surface of the demodulation function layer substrate 805-1 and the back side of the signal wiring layer substrate 806 is connected through a through hole 521. In FIG. 27, there are many vias 523 and through holes 521, and the detailed description of each via and through hole is omitted.

The extension function layer substrate 807 and the signal wiring layer substrate 808 are glued together using the predetermined adhesive, and the signal wiring layer substrate 806 and the extension function layer substrate 807 are physically connected with the inter-substrate layer 801 sandwiched therebetween. If the inter-substrate layer 801 is an adhesive sheet member, the signal wiring layer substrate 806 and the extension function layer substrate 807 are glued together by pressing using the predetermined adhesive. If the inter-substrate layer 801 is used for a printed circuit board, the signal wiring layer substrate 806 and the extension function layer substrate 807 are glued together using the predetermined adhesive in a manner similar to that of the extension function layer substrate 807 and the signal wiring layer substrate 808. The signal wiring layer substrate 806 and the extension function layer substrate 807 are electrically connected through a plurality of vias 307 formed in the inter-substrate layer 801. The via 307 is connected to a land 321 made of a conductive thin film provided on the upper surface and the back side of the respective substrates.

The extension function layer substrate 809 and the signal wiring layer substrate 810 are glued together using the predetermined adhesive, and the signal wiring layer substrate 808 and the extension function layer substrate 809 are physically connected with the inter-substrate layer 802 sandwiched therebetween. If the inter-substrate layer 802 is an adhesive sheet member, the signal wiring layer substrate 808 and the extension function layer substrate 809 are glued together by pressing using the predetermined adhesive. If the inter-substrate layer 802 is used for a printed circuit board, the signal wiring layer substrate 808 and the extension function layer substrate 809 are glued together using the predetermined adhesive in a manner similar to that of the extension function layer substrate 809 and the signal wiring layer substrate 810. The signal wiring layer substrate 808 and the extension function layer substrate 810 are electrically connected through a plurality of vias 307 formed in the inter-substrate layer 802. The via 307 is connected to a land 321 made of a conductive thin film provided on the upper surface and the back side of the respective substrates.

The decoder layer substrate 803 and the signal wiring layer substrate 804 are glued together using the predetermined adhesive, and the signal wiring layer substrate 810 and the decoder layer substrate 803 are physically connected with the inter-substrate layer 812 sandwiched therebetween. The signal wiring layer substrate 810 and the decoder layer substrate 803 are electrically connected through a plurality of vias 307 formed in the inter-substrate layer 812. A plurality of solder balls 9 are mounted on the back side of the wiring layer substrate 804.

The physical arrangements and transmitting electrical signal types of the land 321 and the via 307 between the signal wiring layer substrates 808 and 810 and the decoder layer substrate 803 are determined by relatively in common and preliminarily defining respective types of the extension function layer substrates 807 and 809 and the signal wiring layer substrates 808 and 810. The physical arrangements and transmitting electrical signal types of the land 321 and the via 307 between the signal wiring layer substrate 806 and the extension function layer substrate 807 are determined by relatively in common and preliminarily defining respective types of the demodulation function layer substrate 805-1 and the signal wiring layer substrate 806.

The connecting terminals T6 to T10 according to the first embodiment are made of the bump. On the other hand, the connecting terminals T2, T4, T5, T7, T8, T10, and T12 according to the third embodiment are made of the land 321 or the via 307. Therefore, a group of the lands and the vias, which have been served as only interlayer connection in the prior art, can be dealt with as connector terminals of the interface for replacing the layers. As a result, selection of the extending function can be selected by replacing the layers. Therefore, as for the extension function layer substrate 807 or 809 and the signal wiring layer substrate 808 or 810, the substrate sets related to a plurality of types of the extension functions are prepared respectively. Accordingly, lamination or multi-layering can be made by selecting one substrate set and the replacing the same. In addition, the demodulation function layer substrate 805-1 and the signal wiring layer substrate 806 are prepared in a plurality of types of the demodulators respectively, and then, lamination or multi-layering can be made by selecting and replacing the same.

In addition, a pitch of a usual connector for use in the connection between respective substrates is several mm. On the other hand, a pitch of the via is approximately several ten μm to several hundred μm. Therefore, the via is used as a connector terminal, and then, reduction in size can be remarkably achieved as compared with the case where the usual connector for use in the connection between the substrates is used. Further, each of the decoder layer substrate 803 and the signal wiring layer substrate 804, the extension function layer substrate 809 and the signal wiring layer substrate 810, the extension function layer substrate 807 and the signal wiring layer substrate 808, and the demodulation function layer substrate 805-1 and the signal wiring layer substrate 806 serves as a single substrate, respectively. Therefore, the operation can be also confirmed by each single piece. Further, in FIG. 27, the connecting terminal T12 for transmitting the digital television broadcasting wave signal is formed at the leftmost end shown in FIG. 27 so as to connect the circuits of the respective substrates.

In addition, as shown in FIG. 27, the decoder LSI 2 and the working memory 304 are closely arranged on the same substrate. Therefore, the wiring between the decoder LSI 2 and the working memory 304 is shortened. When each of the decoder LSI 2 and the working memory 304 is a bare chip, the wiring between the chips can be more shortened. Therefore, since an inductor component and a stray capacitance component in the wiring can be suppressed, and electrical characteristics are improved. The transmission delay time of the electrical signal between the decoder LSI 2 and the working memory 304 is shortened, and signal transmission performance can be improved. Further, the false operation due to waveform distortion generated by an electrical signal reflection or the like, the interference on the tuner 612-1 due to radiation noise, and the like can be suppressed.

In addition, the demodulator 305-1 is arranged at roughly the center of the demodulation function layer substrate 805-1. The wiring between the decoder LSI 2 and the demodulator 305-1 has the length substantially equal to the thickness of six substrates and three inter-substrate layers, and then, the wiring length can be remarkably shortened. Therefore, since an inductor component and a stray capacitance component in the wiring can be suppressed, and electrical characteristics of the wiring are improved. The transmission delay time of the electrical signal between the decoder LSI 2 and the demodulator 305-1 is shortened, and signal transmission performance can be improved. Further, the false operation due to waveform distortion generated by an electrical signal reflection or the like, the interference on the tuner 612-1 due to radiation noise, and the like can be suppressed.

Further, the communication controller 404 is arranged at roughly the center of the extension function layer substrate 807. The wiring between the decoder LSI 2 and the communication controller 404 is shortened to the length substantially equal to the thickness of four substrates and two inter-substrate layers. Therefore, since an inductor component and a stray capacitance component in the wiring can be suppressed, and electrical characteristics of the wiring are improved. The transmission delay time of the electrical signal between the decoder LSI 2 and the communication controller 404 is shortened, and signal transmission performance can be improved. Further, the false operation due to waveform distortion generated by an electrical signal reflection or the like, the interference on the tuner due to radiation noise, and the like can be suppressed.

As described above, in the second embodiment and the third embodiment, lamination order of the respective substrates is different. In the second embodiment, the distance between the decoder LSI 2 and the demodulator 12-1 is relatively short. On the other hand, the distance between the decoder LSI 2 and the communication controller 404 is relatively long. On the other hand, the third embodiment has a reversed relationship in the above case. The lamination order of the respective substrates can be replaced in response to the configuration of the circuit substrates. Further, it is possible to control the distance between the layers and select a structure so as to obtain the optimum electrical characteristics by replacing the lamination order of the respective substrates.

FIG. 28 is a sectional view showing a multi-layer structure according to a modified embodiment of the circuit module 312 shown in FIG. 24. Referring to FIG. 28, a demodulation function layer substrate 805-1 and a signal wiring layer substrate 806 are glued together using a predetermined adhesive, and general-purpose circuit components such as a tuner 612-1, a VCXO 5, and a capacitor 7 are mounted on the demodulation function layer substrate 805-1. In this modified embodiment, a demodulator 305-1 is not mounted on the demodulation function layer substrate 805-1, and the demodulator 305-1 is mounted on the signal wiring layer substrate 806. The demodulator 305-1 is embedded in an inter-substrate layer 801, and is stored in a circuit module 312. Further, referring to FIG. 28, a connecting terminal T12 for transmitting the digital television broadcasting wave signal is formed at the leftmost end shown in FIG. 28 so as to connect the circuits of the respective substrates.

In this case, an Ethernet interface 402, a hard disk drive interface 403, a communication controller 404, a cable modem 412, a demodulator for Japan 305-1, a decoder LSI 2, a memory 304, and a CA interface circuit 3 are mounted on the inside layer. Accordingly, the configuration is of a semiconductor bare chip, and then, it is possible to mount on the substrate by wire bonding and flip chip bonding.

FIG. 29 is a block diagram showing a system configuration including the circuit module 312 and the mother-board 313. The system configuration shown in FIG. 29, mainly different points from the first embodiment or the second embodiment will be described hereinafter.

Referring to FIG. 29, the mother-boards 313-1, 313-2, and 313-3 (collectively given reference numeral 313 hereinafter) are composed of the connectors 314 connected to antennas 12A; card sockets 13-1, 13-2, and 13-3 (collectively given reference numeral 13 hereinafter) into which CA modules 14 are inserted; and display interfaces 206. In addition, the circuit module 312 includes the decoder layer substrate 803 mounted with the decoder LSI 2 provided with a decoder 18 and a CPU 19, a plurality of memories 304, the CA interface circuit 3, and an IC card interface 22; demodulation function layer substrates 805-1, 805-2, and 805-3 (collectively given reference numeral 805 hereinafter) mounted with the VCXO 5, the ROM 6, demodulators 305-1, 305-2, and 305-3 (collectively given reference numeral 305 hereinafter); the network extension function layer substrate 807; and the CATV modem extension function layer substrate 809.

In this case, the VCXO 5 and the memory 304 are connected to the decoder LSI 2, and the CPU 19, the CA interface circuit 3, the ROM 6, and the IC card interface 22 are connected via a bus 19B. Further, description of the substrate configuration of the circuit module 312 shown in FIG. 29 is the same as that of the substrate configuration shown in FIGS. 26 and 27, and some of the substrates are not shown in the drawing.

The tuner 612 of the demodulation function layer substrate 805 receives a digital television broadcasting wave from the antenna 12A via the connector 314 and the connecting terminal T12, frequency converts to a predetermined intermediate frequency signal, and outputs the same to the demodulator 305 in the demodulation function layer substrate 805. The demodulator 12 demodulates the above frequency-converted intermediate frequency signal into the MPEG-2_TS signal using the incorporated memory, and outputs the same signal to the CA interface circuit 3.

In addition, FIG. 29 shows the circuit module 312, three types of the mother-boards 313-1, 313-2, and 313-3 to each nation and region, connected to the circuit module 312, and two types of the network extension function layer substrate 807 and the CATV modem extension function layer substrate 809. At the same time, the circuit module 312 is composed of any one of three types of the demodulation function layer substrates 805-1, 805-2, and 805-3 multi-layered on the decoder layer substrate 803, and two types of the network extension function layer substrate 807 and the CATV modem extension function layer substrate 809. The circuit module 312 is characterized in that the circuit module 312 can be connected to any one of three types of the mother-boards 313-1, 313-2, and 313-3. In addition, the decoder layer substrate 803 is characterized in that the decoder layer substrate 803 can be multi-layered to any one of the three types of the demodulation function layer substrates 805-1, 805-2, and 805-3. In addition, the decoder layer substrate 803 is characterized in that the decoder layer substrate 803 can be multi-layered to any one, or both, of the two types of the network extension function layer substrate 807 and the CATV modem extension function layer substrate 809.

Further, the circuit module 312 is provided with lands 302 on the upper surface or the back side, and T1 to T10 that are the connecting terminals among incorporated substrates can be electrically connected to the lands 302 on the upper surface or the back side using the via 307, the via 523, or the through hole 521. In addition, electrical connection can be made from the lands 302 on the upper surface to the lands 302 on the back side including the connecting terminals among the incorporated substrates.

Therefore, the circuit module 312 according to the present embodiment is used, and the mother-board 313 mounted with the connector 314 for connecting the television broadcasting wave signal, the card socket 13-2, 13-3 or the IC card socket 13-1 for the CA module 14 of each market, and the interface 206 for each display device is designed, and then, the manufacturers of the digital television receiver can easily commercialize digital television receivers provided with each display device to each nation, region and market at low cost, in small size, and at lightweight as compared with the prior art.

Fourth Embodiment

Figure 30:
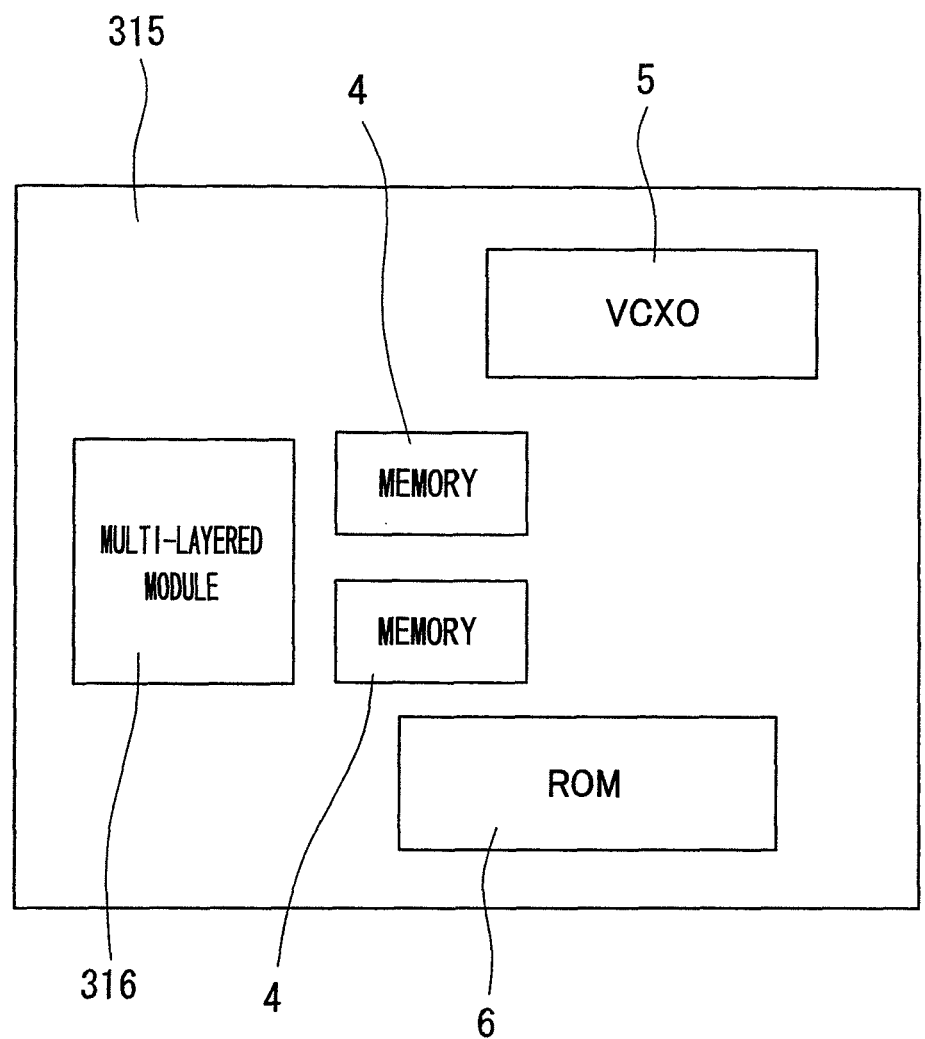
FIG. 30 is a top view of a circuit module 315 for use in a television set according to a fourth embodiment of the present invention.
Figure 31:
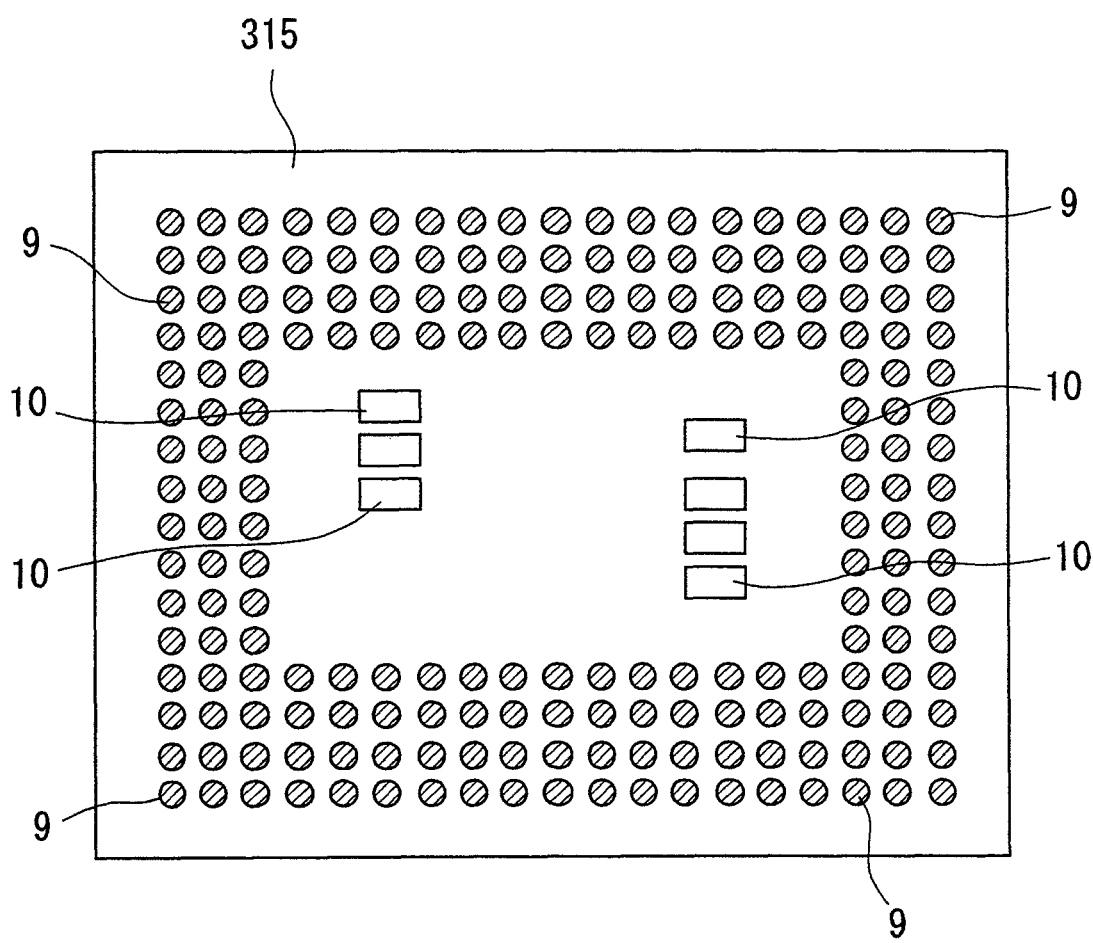
FIG. 31 is a back side view of the circuit module 315 shown in FIG. 30.
Figure 32:
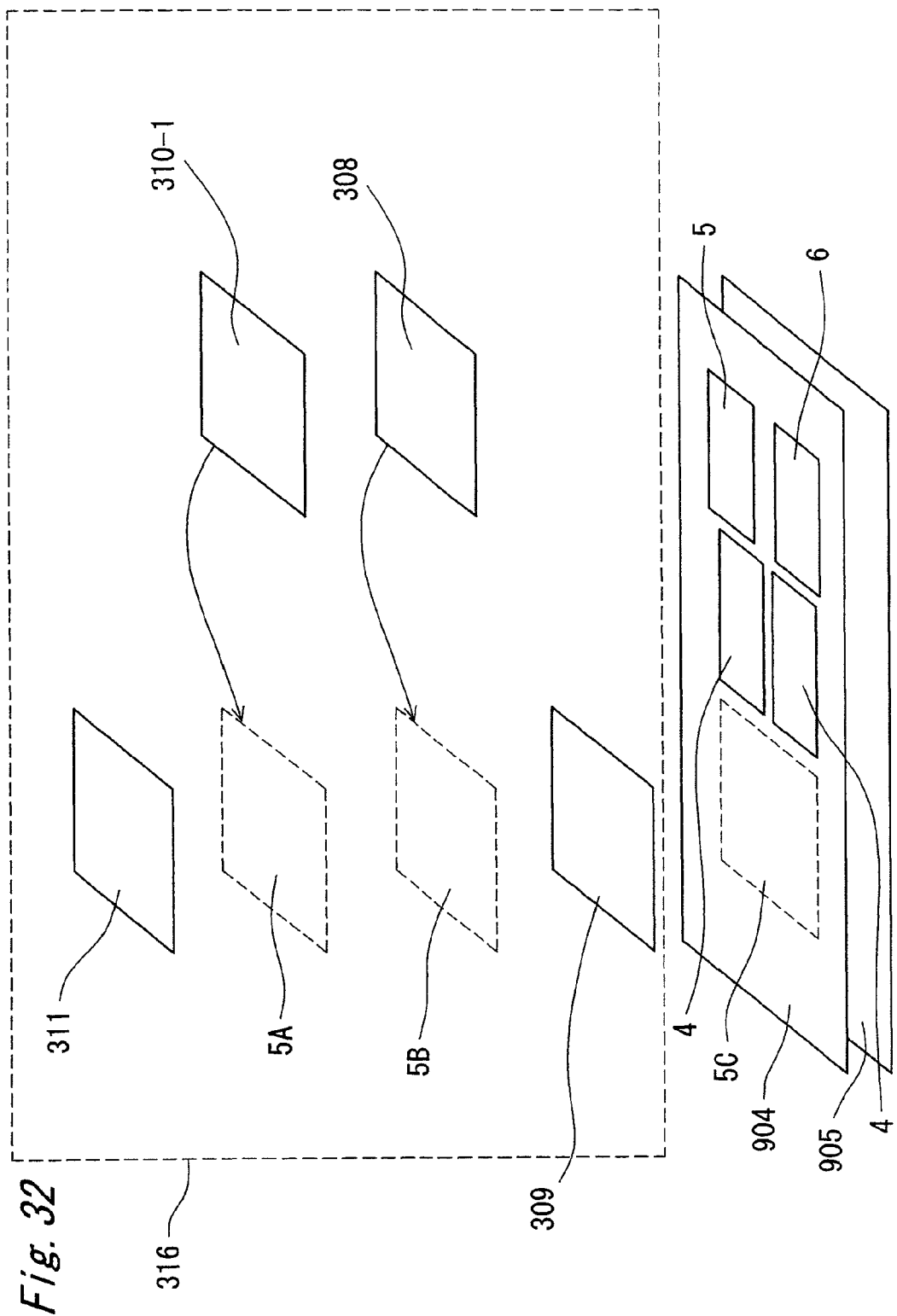
FIG. 32 is an exploded perspective view showing a multi-layer structure of the circuit module 315 shown in FIG. 30.
Figure 33:
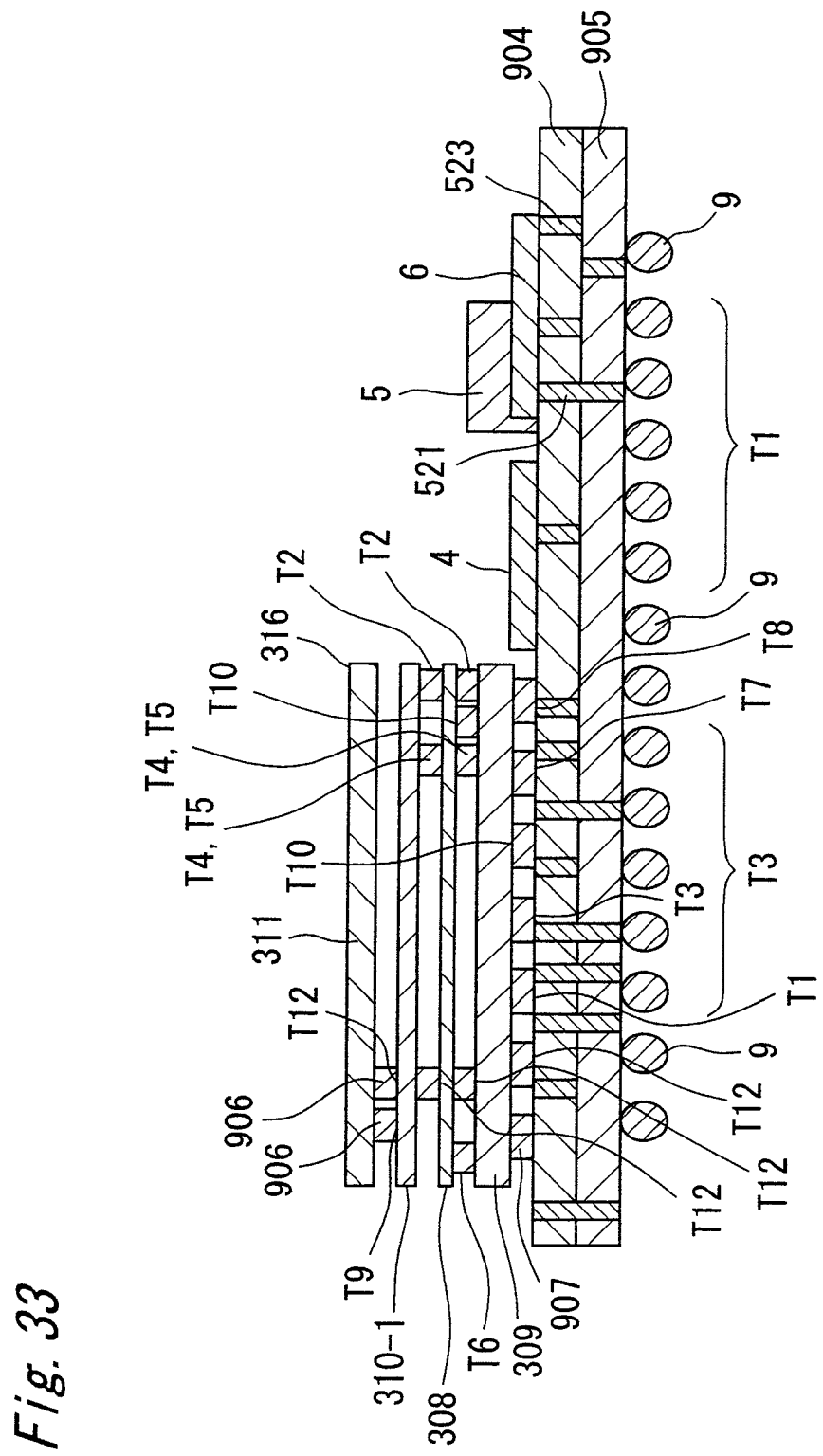
FIG. 33 is a sectional view showing the multi-layer structure of the circuit module 315 shown in FIG. 30.
Figure 34:
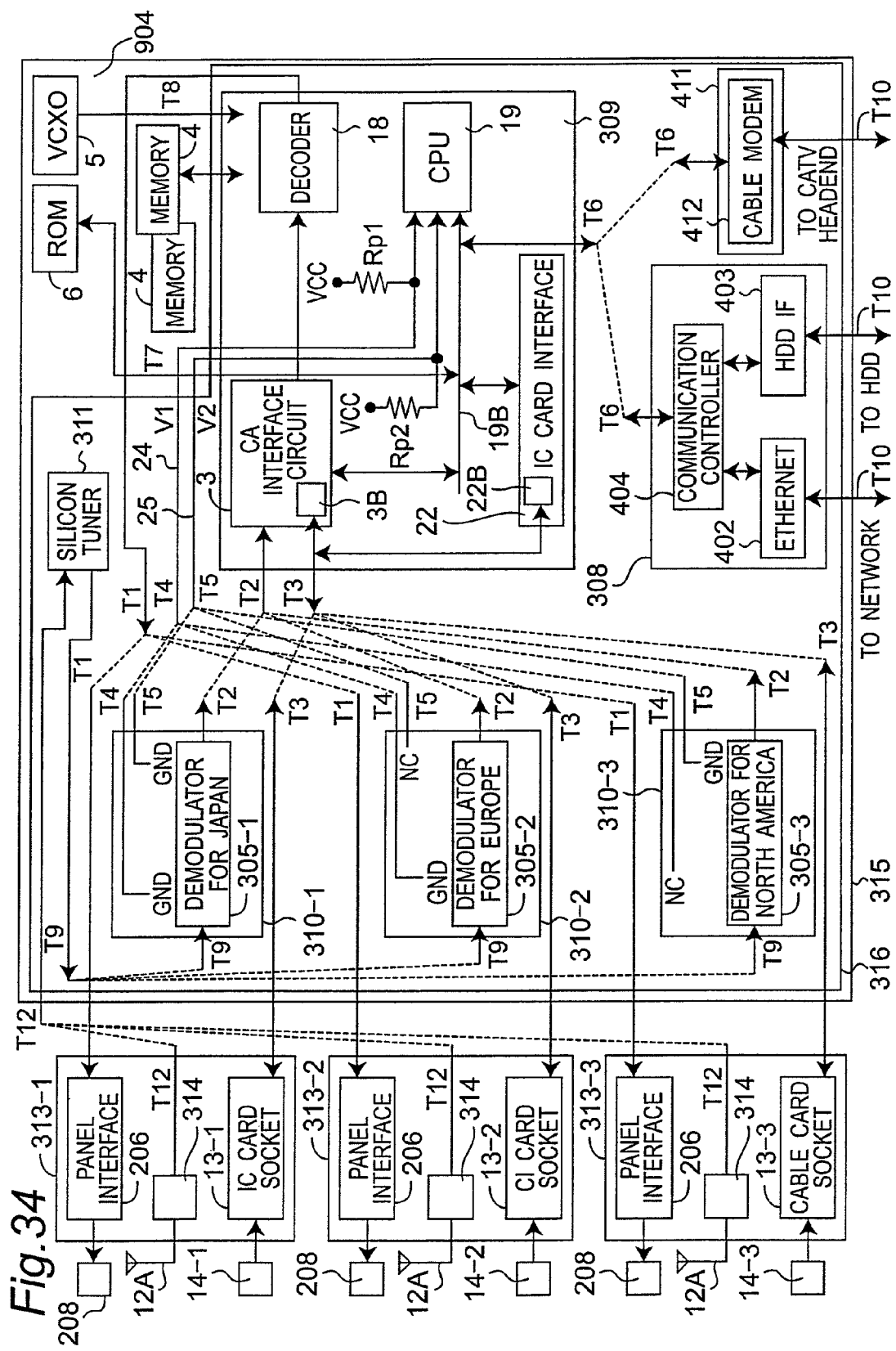
FIG. 34 is a block diagram showing a system configuration including the circuit module 315 and mother-boards for countries 313-1, 313-2, and 313-3 connected to the circuit module 315 according to the fourth embodiment of the present invention.

FIG. 30 is a top view of a circuit module 315 for use in a television set according to a fourth embodiment of the present invention. FIG. 31 is a back side view of the circuit module 315 shown in FIG. 30. FIG. 32 is an exploded perspective view showing a multi-layer structure of the circuit module 315 shown in FIG. 30. FIG. 33 is a sectional view showing the multi-layer structure of the circuit module 315 shown in FIG. 30. FIG. 34 is a block diagram showing a system configuration including the circuit module 315 and mother-boards for countries 313-1, 313-2, and 313-3 connected to the circuit module 315 according to the fourth embodiment of the present invention.

The television set according to the fourth embodiment will be described hereinafter with reference to FIG. 30 to FIG. 34. In FIG. 30 to FIG. 34, the same reference numerals are given to those similar to components in the first to the third embodiments, and their detail description will be omitted.

Referring to FIG. 30, the circuit components mounted on the component arrangement surface that is the upper surface of the circuit module 315 include a multi-layered circuit module 316 (to be described later), a VCXO 5 that is a circuit component for analog signal processing which generates a clock of a decoder LSI, a ROM 6 for storing data such as a program code for a CPU 19, a memory 4 that is a working memory of a decoder 18, and a capacitor 7 connected to a power supply (not shown) for each circuit component.

Referring to FIG. 31, the circuit components mounted on the soldering surface that is the back side of the circuit module 315 include a capacitor 10 connected between the power supply of the multi-layered circuit module 316 and the grounding conductor, and a solder ball 9 that is an external terminal of the circuit module 315 for connecting the signal lines and the power supply lines upon mounting the circuit module 315 on the mother-board 313.

Referring to FIG. 32, the circuit module 315 is composed of the multi-layered circuit module 316 multi-layered with a plurality of semiconductor chip layers 311, 310-1, 308, and 309, printed circuit boards 904 and 905, and circuit components mounted thereon. The circuit module 315 is characterized in that the number of the composed printed circuit boards is reduced, and one layer construction is configured, as compared with the first embodiment to the third embodiment. In addition, the circuit module 315 is characterized in that the semiconductor chip layer is multi-layered by an SI through electrode or the like. It turns out that the circuit module 315 can be realized by a more simplified structure.

As shown in FIG. 32, the circuit module 315 is composed of the multi-layered circuit module 316, and the circuit components mounted on the upper surface of the substrate 904 shown in FIG. 30. The multi-layered circuit module 316 is configured such that four semiconductor chip layers, that is, the silicon tuner layer 311, the demodulation function layer 310-1, the Ethernet controller layer 308, and the decoder layer 309 are multi-layered in the thickness direction of the respective semiconductor chip layers.

The multi-layered circuit module 316 is provided with extension function layers each having a plurality of types of the extension functions, and then, lamination or multi-layering can be made by selecting and replacing the same. The Ethernet controller layer 308 that is a selected extension function chip layer is multi-layered at a position 5B in the multi-layered circuit module 316. In addition, a plurality of types of demodulation function layers are prepared for each nation and region, and accordingly, lamination can be made by selecting and replacing the same. The selected demodulation function layer 310-1 is multi-layered at a position 5A in the multi-layered circuit module 316.

Next, a multi-layered structure of the circuit module 315 will be described using FIG. 33. The lamination or multi-layering is made by providing a plurality of bumps 906 between the silicon tuner layer 311 and the demodulation function layer 310-1, between the demodulation function layer 310-1 and the Ethernet controller layer 308, and between the Ethernet controller layer 308 and the decoder layer 309. The bump 906 is an electrical conductor which is connected on a pad (not shown) that exists on the upper surface or the back side of each semiconductor chip layer to be connected. Further, the bump 906 is an electrical conductor for transmitting the signals between upper and lower semiconductor chip layers. A plurality of bumps 907 that is an external terminal of the multi-layered circuit module 316 for electrically connecting to the printed circuit board 904 is also formed on the back side of the decoder layer 309. Further, although not shown in the drawing, the bump 906 may be sealed by filling a filling material in a space between the respective semiconductor chip layers.

Referring to FIG. 33, ten bumps 906 are shown from the lower surface of the silicon tuner layer 311 to the upper surface of the decoder layer 309, and many other bumps 906 are actually formed. Further, the detailed description of each bump 906 will be omitted. Seven bumps 907 are shown at the lower layer of the decoder layer 309, and many other bumps 907 are actually formed. Further, the detailed description of each bump 906 and bump 907 will be omitted. Each semiconductor chip layer has a thickness of approximately several hundred μm, and the bumps 906 and 907 can be a protruded electrode made of gold, silver, or the like having a height of several μm to several tens μm.

Since the semiconductor chip layer is multi-layered in the multi-layered circuit module 316, the thus formed configuration can further miniaturize the same as compared with those of the first embodiment to the third embodiment. In addition, since the interlayer between the upper and the lower semiconductor chip layers can be directly connected using the bump 906, any intermediate layer provided with wiring such as an interposer in the interlayer between the semiconductor chip layers is not required, and then, the interlayer can be realized in a simple structure.

The physical arrangements and transmitting electrical signal types of the bump 906 between the Ethernet controller layer 308 and the decoder layer 309 which are the extension function layers are determined by relatively in common and preliminarily defining respective types of the extension function layers. The physical arrangements and transmitting electrical signal types of the bump 906 between the demodulation function layer 310-1 and the Ethernet controller layers 308 which are the demodulation function layers are determined by relatively in common and preliminarily defining respective types of the demodulation function layers.

Accordingly, a group of the bumps, which have been served as only interlayer connection in the prior art, can be dealt with as connector terminals of the interface for replacing the layers. As a result, selection of the extending function can be selected by replacing the layers. Therefore, as for the extension function layers, chip sets related to a plurality of types of the extension functions are prepared respectively, and then, lamination or multi-layering can be made by selecting one chip set and replacing the same. In addition, as for the demodulation function layers, a plurality of types of demodulation chips are prepared respectively, and then, lamination or multi-layering can be made by selecting and replacing the same.

In addition, the substrate is usually approximately several cm square in size. Since the semiconductor chip has approximately a size of several cm square, the size of the circuit module 315 can be remarkably smaller than the case using the substrate. In addition, a pitch of a usual connector for use in the connection between respective substrates is several mm. On the other hand, a pitch of the bump is approximately several ten μm. Therefore, the bump is used as a connector terminal, and then, reduction in size can be remarkably achieved as compared with the case where the usual connector for use in the connection between the substrates is used. In addition, the semiconductor chip layer has a thickness of approximately several hundred μm, and the bump has a height of several μ to several tens μm, and then, the circuit module can be remarkably thin.

In addition, each of the silicon tuner layer 311, the decoder layer 309, the Ethernet controller layer 308, and the demodulation function layer 310-1 serves as a semiconductor chip of a single piece, respectively. Therefore, the operation can be also confirmed by each single piece.

In addition, as shown in FIG. 33, the decoder layer 309 and the working memory 4 are closely arranged on the same substrate. Therefore, the wiring between the decoder layer 309 and the working memory 4 shortens by one bump. Therefore, since an inductor component and a stray capacitance component in the wiring can be suppressed, and electrical characteristics are improved. The transmission delay time of the electrical signal between the decoder layer 309 and the working memory 4 is shortened, and signal transmission performance can be improved. Further, the false operation due to waveform distortion generated by an electrical signal reflection or the like, the interference on the tuner due to radiation noise, and the like can be suppressed.

In addition, the wiring between the decoder layer 309 and the demodulation function layer 310-1 has the length substantially equal to the thickness of one semiconductor chip layer and two bumps, and then, the wiring length can be remarkably shortened. Therefore, since an inductor component and a stray capacitance component in the wiring can be suppressed, and electrical characteristics of the wiring are improved. The transmission delay time of the electrical signal between the decoder layer 309 and the demodulation function layer 310-1 is shortened, and signal transmission performance can be improved. Further, the false operation due to waveform distortion generated by an electrical signal reflection or the like, the interference on the tuner due to radiation noise, and the like can be suppressed.

In addition, the wiring between the decoder layer 309 and the Ethernet controller layer 308 has the length substantially equal to the thickness of one bump, and then, the wiring length can be remarkably shortened. Therefore, since an inductor component and a stray capacitance component in the wiring can be suppressed, and electrical characteristics of the wiring are improved. The transmission delay time of the electrical signal between the decoder layer 309 and the Ethernet controller layer 308 is shortened, and signal transmission performance can be improved. Further, the false operation due to waveform distortion generated by an electrical signal reflection or the like, the interference on the tuner due to radiation noise, and the like can be suppressed.

As described above, in the present embodiment, the distance of the wiring between the decoder layer 309 and the Ethernet controller layer 308, and the distance of the wiring between the decoder layer 309 and the demodulation function layer 310-1 can be shortest.

In addition, as is apparent from FIG. 33, the connecting terminals 906 made of the bumps are arranged on the outer side of the respective semiconductor chip layers which constitute the multi-layered circuit module 316. Therefore, the circuit mounted on the semiconductor chip layer can be mounted in the vicinity of the center with higher efficiency and with small restriction of the connecting terminals 906, and the connecting terminals 906 can be arranged with better efficiency and a small required area. In addition, the outermost arrangement of the connecting terminals 907 made of the bumps is arranged on the inner side than the outermost side arrangement of the connecting terminals 906. Therefore, the connecting terminals 907 can be mounted with higher area efficiency and with small restriction of the connecting terminals (bumps) 906. In addition, the diameter of the connecting terminal 906 is smaller than the diameter of the connecting terminal 907, and an arrangement interval of the connecting terminal 906 is smaller than an arrangement interval of the connecting terminal 907. Therefore, the circuit module 315 can be further reduced in size by mounting an inside layer portion of the multi-layered circuit module 316 in high density. In addition, T8 among the connecting terminals 907 is arranged on the inner side of the circuit of the circuit module 315, located nearer to the VCXO 5 than the other connecting terminals 907. Therefore, the wiring distances between the circuit components for connecting clock signals especially required for electrical characteristics can be particularly shortened. The transmission delay time of the clock signal is shortened, and signal transmission performance can be improved. Further, the false operation due to waveform distortion generated by a clock signal reflection or the like, the interference on the tuner due to radiation noise, and the like can be suppressed.

FIG. 34 is a block diagram showing a system configuration including the circuit module 315 and the mother-board 313.

The system configuration shown in FIG. 34, mainly different points from the first embodiment to the third embodiment will be described hereinafter.

Referring to FIG. 34, the mother-boards 313-1, 313-2, and 313-3 (collectively given reference numeral 313 hereinafter) are composed of connectors 314 connected to antennas 12A; card sockets 13-1, 13-2, and 13-3 (collectively given reference numeral 13 hereinafter) into which CA modules 14 are inserted; and display interfaces 206. In addition, the circuit module 315 is composed of the multi-layered circuit module 316 mounted at a position 5C of the printed circuit board 904, a plurality of memories 4, the VCXO, and the ROM 6.

The multi-layered circuit module 316 is composed of the following:
(a) the silicon tuner layer 311;
(b) the decoder layer 309 that is a semiconductor chip incorporated with the decoder 18, the CPU 19, a CA interface circuit 3, and an IC card interface 22;
(c) the Ethernet controller layer 308 for extending the network function, which is a semiconductor chip incorporated with the Ethernet interface 402, the hard disk drive interface 403, and the communication controller 404;
(d) a cable modem layer 411 that is a semiconductor chip incorporated with the cable modem; and
(e) demodulation function layers 310-1, 310-2, and 310-3 (collectively given reference numeral 310 hereinafter) that are semiconductor chips incorporated with demodulators 305-1, 305-2, and 305-3 (collectively given reference numeral 305 hereinafter), and connecting terminals T4 and T5.

In this case, the VCXO 5 and the memory 4 are connected to the decoder 309, and then, the CPU 19, the CA interface circuit 3, the ROM 6, and the IC card interface 22 are connected via a bus 19B. Further, description of the configuration of the circuit module 315 shown in FIG. 34 is the same as the semiconductor substrate chip configuration and the substrate configuration shown in FIGS. 32 and 33, and some of the substrates and the semiconductor chips are not shown in the drawing.

The silicon tuner layer 311 receives a digital television broadcasting wave from the antenna 12A via the connector 314, frequency converts to a predetermined intermediate frequency signal, and outputs the same to the demodulator 305. The demodulator 305 demodulates the above frequency-converted intermediate frequency signal into the MPEG-2_TS signal using the incorporated memory, and outputs the same signal to the decoder layer 309.

In addition, FIG. 34 shows the circuit module 315; three types of the mother-boards 313-1, 313-2, and 313-3 to each nation and region, connected to the circuit module 315. In this case, the multi-layered module 316 is composed of any one of three types of the demodulation function layers 310-1, 310-2, and 310-3 multi-layered on the decoder 309; and two types of the network extension function layer 308 and the CATV modem extension function layer 411. In this case, the circuit module 315 is characterized in that the circuit module 315 can be connected to any one of three types of the mother-boards 313-1, 313-2, and 313-3. In addition, the decoder layer 309 is characterized in that the decoder layer 309 can be multi-layered to any one of the three types of the demodulation function layers 310-1, 310-2, and 310-3. In addition, the decoder layer 309 is characterized in that the decoder layer 309 can be multi-layered to any one, or both, of the two types of the network extension function layer 308 and the CATV modem extension function layer 411.

Therefore, the circuit module 315 according to the present embodiment is used, and the mother-board 313 mounted with the connector 314 for connecting a television broadcasting wave signal, the card socket 13-2, 13-3 or the IC card socket 13-1 for the CA module 14 of each market, and the interface 206 for each display device is designed, and then, the manufacturers of the digital television receiver can easily commercialize digital television receivers provided with each display device to each nation, region and market at low cost, in small size, and at lightweight as compared with the prior art.

Modified Embodiments

In the above embodiments, there are described the circuit modules including the circuits which demodulate a digital audio signal or an analog audio signal, and a digital video signal, each of which is a digital data signal, into an audio signal or a video signal. However, the present invention is not limited to this, and it may be a circuit module including a circuit which demodulates at least one of the digital audio signal or the analog audio signal, and the digital video signal into at least one of the audio signal and the video signal. That is, it may be a circuit module including a circuit which demodulates a content data signal containing contents into a content signal.

Figure 35:
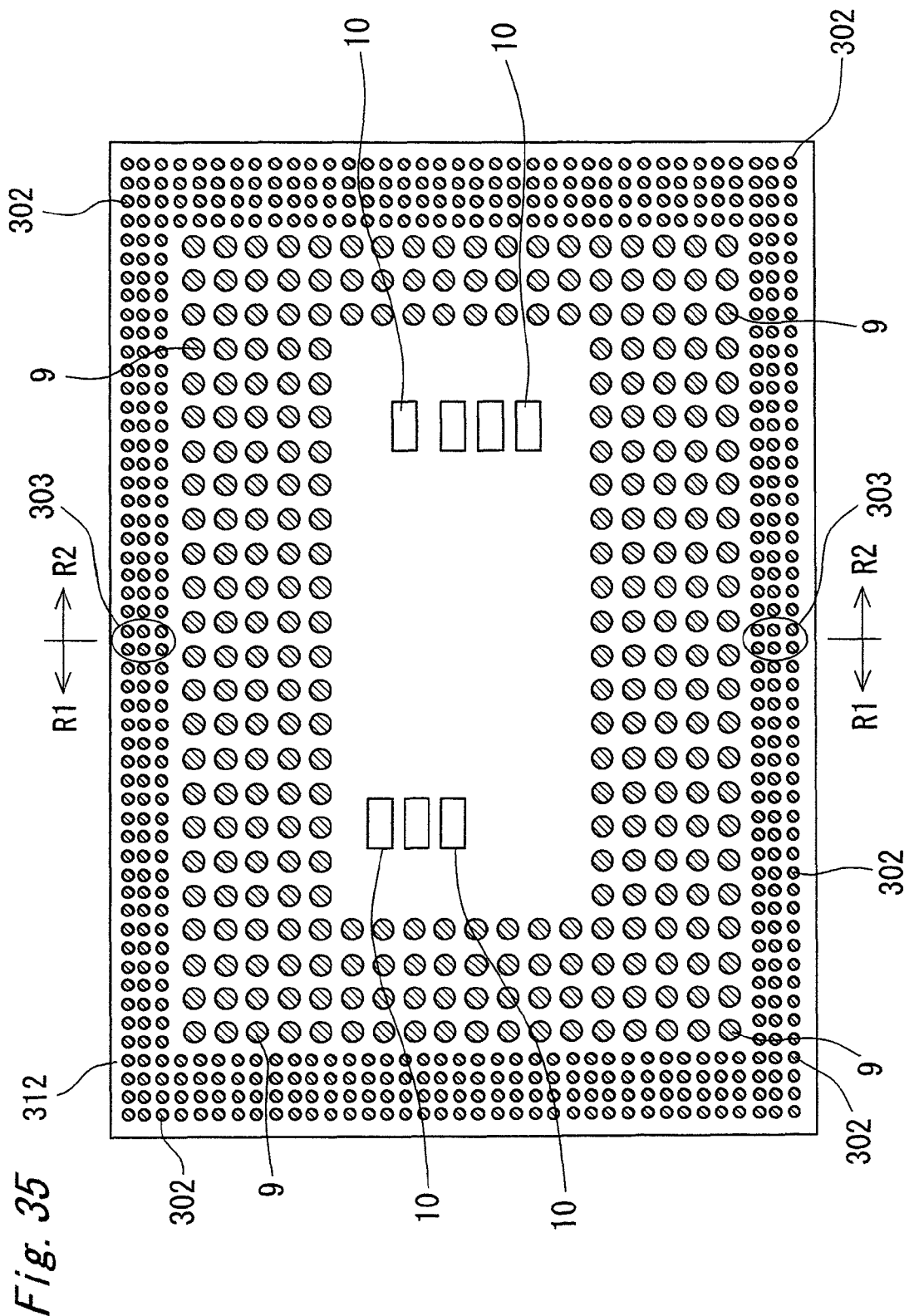
FIG. 35 is a back side view of the circuit module 312 shown in FIG. 24, provided with grounding conductor terminals for signal separation 303 according to a modified embodiment of the present invention.

FIG. 35 is a back side view of the circuit module 312 shown in FIG. 24, provided with the grounding conductor terminals for signal separation 303 according to a modified embodiment of the present invention. Referring to FIG. 35, a plurality of connecting terminals 302 are separated into connecting terminals 302 for transmitting analog signals and connecting terminals 302 for transmitting the digital signals. The former connecting terminals 302 are formed in a region R1. At the same time, the latter connecting terminals 302 are formed in a region R2; and the grounding conductor terminals for signal separation 303 are formed between the two regions R1 and R2. This makes it possible to electrically separate the analog signal and the digital signal without electromagnetically coupling, and to transmit the same in the circuit module. In addition, it may be such that the connecting terminals for content signals and the connecting terminals for digital television broadcasting wave signals are similarly separated by the above grounding conductor terminals for signal separation 303.

INDUSTRIAL APPLICABILITY

As described above, according to the circuit module according to the present invention, the digital television receiver of each display device to each nation, region, and market can be easily commercialized, and then, the cost reduction by the mass production effect can be achieved. In addition, the audio-visual apparatus such as the digital television receiver can be reduced in size and weight. Further, the circuit module is useful for a digital television receiver that receives digital television broadcasting, such as a digital television receiver, a personal computer, a mobile terminal apparatus, a recorder apparatus, or the like, a video reproduction apparatus such as a camera, a DVD player, or the like, and a music reproduction apparatus such as a headphone stereo or the like.

The invention claimed is:
1. A circuit module for decoding a content data signal including a content signal into the content signal, and outputting the content signal, said circuit module comprising:
at least one first substrate including a first circuit for outputting the content data signal; and a second substrate including a second circuit for decoding the content data signal outputted from said first circuit into the content signal, and outputting the content signal;

wherein said circuit module has a multi-layered structure multi-layered in a thickness direction of said respective substrates so that said respective substrates substantially become parallel to each other, wherein said circuit module further comprises:

a plurality of first connecting means formed in common between respective substrates on an outer side than a formation position of said each circuit in respective substrates from said first substrate to said second substrate, said first connecting means electrically connecting between respective circuits of said first substrate and said second substrate, and transmitting the content data signal; and second connecting means formed in at least one substrate of said respective substrates, said second connecting means transmitting and receiving a signal to and from an external substrate;

wherein each of a plurality of connecting terminals of said first connecting means has a first diameter, and wherein said second connecting means includes a plurality of connecting terminals, and each of said plurality of connecting terminals of said second connecting means has a second diameter larger than the first diameter.

2. The circuit module as claimed in claim 1, further including a third substrate including a third circuit for generating a clock signal which is used in said second circuit;

wherein said circuit module have a multi-layered structure multi-layered in the thickness direction of said respective substrates so that said third substrate is placed in a top layer and said respective substrates substantially become parallel to each other, wherein said circuit module further includes third connecting means formed in common between respective substrates on an outer side than a formation position of said each circuit in respective substrates from said third substrate to said second substrate, said third connecting means electrically connects between respective circuits of said third substrate and said second substrate, and transmits the clock signal, and wherein said third connecting means is formed on an inner side than a formation position of said first connecting means.

3. The circuit module as claimed in claim 1, wherein a first connecting terminal for transmitting an analog signal and a second connecting terminal for transmitting a digital signal, which are selected among said respective connecting terminals of said first and third connecting means, are formed so as to be separated with each other by a predetermined third interval.

4. The circuit module as claimed in claim 3, wherein said first connecting terminal and said second connecting terminal are formed so as to be separated with a grounding conductor terminal sandwiched therebetween.

5. The circuit module as claimed in claim 2, wherein said third substrate further includes a memory for a digital data signal for use in said second circuit, wherein said circuit module further includes fourth connecting means formed in common between respective substrates on an outer side than a formation position of said each circuit in respective substrates from said third substrate to said second substrate, said fourth connecting means transmitting the digital data signal, wherein a plurality of connecting terminals of said fourth connecting means are arranged so that each pair of mutually neighboring connecting terminals thereof is separated by a predetermined third interval, and wherein said plurality of connecting terminals of said second connecting means are arranged so that each pair of mutually neighboring connecting terminals thereof is separated by a predetermined second interval which is larger than said third interval.

6. The circuit module as claimed in claim 5, wherein said first interval and said third interval are the same as each other.

7. The circuit module as claimed in claim 1, wherein said second substrate further includes a control circuit for controlling decode processing of said second circuit, wherein said circuit module further includes fifth connecting means formed in common between respective substrates from said first substrate to said second substrate, said fifth connecting means transmitting a type-identifying data signal representing a system of the content data signal outputted from said first circuit, and wherein said control circuit detects a system of the digital data signal on the basis of the type-identifying data signal inputted via said fifth connecting means from said first circuit, and controls decode processing of said second circuit on the basis of said detected system.

\* \* \* \* \*